United States Patent
Nakamura et al.

(10) Patent No.: US 10,221,104 B2
(45) Date of Patent: Mar. 5, 2019

(54) HEAT-RESISTANT COMPOSITE MATERIAL PRODUCTION METHOD AND PRODUCTION DEVICE

(71) Applicants: IHI Corporation, Koto-ku (JP); The University of Tokyo, Bunkyo-ku (JP)

(72) Inventors: Takeshi Nakamura, Tokyo (JP); Masato Ishizaki, Tokyo (JP); Kozue Hotozuka, Tokyo (JP); Yasuyuki Fukushima, Tokyo (JP); Yukihiro Shimogaki, Tokyo (JP); Takeshi Momose, Tokyo (JP); Hidetoshi Sugiura, Tokyo (JP); Kohei Shima, Tokyo (JP); Yuichi Funato, Tokyo (JP)

(73) Assignees: IHI CORPORATION, Koto-ku (JP); THE UNIVERSITY OF TOKYO, Bunkyo-ku (JP)

( * ) Notice: Subject to any disclaimer, the term of this patent is extended or adjusted under 35 U.S.C. 154(b) by 311 days.

(21) Appl. No.: 15/165,676

(22) Filed: May 26, 2016

(65) Prior Publication Data
US 2016/0297716 A1 Oct. 13, 2016

Related U.S. Application Data

(63) Continuation of application No. PCT/JP2015/055486, filed on Feb. 25, 2015.

(30) Foreign Application Priority Data

Feb. 25, 2014 (JP) .................................. 2014-033509

(51) Int. Cl.
C04B 35/565 (2006.01)
C04B 35/80 (2006.01)
(Continued)

(52) U.S. Cl.
CPC ........ *C04B 41/4531* (2013.01); *C04B 35/565* (2013.01); *C04B 35/806* (2013.01);
(Continued)

(58) Field of Classification Search
CPC ..... C04B 35/565; C04B 35/571; C04B 35/80; C04B 35/806; C04B 41/009;
(Continued)

(56) References Cited

U.S. PATENT DOCUMENTS 4,580,524 A 4/1986 Lackey, Jr. et al.
5,238,710 A * 8/1993 Ahmad ................... C04B 35/64
427/226

(Continued)

FOREIGN PATENT DOCUMENTS

CA 2217702 10/1996
CN 1102632 A 5/1995
(Continued)

OTHER PUBLICATIONS

Theodore M. Besmann, David P. Stinton, Richard A. Lowden. "Chemical Vapor Infiltration of Non-Oxide Ceramic Matrix Composites", Materials Research Society Proceedings vol. 327, pp. 253-261. Materials Research Society, 1994. Month of Publication Unknown. (Year: 1994).*

(Continued)

*Primary Examiner* — Michael A Tolin
(74) *Attorney, Agent, or Firm* — Oblon, McClelland, Maier & Neustadt, L.L.P.

(57) ABSTRACT

A mixed gas containing a precursor gas, an additive gas and a carrier gas is supplied to a preform stored in an electric furnace, and silicon carbide is deposited by chemical vapor deposition or chemical vapor phase impregnation to form a film. The preform includes multiple fiber bundles, and the fiber bundles include multiple fibers. This heat-resistant (Continued)

composite material includes a ceramic fiber preform impregnated with silicon carbide, and producing the composite material involves a step in which silicon carbide is deposited between the fibers which configure the fiber bundles to integrate the fibers which configure the fiber bundles, and a step in which silicon carbide is deposited between the fiber bundles to integrate the fiber bundles. Hereby, uniformity of embedding and growth rate of the silicon carbide film are both attained.

19 Claims, 34 Drawing Sheets

(51) Int. Cl.
| | |
|---|---|
| C04B 41/45 | (2006.01) |
| C04B 41/50 | (2006.01) |
| C04B 41/87 | (2006.01) |
| C23C 16/04 | (2006.01) |
| C23C 16/32 | (2006.01) |
| C23C 16/448 | (2006.01) |
| C04B 41/00 | (2006.01) |

(52) U.S. Cl.
CPC .......... *C04B 41/009* (2013.01); *C04B 41/457* (2013.01); *C04B 41/4584* (2013.01); *C04B 41/5059* (2013.01); *C04B 41/87* (2013.01); *C23C 16/045* (2013.01); *C23C 16/325* (2013.01); *C23C 16/4488* (2013.01); *C04B 2235/5244* (2013.01); *C04B 2235/5248* (2013.01); *C04B 2235/5252* (2013.01); *C04B 2235/5256* (2013.01); *C04B 2235/614* (2013.01)

(58) Field of Classification Search
CPC ............ C04B 41/4529; C04B 41/4531; C04B 41/457; C04B 41/4584; C04B 41/5059; C04B 41/87; C04B 2235/5244; C04B 2235/5252; C04B 2235/5256; C04B 2235/614; C23C 16/045; C23C 16/325; C23C 16/4488
See application file for complete search history.

(56) References Cited

U.S. PATENT DOCUMENTS

| | | | |
|---|---|---|---|
| 5,350,545 A | | 9/1994 | Streckert et al. |
| 5,391,428 A | * | 2/1995 | Zender .................. C04B 35/806 428/34.4 |
| 5,472,650 A | * | 12/1995 | Johnson .................. C04B 35/64 264/432 |
| 5,670,253 A | * | 9/1997 | Chiu ...................... C04B 35/117 360/122 |
| 5,681,511 A | * | 10/1997 | Streckert ............... C04B 35/571 264/29.7 |
| 5,876,659 A | | 3/1999 | Yasutomi et al. |
| 6,197,374 B1 | | 3/2001 | Huttinger et al. |
| 2005/0181192 A1 | | 8/2005 | Steffier |
| 2006/0121196 A1 | | 6/2006 | Tanaka |
| 2006/0228474 A1 | | 10/2006 | Foss et al. |
| 2007/0054103 A1 | | 3/2007 | Fareed et al. |

FOREIGN PATENT DOCUMENTS

| | | |
|---|---|---|
| CN | 1244186 A | 2/2000 |
| JP | 4-272803 | 9/1992 |
| JP | 11-503493 | 3/1999 |
| JP | 2000-216075 | 8/2000 |
| JP | 2001-508388 | 6/2001 |
| JP | 2002-265285 | 9/2002 |
| JP | 3380761 | 2/2003 |
| JP | 2007-70222 | 3/2007 |
| WO | WO 02/072502 A1 | 9/2002 |
| WO | WO 2005/056872 A1 | 6/2005 |
| WO | WO 2014/027472 A1 | 2/2014 |

OTHER PUBLICATIONS

F.C. Campbell. "Ceramic Matrix Composites", Manufacturing Technology for Aerospace Structural Materials, pp. 459-493. Elsevier, 2006. Month of Publication Unknown. (Year: 2006).*
Yongdong Xu, Laifei Cheng, Litong Zhang, Hongfeng Yin, Xiaowei Yin. "Microstructure and Mechanical Properties of Three-Dimensional Textile Hi-Nicalon SiC/SiC Composites by Chemical Vapor Infiltration". Journal of the American Ceramic Society , vol. 85, No. 5, pp. 1217-1221. May 2002. (Year: 2002).*
W.J. Lackey, Thomas L. Starr. "Fabrication of Fiber-Reinforced Ceramic Composites by Chemical Vapor Infiltration: Processing, Structure and Properties", Fiber Reinforced Ceramic Composites. William Andrew Publishing/Noyes, 1990. Month of Publication Unknown. (Year: 1990).*
Christian P. Deck et al. "Modeling Forced Flow Chemical Vapor Infiltration Fabrication of SiC—SiC Composites for Advanced Nuclear Reactors", Science and Technology of Nuclear Installations, Research Article, 2013, 11 pages.
Extended Search Report dated Sep. 25, 2017 in European Patent Application No. 15755176.3.
Office Action dated Oct. 24, 2017 in Canadian Patent Application No. 2,933,025.
International Search Report dated May 26, 2015 in PCT/JP2015/055486, filed on Feb. 25, 2015 ( with English Translation).
Written Opinion dated May 26, 2015 in PCT/JP2015/055486, filed on Feb. 25, 2015.
Yoshiharu Yasui "Commentary: trend of Three Dimensional Fabric Technology", Journal of Japan Society for Composite Martials, vol. 26, No. 5, 2000, 9 pages ( with English Abstract).
Byung Jin Choi et al. "Chemical Vapour deposition of silicon carbide by pyrolysis of methylchlorosilanes", Journal of Material Science Letters 16, 1997, 4 pages.
R. Rodriguez-Clemente et al, "Influence of temperature and tetramethylsilane partial pressure on the β-SiC deposition by cold wall chemical vapor deposition", Journal of Crystal Growth 125, 1992, 10 pages.
Kwang Chul Kim et al. "Kinetic study of 3C-SiC growth on Si by pyrolyzing tetramethylsilane in low pressure radio frequency-induction heated chemical vapor deposition reactor", Journal of Vaccuum Science and Technology 16, 2000, 9 pages.
Lu-Sheng Hong et al "Macro/microcavity method and its application in modeling chemical vapor deposition reaction systems", Thin Solid Films 3365, 2000, 13 pages.
Combined Chinese Office Action and Search Report dated Jul. 12, 2017 in Chinese Patent Application No. 201580003002.9 (with English translation of Category of Cited Documents).
Hiroshi Nakagawa, et al. "Self-Ordering of Nanofacets on Vicinal SiC Surfaces", Physical Reviews Letters, vol. 91 No. 22, Nov. 26, 2003, pp. 226107-1-4 with cover page.
George D. Papasouliotis, et al., "Experimental Study of Atomospheric Pressure Chemical Vapor Deposition of Silicon Carbide from Methyltrichlorosilane", Materials Research Society, vol. 14 No. 8, Aug. 1999, pp. 3397-3409.

* cited by examiner

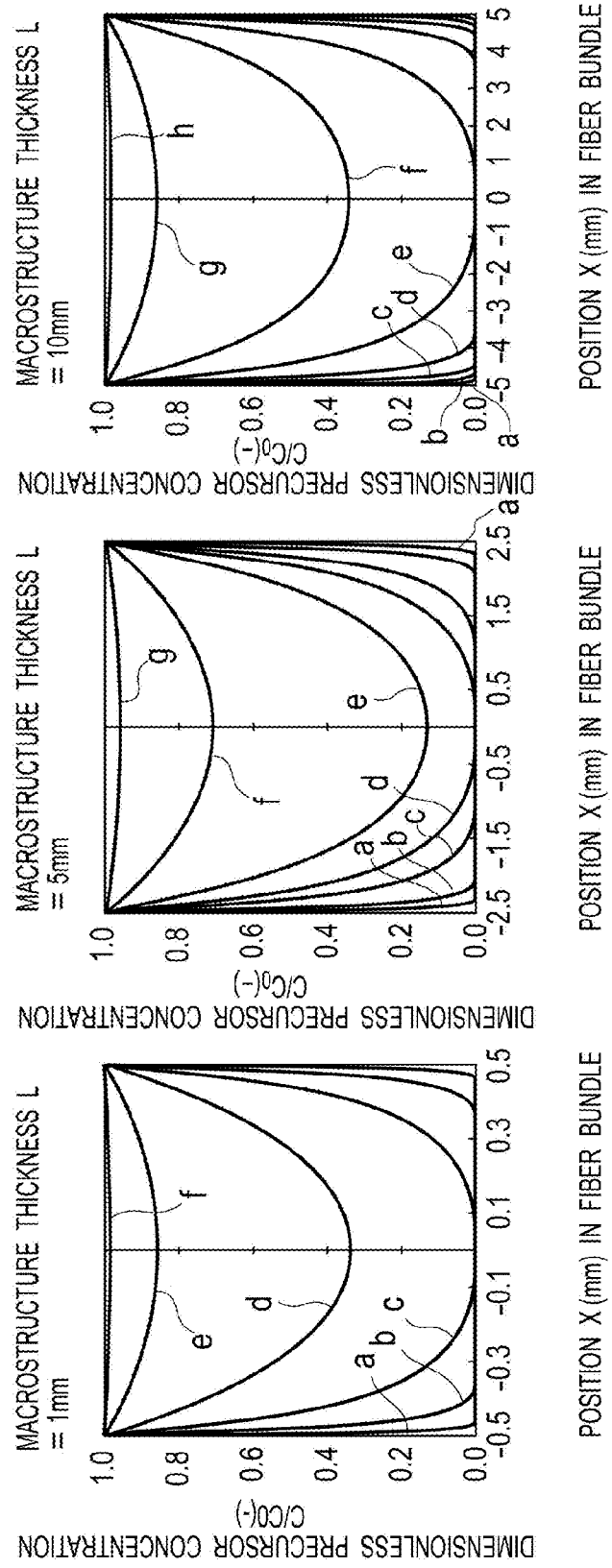

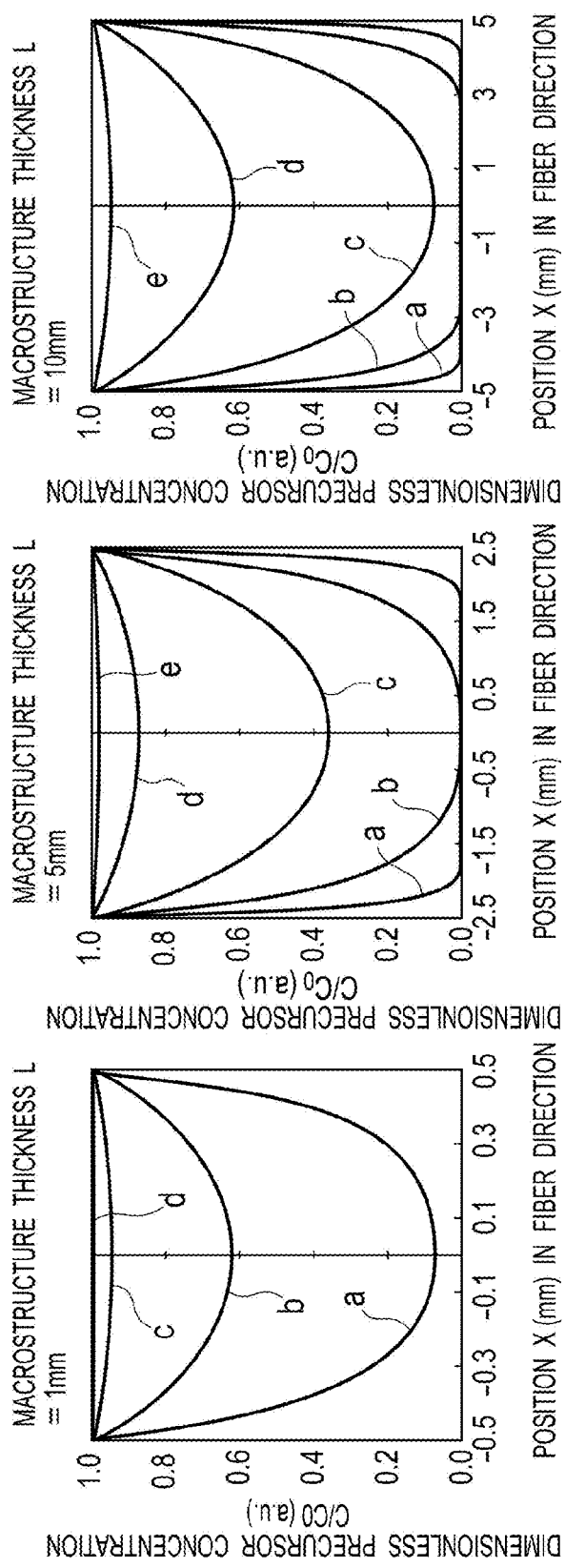

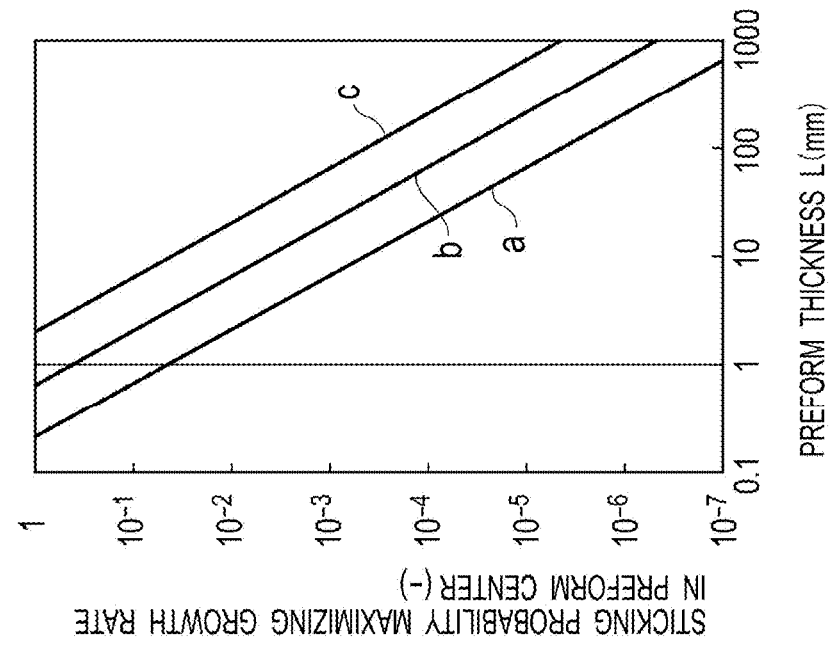
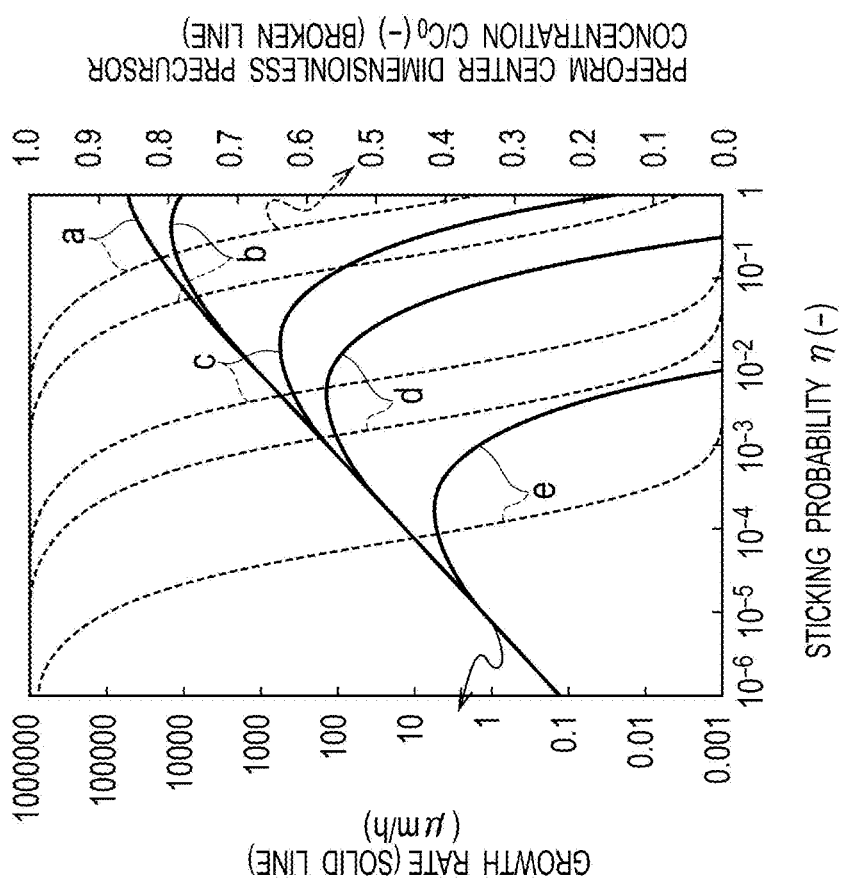

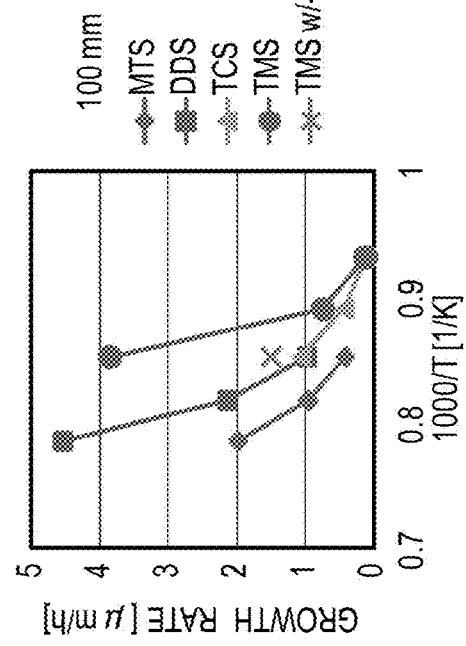
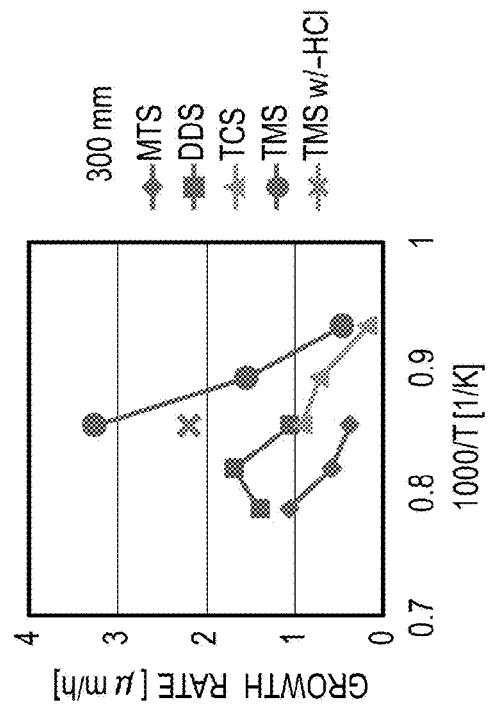
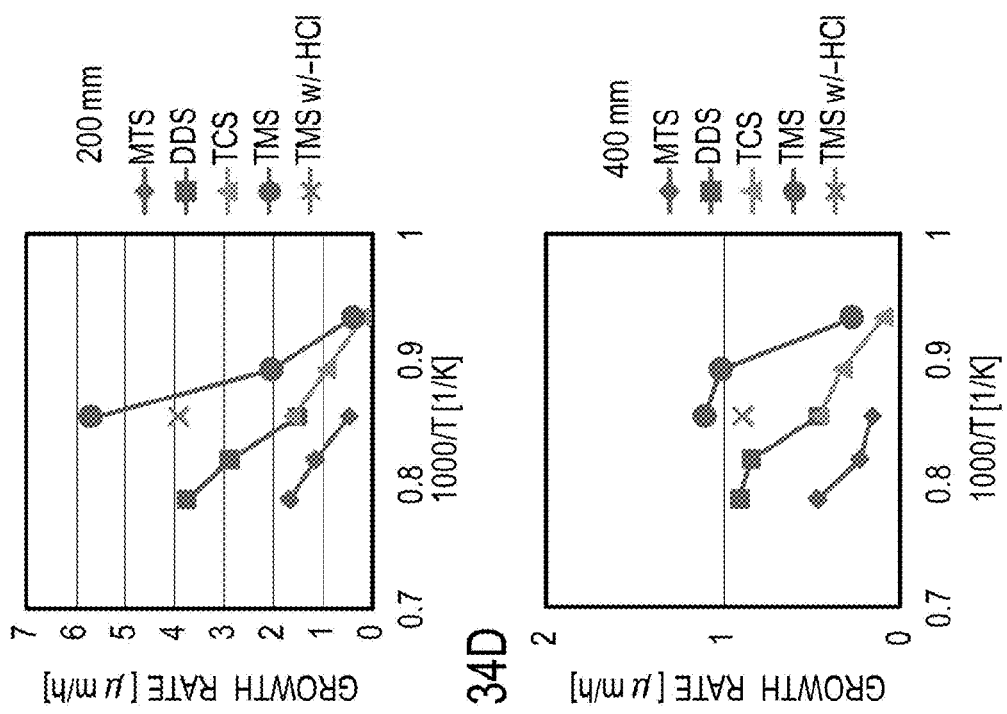
FIG. 34A, FIG. 34B, FIG. 34C, FIG. 34D

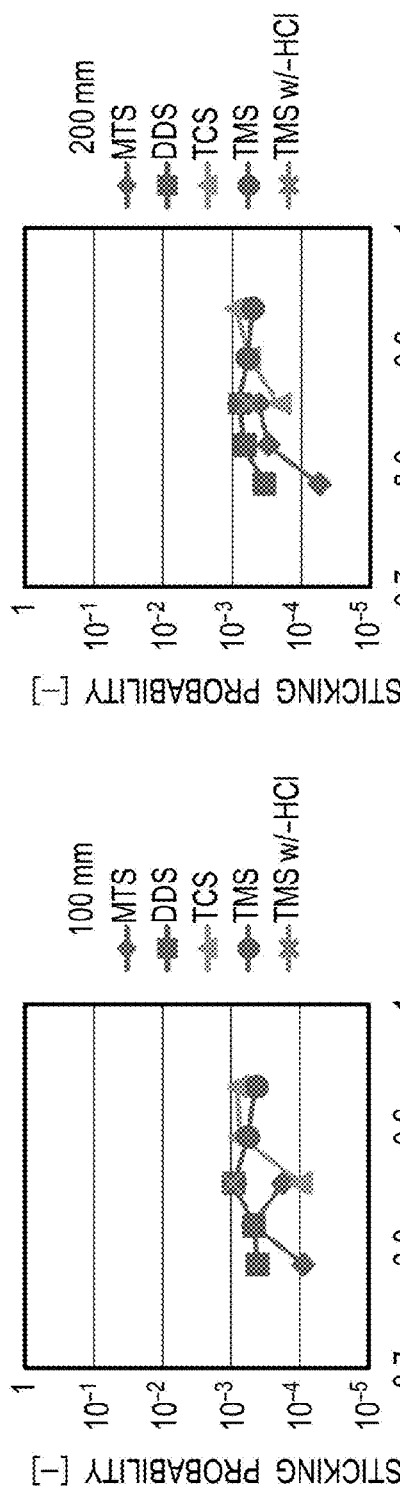
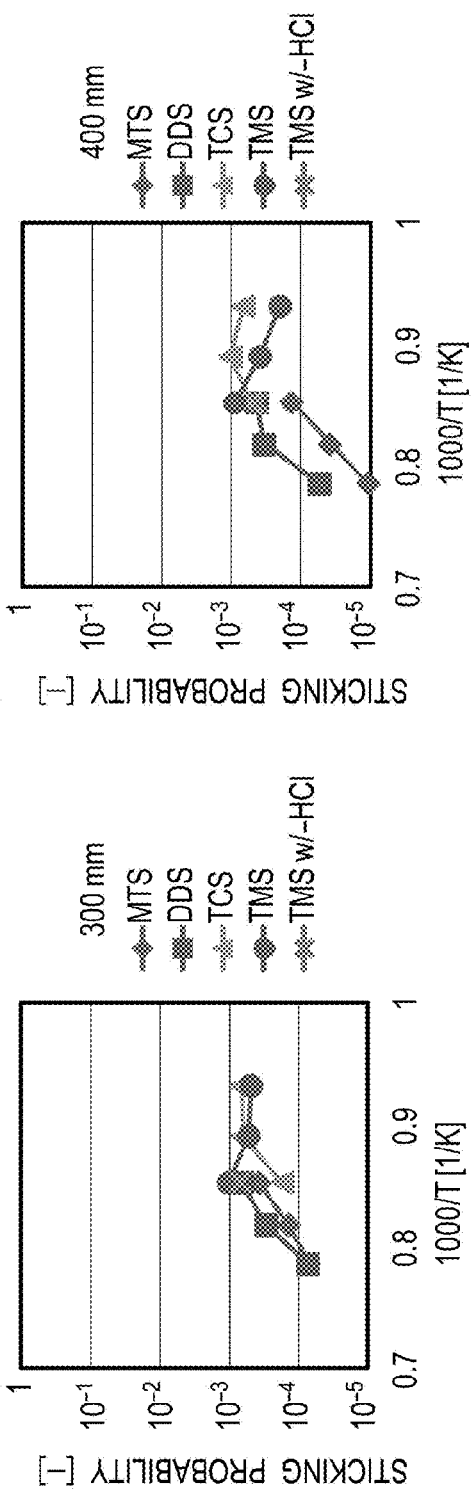
FIG. 35A, FIG. 35B, FIG. 35C, FIG. 35D

HEAT-RESISTANT COMPOSITE MATERIAL PRODUCTION METHOD AND PRODUCTION DEVICE

CROSS REFERENCE TO RELATED APPLICATIONS

This application is a continuation application of international application No. PCT/JP2015/055486 filed Feb. 25, 2015, which claims priority to Japanese Patent Application No. 2014-33509 filed Feb. 25, 2014, each of which is hereby incorporated by reference in their entity.

BACKGROUND

1. Field

The present embodiment relates to a method and a device for producing a heat-resistant composite material containing silicon carbide and, more specifically, to a technical field applied to production of thin film of ceramics and semiconductors by chemical vapor deposition (CVD), production of heat-resistant structure material, and the process technique of CVD.

2. Description of Related Art

Components used in high-temperature places such as engines of airplanes and rockets always utilize lightweight materials excellent in mechanical strength even in high temperature. However, it is known that the characteristics of conventionally used nickel-base superalloys are reaching the limit of advancement. Accordingly, ceramic matrix composites (CMC) are attracting attention as a next-generation material that can accommodate the aforementioned needs and as such are being considered for mass-production in the near future.

The CMCs are composite materials including ceramics which is infiltrated as a matrix in a preform (woven fabric) including ceramics fibers (a reinforcement material). SiC/SiC-CMC, which use silicon carbide (SiC) in both of the reinforcement material and matrix, particularly has smaller weight and higher heat resistance than conventional nickel-base superalloys and is regarded as the leading next-generation material.

As illustrated in FIG. 1, the preform includes three-dimensional woven fabric having fiber bundles (yarns) woven like cloth or the like. Each fiber bundle includes several thousands of silicon carbide fibers bundled. The preform has a multilayer structure (see Non-Patent Document 1 below). In this preform, yarns X as fiber bundles indicated by X in FIG. 1 and yarns Y as fiber bundles indicated by Y in FIG. 1 constitute two-dimensional woven fabric extending in directions X and Y. The two-dimensional woven fabric and yarns Z as fiber bundles, which are orthogonal to the yarns X and Y, constitute the three-dimensional woven fabric. These yarns X, Y, and Z are orthogonal to each other, and the thus-configured preform is also referred to as three-dimensional orthogonal woven fabric.

The process to produce SiC/SiC-CMC includes: a process to deposit a matrix of silicon carbide to integrate fibers in each fiber bundle, which includes silicon carbide fibers bundled, in the preform; and a process, which is performed after the process to integrate fibers (filling each fiber bundle, forming composite fiber bundles), to deposit a matrix of silicon carbide to integrate fiber bundles constituting the preform (filling the three-dimensional orthogonal woven fabric, forming composite three-dimensional orthogonal woven fabric). The both processes are important and difficult processes in CMC production.

FIG. 2A is a schematic diagram illustrating a fiber bundle including several thousands of silicon carbide fibers bundled, and FIG. 2B is a cross-sectional SEM photograph of SiC/SiC-CMC obtained by processing the preform with the aforementioned process (see Non-Patent Document 2 below). The silicon carbide fibers indicated by a in FIG. 2B are partially in contact and are integrated to form a fiber bundle indicated by b. As indicated by c in FIG. 2B, fiber bundles are integrated with each other.

To integrate silicon carbide fibers in each fiber bundle constituting the preform in particular, it is necessary to embed the matrix of silicon carbide uniformly and densely throughout the whole preform. In other words, it is necessary to achieve multilayer uniformity both in the preform and in each fiber bundle, which have different scales.

In such a uniform growth process to integrate silicon carbide fibers and fiber bundles thereof, it is necessary to uniformly deposit the matrix of silicon carbide. The growth process is therefore implemented by chemical vapor infiltration (CVI) using reaction in the gas phase excellent in diffusion and generally utilizes a gas mixture of methyltrichlorosilane (MTS, $CH_3SiCl_3$) and hydrogen ($H_2$) as the precursor.

PRIOR ART DOCUMENTS

Patent Documents

Patent Document 1: JP 2001-508388 A
Patent Document 2: JP 3380761 B
Patent Document 3: JP 2000-216075 A

Non-Patent Documents

Non-Patent Document 1: Yoshiharu Yasui, Journal of Japan Society for Composite Materials, Vol. 26, No. 5 (2000), 163
Non-Patent Document 2: Christian P. Deck, H. E. Khalifa, B. Sammuli, and C. A. Back, Science and Technology of Nuclear Installations, Volume 2013, Article ID 127676, 10 pages
Non-Patent Document 3: B. J. Choi, D. W. Park, and D. R. Kim, Journal of Materials Science Letters 16 (1997) 33
Non-Patent Document 4: R. Rodriguez-Clemente, A. Figueras, S. Garelik, B. Armas and C. Combescure, J. of Cryst. Growth 125 (1992) 533
Non-Patent Document 5: K. C. Kim, K. S. Nahm, Y. B. Hahn, Y. S. Lee, and H. S. Byun, J. Vac. Sci. Technol., A 18 (2000) 891
Non-Patent Document 6: Lu-Sheng Hong, Yukihiro Shimogaki, and Hiroshi Komiyama, "Macro/microcavity method and its application in modeling chemical vapor deposition reaction systems," Thin Solid Films, vol. 365, no. 2, pp. 176-188 (2000)

SUMMARY

In order to increase the uniformity of the distribution of growth rate in the process of depositing the matrix of silicon carbide using a gas mixture of MTS and hydrogen, it is typically necessary to perform film formation by diffusing the precursor in the preform at an extremely low reaction rate. The process of chemical vapor infiltration spends a long time. The long-time film formation of chemical vapor infiltration is one of the factors that degrade mass production.

One molecule of MTS includes one silicon (Si) atom, one carbon (C) atom, three hydrogen (H) atoms, and three chlorine (Cl) atoms. In the gas phase outside of the preform in a reaction furnace for chemical vapor infiltration, the gas mixture of MTS and hydrogen ($H_2$) is decomposed mainly in the gas phase when heated at a high temperature of about 1000° C. and generates various intermediates every moment with reaction time (residence time). The generated various intermediates are molecules including a combination of Si, C, H, and Cl contained in the precursor. The various intermediates are divided into chemical species containing silicon, chemical species containing carbon, chemical species containing both silicon and carbon, and chemical species containing neither. The generated various intermediates include tens or more of major chemical species having significant partial pressure.

Some of the various intermediates that directly relate to film formation of silicon carbide include low-activity growth species with low reaction probability (growth species with low sticking probability) and high-activity growth species with high reaction probability (growth species with high sticking probability). The growth species with low sticking probability penetrate deeply into the preform, but the growth species with high sticking probability do not penetrate deeply into the preform.

As illustrated in FIG. 3, qualitatively, in a surface layer 100$b$, which is a shallow portion of the preform 100 within the predetermined distance from the surface thereof, film of silicon carbide is formed by both the growth species with low sticking probability and the growth species with high sticking probability. However, in a portion 100$a$ deeper than the surface layer 100$b$, film of silicon carbide is formed by only the growth species with low sticking probability. In the surface layer 100$b$ of the preform 100, therefore, the distribution of film of silicon carbide on the fiber bundles is strongly influenced by the growth species with high sticking probability, and the preform 100 is filled sparsely and densely and has non-uniform filling properties.

The present embodiment is proposed in the light of the aforementioned circumstances, and an object thereof is to provide heat-resistant composite material production method and production device which quickly form film of silicon carbide and provide a composite material having such filling properties that the film of silicon carbide is distributed uniformly independently of the depth from the surface.

To solve the aforementioned problem, a method of producing a heat-resistant composite material according to the present embodiment is a method of producing a heat-resistant composite material which uses chemical vapor deposition or chemical vapor infiltration to allow precursor gas, additive gas, and carrier gas to flow in a reaction furnace accommodating a preform and deposit silicon carbide on the preform for film formation, the preform including a plurality of fiber bundles, each having a plurality of fibers. The method includes the steps of: depositing silicon carbide between the fibers to integrate (combine) the fibers constituting each fiber bundle; and depositing silicon carbide between the fiber bundles to integrate (combine) the fiber bundles.

In the step of integrating the fibers, the ratio $C/C_0$ of concentration C of the precursor gas at the center of the fibers to initial concentration $C_0$ of the precursor gas supplied to the reaction furnace may be in a range from 0.2 to 0.3. The ratio $C/C_0$ may be in a range from 0.24 to 0.26.

In the step of integrating the fibers, growth temperature may be in a range from 800 to 1000° C., and total pressure of the precursor gas, additive gas, and carrier gas is may be in a range of 4 to 6 Torr. The growth temperature may be in a range from 850 to 950° C., and the total pressure may be in a range of 4.5 to 5.5 Torr.

In the step of integrating the fiber bundles, the ratio $C/C_0$ of concentration C of the precursor gas at the center of the fiber bundles to the initial concentration $C_0$ of the precursor gas supplied to the reaction furnace may be in a range from 0.2 to 0.3. The ratio $C/C_0$ may be in a range from 0.24 to 0.26.

In the step of integrating the fiber bundles, growth temperature may be in a range from 800 to 1000° C., and total pressure of the precursor gas, additive gas, and carrier gas is in a range of 5 to 110 Torr. The growth temperature may be in a range from 850 to 950° C., and the total pressure may be in a range of 5 to 105 Torr.

The method may further include: a step of providing woven fabric having a predetermined thickness to wrap around the outer circumference of the preform before the step of integrating the fibers; and a step of removing the woven fabric from the preform after the step of integrating the fibers constituting the fiber bundles and before the step of integrating the fiber bundles.

The woven fabric may be wound around the outer circumference of the preform. The preform may be made of woven fabric, and the woven fabric provided on the circumference of the preform may be made of the same material as that of the preform.

The precursor gas may contain at least any one of methyltrichlorosilane, dimethyldichlorosilane, tetramethylsilane, and trimethylchlorosilane. The precursor gas may contain methyltrichlorosilane in the step of integrating the fibers while the precursor gas contains at least any one of dimethyldichlorosilane, tetramethylsilane, and trimethylchlorosilane in the step of integrating the fiber bundles.

The carrier gas may contain at least one of hydrogen, nitrogen, helium, and argon. The additive gas may contain at least one of hydrogen chloride, monochloromonomethylsilane, methyldichlorosilane, methyltrichlorosilane, dimethylmonochlorosilane, dimethyldichlorosilane, trimethylmonochlorosilane, monochlorosilane, dichlorosilane, trichlorosilane, tetrachlorosilane, chlorodisilane, dichlorodisilane, hexachlorodisilane, octachlorotrisilane, monochioromethane, dichloromethane, chloroform, tetrachloromethane, monochloroacetylene, dichloroacetylene, monochloroethylene, dichloroethylene, trichloroethylene, tetrachloroethylene, monochloroethane, dichloroethane, trichloroethane, tetrachloroethane, pentachloroethane, hexachloroethane, monochloropropane, dichloropropane, trichloropropane, tetrachloropropane, pentachloropropane, hexachloropropane, heptachloropropane, octachloropropane, and chlorine molecules. The additive gas may contain hydrogen chloride.

The precursor gas may contain methyltrichlorosilane while the carrier gas contains hydrogen. The molar ratio of hydrogen to methyltrichlorosilane may be in a range from 1.5 to 2.5. The molar ratio of hydrogen to methyltrichlorosilane may be in a range from 1.9 to 2.1.

Growth rate and filling uniformity at the film formation of silicon carbide may be controlled by an amount of the additive gas added. When the film formation of silicon carbide follows a first-order reaction, the growth rate and filling uniformity at the film formation of silicon carbide may be controlled by controlling probability of a growth species sticking to the preform with an amount of the additive gas added.

When the film formation of silicon carbide follows a Langmuir-Hinshelwood rate formula, the growth rate and filling uniformity at the film formation of silicon carbide may be controlled by adjusting the amount of the added additive gas so that the film formation is performed in a zero-order reaction region of the Langmuir-Hinshelwood rate formula. The growth rate and filling uniformity at the film formation of silicon carbide may be optimized.

The distribution of growth rate at the film formation of silicon carbide with respect to the position in the reaction furnace may be controlled through the amount of the added additive gas. The distribution of growth rate may be optimized to be uniform. The precursor gas may be supplied through a plurality of positions located from the upstream end to the downstream end in the reaction furnace.

The additive gas may include an effect of inhibiting film formation. The reaction furnace may be a hot-wall furnace.

A heat-resistant composite material producing device according to the present embodiment uses the aforementioned method of producing a heat-resistant composite material and includes a reaction furnace accommodating a preform; a precursor gas supply source supplying precursor gas to the reaction furnace; a carrier gas supply source supplying carrier gas to the reaction furnace; an additive gas supply source supplying additive gas to the reaction furnace; and a controller controlling the supply of the precursor gas from the precursor gas supply source, the supply of the additive gas from the additive gas supply source, and the supply of the carrier gas from the carrier gas supply source. The controller controls the temperature and pressure of the reaction furnace and the supplies of the supplied precursor gas, additive gas, and carrier gas in a step of depositing silicon carbide between the fibers to integrate the fibers constituting each fiber bundle and in a step of depositing silicon carbide between the fiber bundles to integrate the fiber bundles.

According to the present embodiment, it is possible to quickly form film of silicon carbide and provide a composite material having such filling properties that the film of silicon carbide is distributed uniformly independently of the depth from the surface, leading to improvements in mass production.

BRIEF DESCRIPTION OF DRAWINGS

FIGS. 10A to 10C are graphs illustrating a precursor diffusion concentration distribution in a macrostructure of the preform.

FIGS. 14A to 14C are graphs illustrating thickness of the macrostructure of the preform in consideration of the fiber bundles of silicon carbide after integration.

FIGS. 15A and 15B are graphs illustrating dependencies of the growth rate and the precursor concentration $C/C_0$ on the sticking probability $\eta$ in the center of the macrostructure and the sticking probability that maximizes the growth rate in the center of the macrostructure.

FIGS. 34A to 34D are graphs illustrating the temperature dependency of growth rate of low η species of some types of precursors.

FIG. 35A to 35D is graphs illustrating the temperature dependency of sticking probability of low η species of some types of precursors.

DETAILED DESCRIPTION OF EMBODIMENTS

Hereinafter, a description is given for embodiments of a method and a device for producing a heat-resistant composite material in detail with reference to the drawings.

[Configuration of Production Device]

Figure 4:
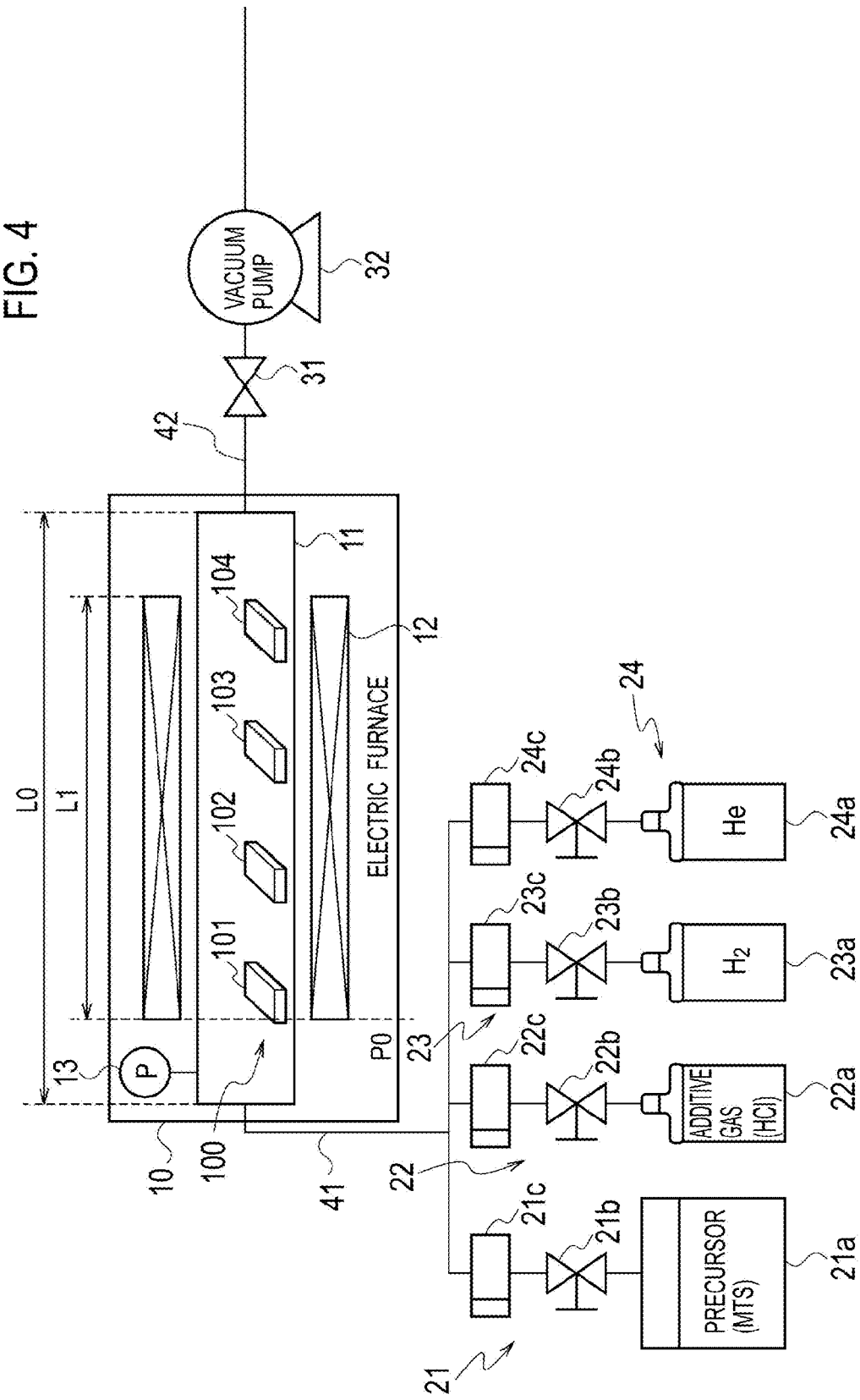
FIG. 4 is a diagram illustrating a schematic configuration of a device of producing a heat-resistant composite material.

FIG. 4 is a diagram illustrating a schematic configuration of the device for producing a heat-resistant composite material. This production device constitutes a chemical vapor deposition (CVD) device or a chemical vapor infiltration (CVI) device and includes a horizontal hot-wall electric furnace 10 as a reaction furnace. The electric furnace 10 is maintained at a predetermined temperature and a predetermined pressure and is supplied with a gas mixture including methyltrichlorosilane (MTS, $CH_3SiCl_3$) as a precursor gas, hydrochloride (HCl) as an additive gas, and hydrogen ($H_2$) and helium (He) as a carrier gas.

A first flow channel 41, which supplies the gas mixture from the upstream side to the electric furnace 10, is supplied with MTS as the precursor gas from a precursor gas supply portion 21 at a predetermined flow rate. The precursor gas is supplied by gasifying the precursor stored in a precursor gas supply source 21a in the form of liquid. The precursor gas supply portion 21 regulates the flow rate of the supplied precursor gas through a first valve 21b and controls the precursor gas to a predetermined mass flow through a first mass flow controller 21c. The first valve 21b and first mass flow controller 21c constitute a precursor gas flow rate control portion as a precursor gas supply controller to control the supply of the precursor gas.

The first flow channel 41 is supplied with hydrogen chloride as an additive gas from an additive gas supply portion 22 at a predetermined flow rate. The additive gas supply portion 22 regulates through a second valve 22b, the flow rate of the additive gas supplied from an additive gas supply source 22a and controls the additive gas to a predetermined mass flow through a second mass flow controller 22c. The second valve 22b and second mass flow controller 22c constitute an additive gas flow rate control portion as an additive gas supply controller to control the supply of the additive gas.

Moreover, the first flow channel 41 is supplied with hydrogen as a first carrier gas from a first carrier gas supply portion 23 at a predetermined flow rate. The first carrier gas supply portion 23 regulates through a third valve 23b, the flow rate of the first carrier gas supplied from a first carrier gas supply source 23a and controls the first carrier gas to a predetermined mass flow through a third mass flow controller 23c.

Moreover, the first flow channel 41 is supplied with helium as a second carrier gas from a second carrier gas supply portion 24 at a predetermined flow rate. The second carrier gas supply portion 24 regulates through a fourth valve 24b, the flow rate of the second carrier gas supplied from a second carrier gas supply source 24a and controls the second carrier gas to a predetermined mass flow through a fourth mass flow controller 24c.

The third valve 23b and third mass flow controller 23c of the first carrier gas supply portion 23 and the fourth valve 24b and fourth mass flow controller 24c of the second carrier gas supply portion 24 constitute a carrier gas flow rate control portion as a carrier gas supply controller which controls the flow rates of the first and second carrier gases to control the supply of the carrier gas.

The electric furnace 10 includes a transparent reaction tube 11 like a quartz tube and a heater 12 surrounding the reaction tube 11 and constitutes a hot-wall furnace in which an object accommodated in the reaction tube 11 is heated from the wall surface by the heater 12. To one of the openings of the reaction tube 11 on the upstream side, a gas mixture of the precursor gas, additive gas, and carrier gas is supplied from the first flow channel 41. The gas mixture flows toward the other opening on the downstream side in the reaction tube 11.

The electric furnace 10 accommodates plural preforms 100, which are arranged side by side from upstream to downstream in the reaction tube 11. The preforms 100 include microstructures like a three-dimensional woven fabric structure. The preforms 100 are supplied with the gas mixture at a predetermined temperature and a predetermined pressure, and silicon carbide (SiC) is deposited on the microstructures thereof to form film.

From the opening of the reaction tube 11 on the downstream side in the electric furnace 10, exhaust gas containing the gas mixture not contributing to the film formation of silicon carbide and byproducts related to the film formation of silicon carbide is discharged to a second flow channel 42. Some of the byproducts remain and are deposited in the reaction tube 11 in some cases. The second flow channel 42 is provided with a pressure control valve 31 and a vacuum pump 32 and maintains the predetermined pressure in the reaction tube 11 of the electric furnace 10.

In this embodiment, length $L_0$ of the reaction tube 11 of the electric furnace 10 in the longitudinal direction that the gas mixture flows is 900 mm, and longitudinal length $L_1$ of the heater 12 surrounding the reaction tube 11 is 500 mm. The position of each preform 100 placed in the reaction tube 11 is indicated by a distance along the longitudinal direction from a referential position P0, which is at an upstream end of the heater 12 in the direction that the gas mixture flows.

This production device includes a not-illustrated control device as a controller. The control device controls the aforementioned precursor gas flow rate control portion, carrier gas flow rate control portion, and additive gas flow rate control portion to regulate the flow rates of the precursor gas, additive gas, and carrier gas supplied through the first flow channel 41 to the electric furnace 10.

To be specific, the flow rate of the precursor gas is controlled with the precursor gas flow rate control portion including the first valve 21b and first mass flow controller 21c. The flow rate of the additive gas is controlled with the additive gas flow rate control portion including the second valve 22b and second mass flow controller 22c. The flow rate of the carrier gas is controlled with the carrier gas flow rate control portion including the third and fourth valves 23b and 24b and third and fourth mass flow controllers 23c and 24c.

The control device detects the pressure within the reaction tube 11 with a pressure gauge 13 provided for the electric furnace 10 and controls a pressure control valve 31 so as to maintain the predetermined pressure within the reaction tube 11. The control device detects the temperature within the electric furnace 10 through a not-shown thermocouple provided for the electric furnace 10 and controls the heater 12 to maintain the predetermined temperature within the electric furnace 10.

In this embodiment, the control device is capable of controlling the flow rates of the precursor gas, additive gas, and carrier gas contained in the gas mixture supplied to the electric furnace 10 to control deposition of silicon carbide on the microstructures of the preforms 100 accommodated in the electric furnace 10. For example, the control device is capable of adjusting the flow rates of the precursor gas, carrier gas, and additive gas and the ratio of the flow rates thereof and adjusting the amount of additive gas to the precursor.

[Growth Rate and Filling Uniformity]

The control device performs the above-described control so as to implement both high growth rate of film deposited on the microstructures of the preforms 100 and good filling uniformity. In other words, the control device implements a predetermined growth rate to ensure the mass-productivity of heat-resistant composite products including the preform 100 impregnated with silicon carbide and implements predetermined filling uniformity to guarantee the filling of the microstructure of the preform 100 with silicon carbide.

Herein, the deposition of silicon carbide on the microstructure of the preform 100 follows a first-order reaction mechanism or a reaction mechanism based on the Langmuir-Hinshelwood rate formula depending on the growth species which is to be formed into film. The control method thereof varies depending on the reaction mechanisms, and the reaction mechanisms are individually described below.

[Case of First-Order Reaction Mechanism]

When growth species of silicon carbide follow a first-order reaction mechanism, the growth rate at film formation of silicon carbide is in a first-order relation with the concentration of the growth species. In this case, the control device makes a control to generate a large amount of growth species having low sticking probability. The growth species having low sticking probability uniformly stick to the microstructures of the preform, ensuring the filling uniformity at film formation. Moreover, generation of a large amount of growth species ensures the growth rate at film formation. Accordingly, it is possible to implement both high growth rate and good filling uniformity. As the sticking probability is reduced, the filling uniformity is increased, but the growth rate is lowered. The control device is therefore designed to implement desired filling uniformity and desired growth rate.

In order to generate growth species having low sticking probability, the control device controls the precursor gas, carrier gas, and additive gas flow rate control portions so that the flow rates of the precursor gas, carrier gas, and additive gas are in a predetermined ratio. In other words, the control device makes a control to add only a predetermined amount of the additive gas with respect to the precursor gas. Moreover, in order to generate a large amount of growth species, the control device adjusts the flow rates of the precursor gas, carrier gas, and additive gas to predetermined flow rates by controlling the precursor gas, carrier gas, and additive gas flow rate control portions. Furthermore, the control device controls parameters, including the ratio and flow rates of the precursor gas, carrier gas, and additive gas, to optimize the growth rate and filling uniformity.

[Case of Reaction Mechanism Based on Langmuir-Hinshelwood Rate Formula]

In the case where the growth species of silicon carbide follows the reaction mechanism based on the Langmuir-Hinshelwood rate formula, as the concentration of the growth species increases, the growth rate at film formation is saturated with respect to the concentration, and there is a zero-order reaction area where the growth rate does not depend on the concentration of growth species. The control device makes a control to increase the concentration of growth species to a high concentration not less than a predetermined value so that the concentration of the growth species falls in the zero-order reaction area. In the zero-order reaction area of the growth species, the growth rate at film formation is constant independently of the concentration, and the filling uniformity at film formation can be ensured. Moreover, by increasing the concentration, the growth rate is increased. Accordingly, it is possible to implement both high growth rate and good filling uniformity.

The control device controls the precursor gas, additive gas, and carrier gas flow rate control portions so that the flow rates of the precursor gas, carrier gas, and additive gas are in a predetermined ratio. In other words, the control device makes a control to add only a predetermined amount of additive gas with respect to the precursor gas. Moreover, in order for the concentration of growth species to fall in the zero-order region, the control device adjusts the flow rates of the precursor gas, additive gas, and carrier gas to predetermined flow rates by controlling the precursor gas, additive gas, and carrier gas flow rate control portions. Furthermore, the control device controls the parameters, including the ratio and flow rates of the precursor gas, additive gas, and carrier gas, to optimize the growth rate and filling uniformity.

[Operation of Additive Gas]

Irrespectively of which reaction mechanism the growth species follow, the additive gas containing chlorine generates molecules to be adsorbed on the reaction surface of silicon carbide and prevents adsorption of growth species on the reaction surface, so that the sticking probability of growth species is reduced. The additive gas containing chlorine therefore has a film formation inhibiting operation which reduces film formation, ensuring good filling uniformity at film formation.

[Distribution of Growth Rate in Furnace]

On the other hand, in some cases of producing a heat-resistant composite material in an industrial scale, the electrical furnace 10, which is as long as about several meters, for example, is provided and accommodates the plural preforms 100 which are arranged side by side in the direction from upstream to downstream in the reaction tube 11 for simultaneous film formation of silicon carbide on the preforms 100.

In the aforementioned case, the control device makes a control to reduce the growth rate in the upstream side of the reaction tube 11 so that the growth rate is the same at the plural preforms 100. For example, the control device controls the precursor gas, additive gas, and carrier gas flow rate control portions as well as controls the heater 12 to regulate the flow rate of the gas mixture and the distribution of temperature so that the growth species have low concentration upstream and have high concentration downstream.

The control device makes a control so that the precursor gas is sufficiently supplied downstream. For example, the control device can control the precursor gas, carrier gas, and additive gas flow rate control portions so as to supply a sufficient flow rate of gas mixture. Moreover, the gas mixture can be supplied not only from one end in the upstream side of the reaction tube 11 but also simultaneously from another supply channel provided between the end in the upstream side and the other end in the downstream side of the reaction tube 11.

Moreover, the control device makes a control to equalize the growth rate between the upstream and downstream ends and increase the use efficiency of the precursor gas in the supplied gas mixture. For example, the control device can increase the use efficiency of the precursor gas by properly adjusting the parameters, including: the ratio, the flow rates, and the ways of supply of the precursor gas, additive gas, and carrier gas to the electric furnace 10; and distributions of temperature and pressure in the electric furnace 10. This can improve the distribution of growth rate in the electric furnace 10 as well as reduce the production cost. Moreover, by using the aforementioned parameters, the control portion can optimize the use efficiency of the precursor gas.

[SiC/SiC-CMC Porosity]

In this embodiment, chemical vapor deposition or infiltration to deposit silicon carbide are used to implement two matters: integration of fibers of silicon carbide and integration of fiber bundles. In terms of these two objects, the indices for optimization are to increase the degree of infiltration and to reduce growth time (to increase the growth rate). Precursor diffusion and reaction in a preform are modeled for consideration.

Figure 5:
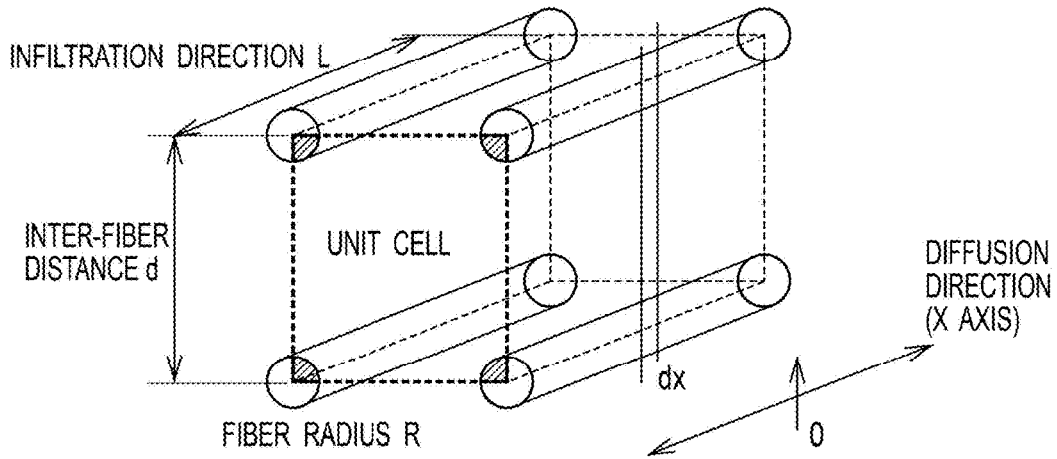
FIG. 5 is a schematic diagram illustrating a model of the structure between silicon carbide fibers.

FIG. 5 illustrates a schematic diagram of three-dimensional orthogonal woven fabric of fiber bundles of silicon carbide, that is, a preform. The following description reveals problems occurring when the precursor diffuses in the preform for film formation. Qualitatively, the following discussion is given on the balance between the rate at which the precursor is spent due to film formation on the fiber surfaces and the rate at which the precursor reaches the inside of the preform due to diffusion thereof.

In this discussion, the important parameters that can change the above-described balance are sticking probability $\eta$ (a value from 0 to 1) at which the precursor (chemical species, growth species) relating to film formation sticks to the substrate surface and diffusion constant D [m$^2$/s] of the precursor. The sticking probability being low and the diffusion constant being large mean that the precursor penetrates into the preform to form film uniformly. In order to correctly estimate the balance, it is necessary to formulate and quantify the relationship between the dimensions of fiber bundles of silicon carbide and the diffusion constant and sticking probability of the precursor (chemical species, growth species).

Figure 2A:
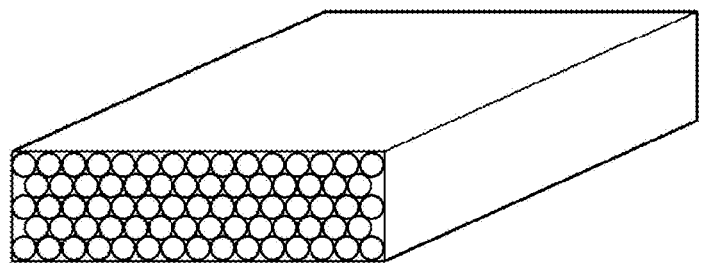
FIG. 2A is a schematic diagram illustrating a fiber bundle and FIG. 2B is an SEM photograph of a cross section of fiber bundles after film of a matrix of silicon carbide is formed by chemical vapor infiltration.
Figure 2B:
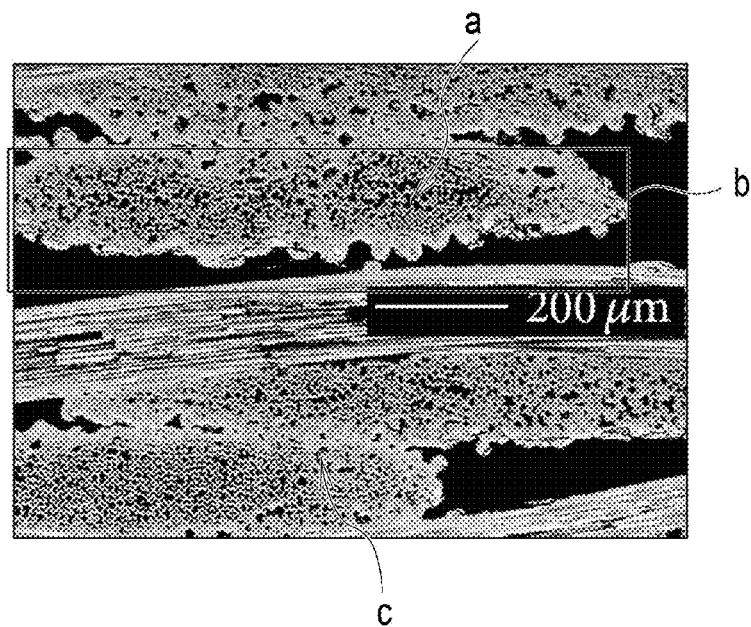

The dimensions of fiber bundles of silicon carbide are estimated based on the cross-sectional SEM image illustrated in FIG. 2B like as: the thickness and width of each fiber bundle is about 0.2 mm and 1.5 mm, respectively; and there are about 1 to 5 μm gaps between fibers. The infiltration properties of the precursor are estimated based on the above dimensions.

[Diffusion Model]

The growth conditions of the process of chemical vapor infiltration need to be analyzed in combination with the discussion based on a diffusion equation and the relationship of the surface reaction mechanisms. Accordingly, the analysis is started with solving the diffusion equation, and the surface reaction rate constant is expressed using the sticking probability of the growth species together. In this embodiment, the balance between diffusion and film formation is considered by considering the space surrounded by fibers as illustrated in FIGS. 2A and 2B to be a unit cell illustrated in FIG. 5 and introducing an effect of the ratio (S/V ratio) of fibers to space into the reaction rate constant.

The relational expression of diffusion is specifically derived. The discussion is given based on molecular diffusion and first-order reaction. When it is given that the precursor diffuses only in the axis X direction of fiber bundles of silicon carbide, the distribution of precursor concentration is expressed by a fundamental equation derived from the material balance at dx in FIG. 5:

$$D\frac{d^2C}{dx^2} = k_V C \qquad \text{[Equation 1]}$$

The boundary conditions are:

At $X = 0$, [Equation 2]

$$\frac{dC}{dx} = 0$$

At $X = \pm \frac{L}{2}$, $C = C_0$

Accordingly, the following equation is obtained:

$$\frac{C}{C_0} = \frac{\cosh\left(\sqrt{\frac{k_v}{D}}x\right)}{\cosh\left(\frac{L}{2}\sqrt{\frac{k_v}{D}}\right)} = \frac{\cosh\left(\frac{L}{2}\sqrt{\frac{k_v}{D}}\frac{2x}{L}\right)}{\cosh\left(\frac{L}{2}\sqrt{\frac{k_v}{D}}\right)} = \frac{\cosh\left(h\frac{x}{0.5L}\right)}{\cosh(h)} \quad \text{[Equation 3]}$$

Herein, C [mol/m³] is the concentration of growth species; $C_0$ [mol/m³], the initial concentration of the growth species; D [m²/s], the diffusion constant of the growth species; $k_v$ [1/s], volumetric reaction rate constant in the unit cell; and L [m], the thickness of the preform. The gas is supplied from the both ends in the axis X, and the infiltration distance (=representative length) is L/2.

Equation 3 includes a relationship of:

$$h = \frac{L}{2}\sqrt{\frac{k_v}{D}} \quad \text{[Equation 4]}$$

This is the Thiele modulus (h is a dimensionless number).

The Thiele modulus represents that the degree of infiltration of the precursor depends on the balance between the precursor diffusion in the vapor phase (D [m²/s]), consumption by reaction ($k_v$ [1/s]), and representative length (L/2 [m]): depth of impregnation or the like. Herein, the representative length (L/2) is determined by the dimensions of CMC and has almost no flexibility of design. The precursor diffusion (D) in the vapor phase is determined by the growth species (the molecular weight and collision cross-section) and the growth conditions (temperature T and pressure P) but has a very low flexibility of design. On the other hand, the consumption (k) by reaction is determined by the growth conditions (temperature T and pressure P) and the type of the growth species and has a high flexibility of design. The consumption by reaction ($k_v$) therefore becomes an element to increase the degree of infiltration.

Figure 6:
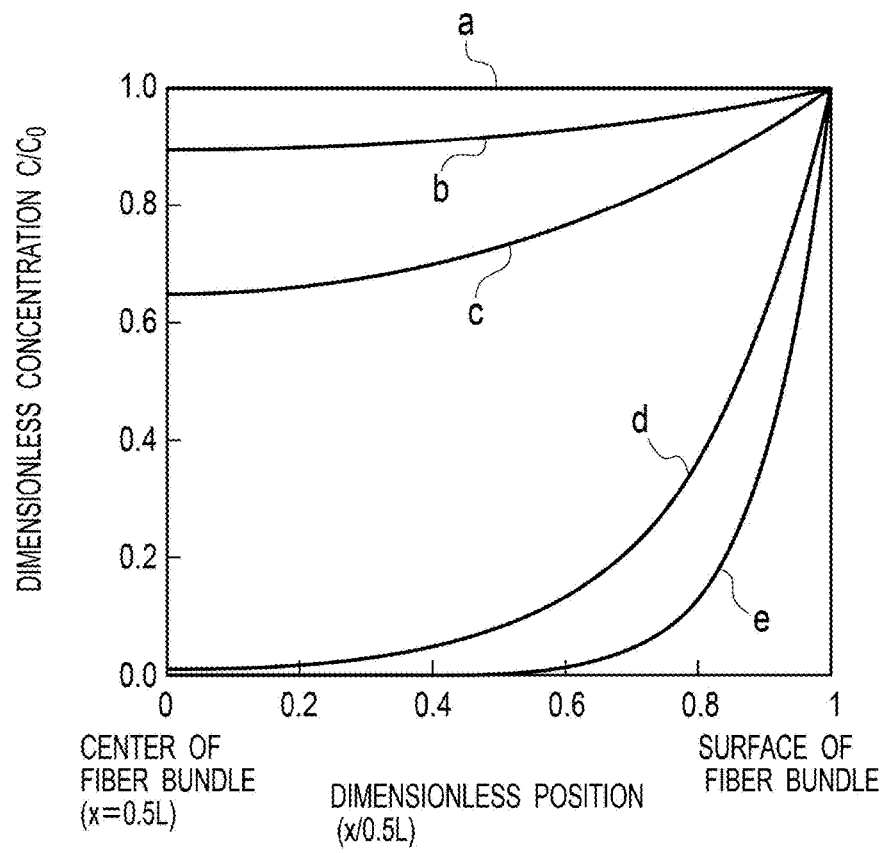
FIG. 6 is a graph illustrating the relationship between diffusion of $C/C_0$ into a fiber bundle of silicon carbide fibers and the Thiele modulus.

FIG. 6 illustrates $C/C_0$ as a function of the dimensionless position x/L at various values of h. Curves a to e in FIG. 6 correspond to values of the Thiele modulus h of 0.1, 0.5, 1, 5 and 10, respectively. At the center between the silicon carbide fibers, target molecules can infiltrate with the concentration varying little when the Thiele modulus h in Equation 4 is about 01 On the other hand, when the Thiele modulus h is equal to or more than 5, the target molecules hardly reach the center. Accordingly, the growth conditions need to be determined so that the Thiele modulus becomes small. This means that the precursor can uniformly penetrate into pores if the consumption (k) due to reaction is reduced and diffusion (D) of the precursor in the vapor phase is increased.

Next, Equation 4 is represented by the sticking probability for consideration of the reaction mechanism. Based on the relationship between the flux and first-order reaction, the surface reaction rate constant $K_s$ [m/s] is represented using the sticking probability η as follows:

$$k_s = \frac{1}{4}v_T\eta \quad \text{[Equation 5]}$$

Herein, η (a dimensionless number) is a probability at which the growth species is adsorbed on the surfaces of silicon carbide fibers to be transformed into silicon carbide film, and $V_T$ [m/s] is an average thermal velocity of the growth species. The coefficient "1/4" means an integral attributable to the matter that the precursor comes in random directions.

In order to apply the surface reaction rate constant $K_s$ to Equation 3, the surface reaction rate constant $K_s$ [m/s] needs to be converted into the volumetric reaction rate constant $k_v$ [1/s] by multiplying the surface reaction rate constant $K_s$ [m/s] by the S/V ratio. When the surface reaction rate constant $K_s$ is corrected using the S/V ratio, the following relationship is obtained.

$$k_v = \frac{S}{V}k_s = \frac{2\pi R}{d^2 - \pi R^2}k_s \quad \text{[Equation 6]}$$

S is the surface area of silicon carbide fibers in the unit cell, and V is the spatial volume of the unit cell other than the silicon carbide fibers. By combining Equations 3 and 6, the dimensionless precursor concentration in a fiber bundle of silicon carbide can be estimated as a function of the sticking probability η at surface reaction.

Next, it is necessary to specifically estimate the diffusion constant D [m²/s] included in Equation 3. In order to determine whether the diffusion is molecular diffusion ($D_m$ [m²/s]) mainly including collision between molecules or Knudsen diffusion ($D_k$ [m²/s]) mainly including collision between molecules and walls, the mean free path is calculated. In this embodiment, it is assumed that the growth species that control the rate of film formation of silicon carbide is not MTS but $C_2H_2$ and $CH_3$ and the contribution of $C_2H_2$ is dominant. Accordingly, calculation is made based on the assumption that the growth species is $C_2H_2$ in the following estimation.

The mean free path λ is calculated by Equation 7.

$$\lambda = \frac{kT}{\sqrt{2}\,\pi d^2 P} \quad \text{[Equation 7]}$$

The Knudsen number $K_n$ is expressed by the ratio of the mean free path λ to representative length L' (distance between silicon carbide fibers herein) as follows.

$$Kn = \frac{\lambda}{L'} \quad \text{[Equation 8]}$$

It is then determined that the diffusion is Knudsen diffusion when Kn>1 and is molecular diffusion when Kn<1. When Kn is around 1, the diffusion is in the transition region.

In the case of Knudsen diffusion, the diffusion constant $D_k$ [M²/S] is calculated by Equation 9.

$$D_k = \frac{1}{3}vL' \quad \text{[Equation 9]}$$

v [m/s] is the thermal velocity and is calculated by Equation 10.

$$v = \sqrt{\frac{8RT}{\pi M}} \quad \text{[Equation 10]}$$

In the case of molecular diffusion, the diffusion constant $D_m$ between two bodies is calculated by the Chapman-Enskog equation. The Chapman-Enskog equation is expressed as:

$$D_{1,2} = 0.1883 \times 10^{-4} \times \frac{\sqrt{T^3(M_{r,1} + M_{r,2})/M_{r,1}M_{r,2}}}{p\sigma_{1,2}^2 \Omega_D} \quad \text{[Equation 11]}$$

$$\Omega_D = \frac{1.06036}{T_N^{0.1561}} + \frac{0.19300}{exp(0.47635T_N)} + \frac{1.03587}{exp(1.52996T_N)} + \frac{1.76474}{exp(3.89411T_N)} \quad \text{[Equation 12]}$$

$$\sigma_{1,2} = \frac{\sigma_1 + \sigma_2}{2} \quad \text{[Equation 13]}$$

$$\varepsilon_{1,2}/k = \sqrt{\varepsilon_1/k \times \varepsilon_2/k}$$

$$T_N = kT/\varepsilon$$

Herein, T [K] is temperature; p [kPa], pressure; M [kg/mol], molecular weight; $\Omega_D$, reduced collision integral; $T_N$, standardized temperature; k [J/K], Boltzmann coefficient (=$1.38 \times 10^{-23}$ J/K); and σ [m] and ε [K], Lenneard-Jones parameters.

The Lenneard-Jones parameters of major molecules necessary for the Chapman-Enskog equation are shown in Table 1. Table 1 shows $CH_4$ instead of $CH_3$.

TABLE 1

| | σ Å | ε/k K |
|---|---|---|
| $C_2H_2$ | 4.033 Å | 231.8 K |
| $CH_4$ | 3.8 Å | 148.1 K |
| $H_2$ | 2.915 Å | 38 K |
| MTS | 5.913 Å | 398 K |

[Diffusion Constant and Pressure in Preform]

The diffusion between silicon carbide fibers needs to be considered as Knudsen diffusion, and the diffusion in the whole preform needs to be considered as molecular diffusion. The diffusion constants thereof are estimated using the aforementioned relational expressions as follows.

Figure 7:
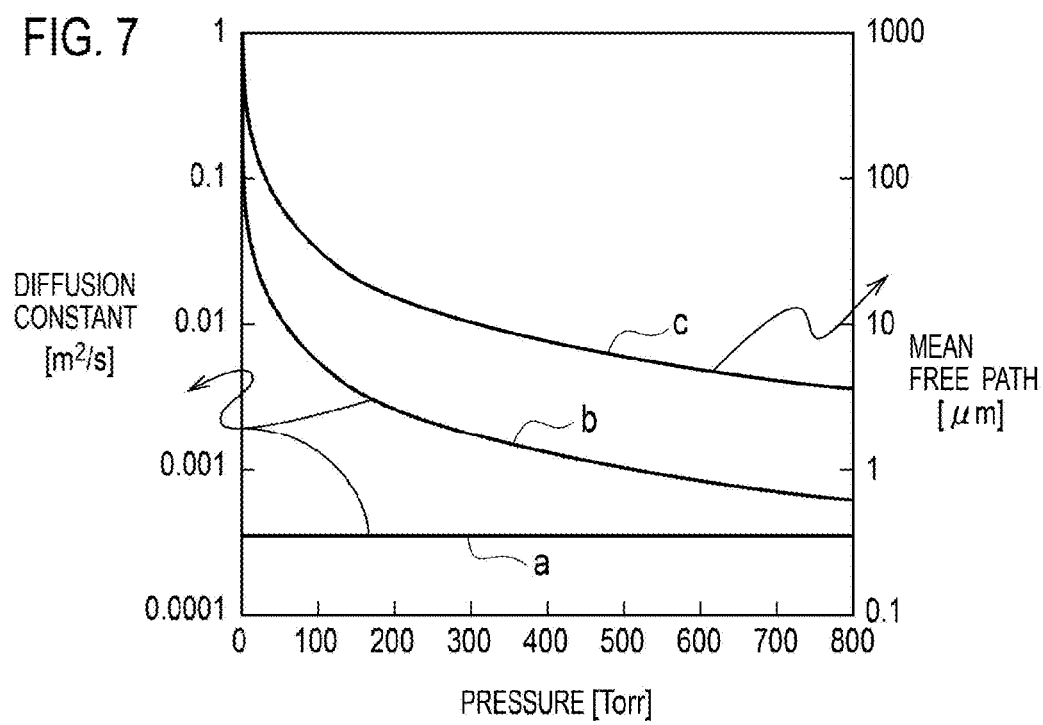
FIG. 7 is a graph illustrating pressure dependencies of molecular diffusion $D_m$, Knudsen diffusion $D_k$ between silicon carbide fibers, and mean free path $\lambda$.

FIG. 7 illustrates the results of calculating the molecular diffusion constant ($D_m$), Knudsen diffusion constant ($D_k$), and mean free path λ at various values of the total pressure from 1 to 800 Torr. Curves a, b, and c in FIG. 7 represent the Knudsen diffusion constant ($D_k$), molecular diffusion constant ($D_m$), and mean free path λ, respectively. Herein, the temperature is set to 1273 K, and the molecular diameter d is $1 \times 10^{-10}$ m. With reference to FIG. 2B, the distance d between centers of silicon carbide fibers is set to 11 μm, and the radius R of silicon carbide fibers is set to 5 μm. The representative length L' between silicon carbide fibers is set to 1 μm which is used to calculate the Knudsen diffusion constant.

The mean free path λ is as long as 3.7 μm even at 800 Torr. Accordingly, all the diffusion between silicon carbide fibers is thought to be Knudsen diffusion. In terms of diffusion into the fiber bundle woven fabric of the entire preform, the precursor is thought to diffuse in the direction of yarns Z in the model diagram of the fiber bundle woven fabric illustrated in FIG. 9 described later. In the yarn Z direction, gaps in the order of millimeter (1.5 mm square) penetrate. In this case, it can be thought that molecular diffusion is dominant when the total pressure is not less than 2 Torr ($\lambda_{2\,Torr}$=1.52 mm).

[Integration of Silicon Carbide Fibers]

Diffusion into Microstructure (into Fiber Bundle)

Next, consideration is given on a specific case. At first, consideration is given on diffusion of the precursor into each fiber bundle (yarn X, Y, or Z) of silicon carbide as a micro-region. In diffusion into fiber bundles illustrated in FIG. 2A, only diffusion of the precursor occurring in the smallest width of each fiber bundle is considered for simplifying the phenomenon. With reference to the cross-sectional SEM photograph of FIG. 2B, the dimensions of the fiber bundles are: 1.5 mm wide, 0.2 mm high, and several mm deep in FIG. 2A. Accordingly, the consideration is given only to diffusion in the direction of the height (0.2 mm) which is the smallest.

In order to integrate silicon carbide fibers by infiltrating the matrix of silicon carbide into silicon carbide bundles, the precursor concentration in each fiber bundle needs to be uniform. As illustrated in the cross-sectional SEM image of the fiber bundles in FIG. 2B, under the growth conditions where the precursor concentration is uneven in each fiber bundle, gaps in the fiber bundles obstructed in the surfaces, and film formation is finished before silicon carbide fibers in each fiber bundle are integrated. To solve this problem, it is necessary to find out the conditions that allow the precursor concentration distribution ($C/C_0$) illustrated in FIG. 6 to come close to 1 even in the center of the fiber bundle by reducing the surface reaction rate constant $K_s$ (reducing the sticking probability) or increasing the diffusion constant D as shown in the Thiele modulus of Equation 4.

The precursor concentration distribution ($C/C_0$) among silicon carbide fibers is estimated. In the Thiele modulus of Equation 4, $$h = \frac{L}{2}\sqrt{\frac{k_v}{D_k}} \quad \text{[Equation 14]}$$

the Knudsen diffusion constant $$D_k = \frac{1}{3}vL' \quad \text{[Equation 15]}$$

and the reaction rate constant in Equation 9 are substituted.

$$k_v = \frac{1}{4}vT\eta \times \frac{S}{V} \quad \text{[Equation 16]}$$

The Thiele modulus is therefore expressed as:

$$h = L\sqrt{\frac{3\eta S}{16 L' V}} \quad \text{[Equation 17]}$$

and is determined only by the sticking probability η, representative length L, and S/V ratio. The temperature T is included only in the sticking probability.

Figure 8:
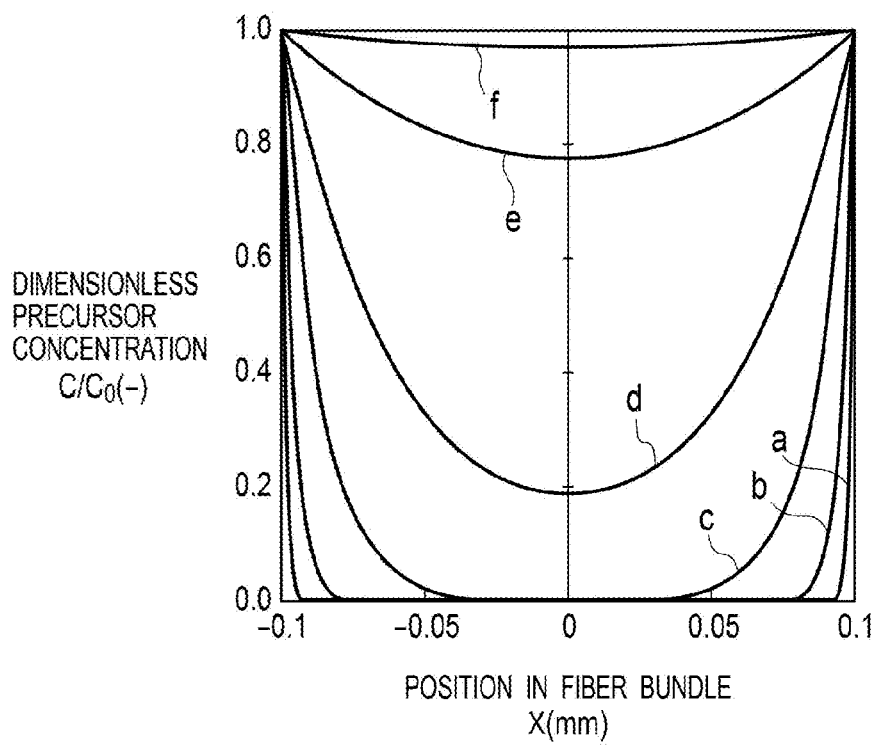
FIG. 8 is a graph illustrating a precursor diffusion concentration distribution in the direction X in a fiber bundle.

FIG. 8 illustrates the $C/C_0$ distribution in a fiber bundle estimated at various values of the sticking probability η. Herein, with reference to the cross-sectional SEM photograph, the structure dimensions of the fiber bundle are assumed as follows: infiltration depth (fiber bundle thickness) L=0.2; fiber radius R=5 μm; and distance d between centers of silicon carbide fibers=11 μm. Curves a to f correspond to values of the sticking probability η of 1, $10^{-1}$, $10^{-2}$, $10^{-3}$, $10^{-4}$, and $10^{-5}$, respectively. The Thiele modulus in Equation 17 described above determines the distribution of diffusion of the precursor only depending on the fiber bundle structure independently of the temperature excepting the sticking probability. It is therefore estimated that enough diffusion of the precursor can be obtained when the sticking probability η is not more than $10^{-5}$.

Diffusion into Macrostructure (in Preform)

Figure 9A:
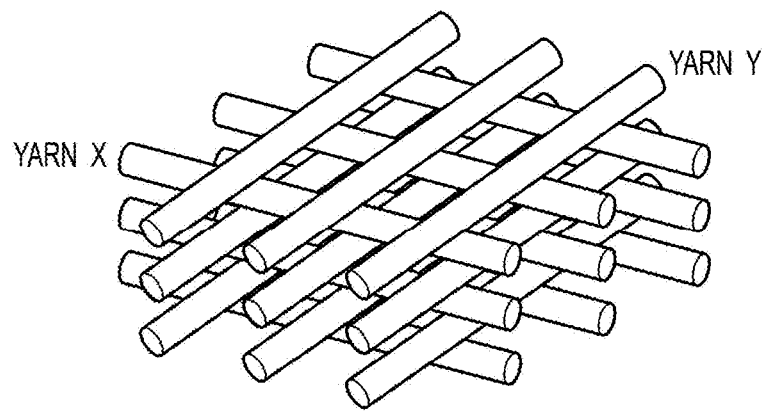
FIGS. 9A and 9B are schematic diagrams illustrating an arrangement model of yarns X and Y in the preform of the three-dimensional woven fabric including fiber bundles laid on each other.
Figure 9B:
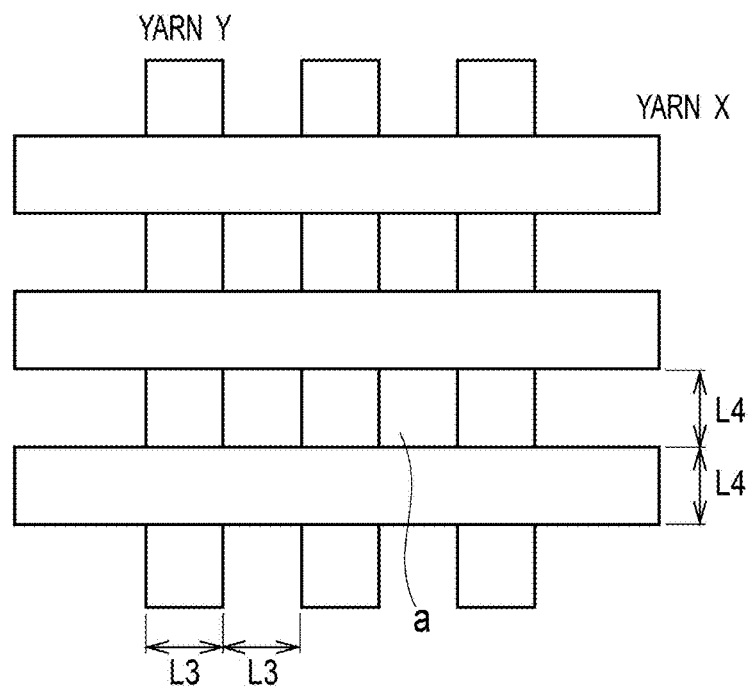

FIGS. 9A and 9B illustrate a model diagram of arrangement of yarns X and Y in a preform of three-dimensional woven fabric including a bundle of fiber bundles. FIG. 9A is a perspective view of a model of three-dimensional woven fabric, and FIG. 9B is a top view of the model. In FIG. 9B, $L_3$ and $L_4$ are 1.5 mm, and a indicates gaps through which yarns Z pass.

Figure 1:
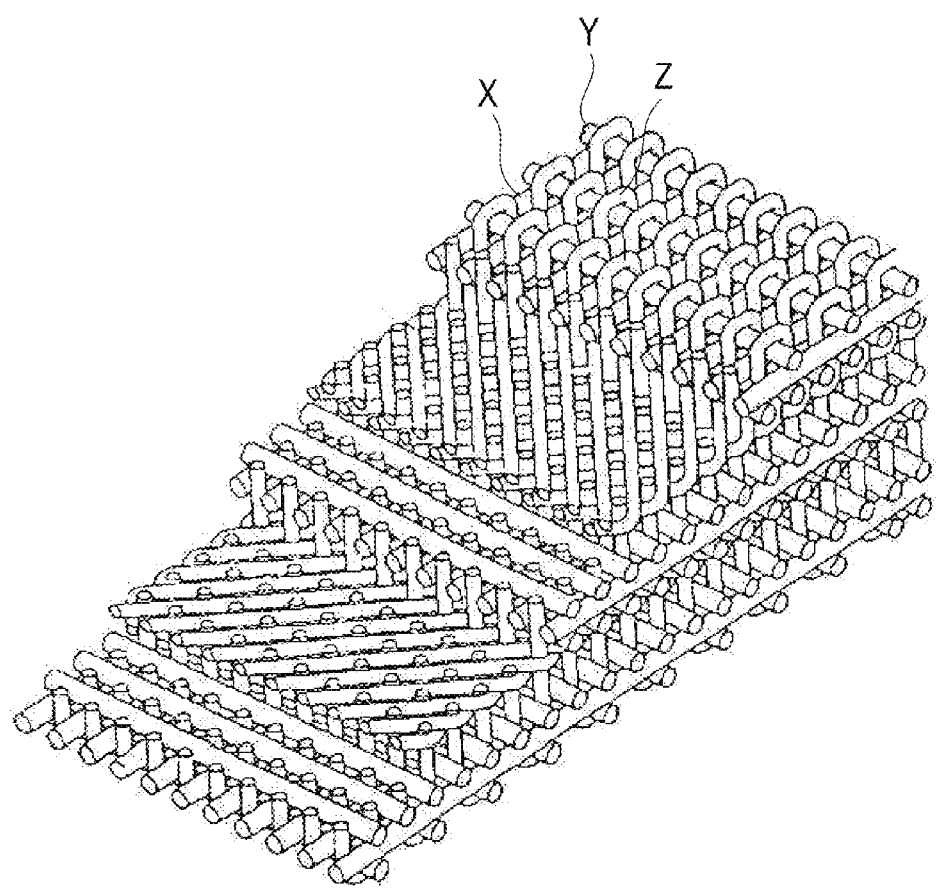
FIG. 1 is a perspective view schematically illustrating three-dimensional orthogonal woven fabric of a preform.

Herein, the yarns Z have a role of bundling the layer structures including yarns X and Y. The thickness of the preform in the direction of yarns Z is smaller than that in the directions of yarns X and Y, and the direction of yarns Z correspond to the direction that the precursor diffuses. The yarns Z pass through respective rectangular gaps (1.5 mm square) between yarns X and Y in FIG. 1. When the thickness of yarns Z is also 0.2 mm, the space through which the yarns Z pass is thought to be 1.3 mm×1.5 mm. Accordingly, the diffusion of the precursor and the reaction are considered in a structure where yarns X and Y are laid on each other as illustrated in FIG. 9A without taking into account yarns Z. In the situation considered herein, film of silicon carbide is not yet formed within each fiber bundle, and the fiber bundles are not dense.

In the case of the model diagram of the preform illustrated in FIGS. 9A and 9B, large gaps (1.3 mm×1.5 mm) penetrate in the direction of yarns Z. Even if gaps in fiber bundles are obstructed in the surfaces, the precursor diffuses through the penetrating gaps. Film formation in the center of the preform can be therefore performed as long as the penetrating gaps are not obstructed. Accordingly, rough estimation is made for the ratio of the film thickness that cannot obstruct the gaps to the film thickness necessary for integration of silicon carbide fibers and integration of fiber bundles in the center of the preform.

It is given that the film thickness for obstructing a 1.3 mm gap extending in the direction of yarns Z is 0.65 mm, for example. On the other hand, it is given that the film thickness for integrating silicon carbide fibers in a fiber bundle is 1 μm and the film thickness for integrating fiber bundles is 10 μm when the radius R of silicon carbide fibers is 5 μm and the distance d between centers of silicon carbide fibers is 11 μm. This means that integration of silicon carbide fibers in each fiber bundle in the center of the preform tolerates a difference in film thickness up to 650 times (650 μm:1 μm), and integration of fiber bundles tolerates a difference in film thickness up to 65 times (650 μm:10 μm).

Next, diffusion of the precursor and growth reaction between silicon carbide fibers in a macrostructure are considered for the overall preform. Since the gaps extending in the direction of yarns Z are of the order of millimeters, the diffusion constant is the molecular diffusion constant (Dm). Moreover, when the sticking probability is not higher than $10^{-5}$, uniform film formation can be implemented in each fiber bundle as described above. Accordingly, silicon carbide fibers can be considered to be uniformly distributed in the macrostructure. As for the dimensions between silicon carbide fibers in the preform, the S/V ratio is calculated on the assumption that the fiber radius R is 5 μm and the distance d between the centers of fibers is 11 μm with reference to the cross-sectional SEM photograph of FIG. 2B.

FIGS. 10A to 10C illustrate distributions of precursor concentration in the macrostructure (thickness of the preform) for various values of sticking probability at a growth temperature of 1000° C. and a total pressure of 10 Torr. In FIGS. 10A to 10C, the thickness L of the preform is 1 mm, 5 mm, and 10 mm, respectively. In each diagram, curves a to f correspond to values of the sticking probability η of 1, $10^{-1}$, $10^{-2}$, $10^{-3}$, $10^{-4}$, $10^{-5}$, $10^{-6}$, and $10^{-7}$, respectively.

Relationship Between Sticking Probability and Growth Rate

In preparation, the relationship between the sticking probability, precursor diffusion, and growth rate between silicon carbide fibers in the preform is specifically calculated. First of all, the simplest relationship between the sticking probability and growth rate is considered, When film formation is assumed to follow the first-order reaction, Herts-Knudsen Equation (flux J [$m^{-2}\,s^{-1}$] is expressed by:

$$G_{[m/s]} = \frac{M_{SiC[kg]}}{\rho_{SiC[kg/m^3]}} J_{[m^{-2}\cdot s^{-1}]} \quad \text{[Equation 18]}$$

$$= \frac{M_{SiC[kg]}}{\rho_{SiC[kg/m^3]}} \frac{P_{growth\ species}}{\sqrt{2\pi \cdot M_{growth\ species} RT}} \times \eta_{growth\ species}$$

Herein, J [$m^{-2}\,s^{-1}$] is flux; G [m/s], growth ratio; $M_g$ [g/mol], molecular weight (represented by 149.5 g/mol of MTS); ρ [g/cm³], density of silicon carbide (3.21 g/cm³); η, sticking possibility; R [J·mol/K], gas constant (8.31 J·mol/K); T [K], temperature; and P [Ps], partial pressure of growth species. The temperature is 1000° C. herein.

Figure 11:
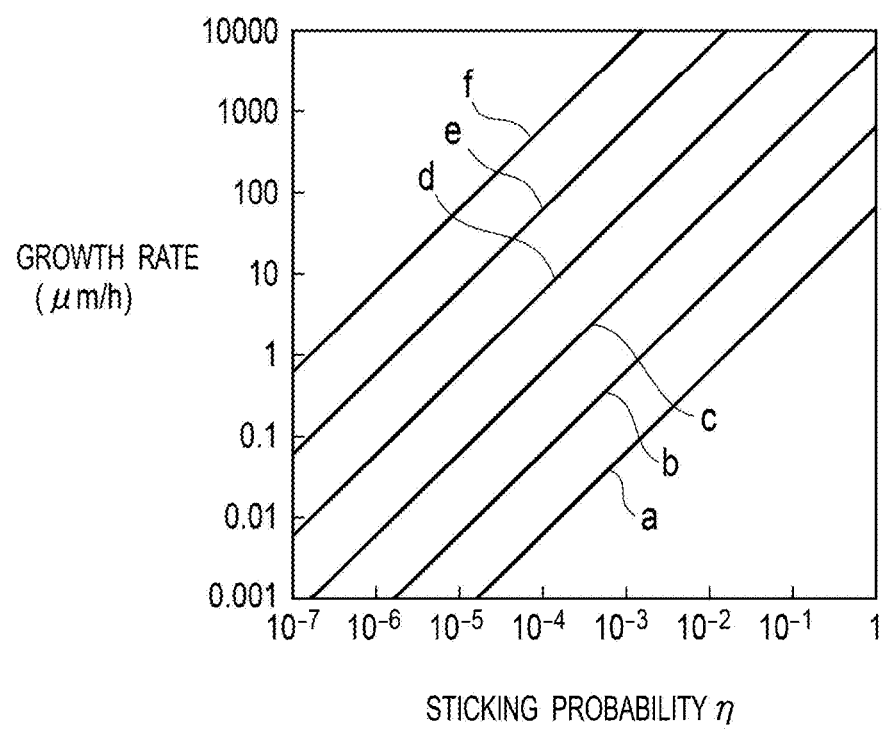
FIG. 11 is a graph illustrating the relationship between the sticking probability and the growth rate outside of the macrostructure.

The results of estimating the growth rate G using Equation 18 are shown in FIG. 11. Lines a to e correspond to values of $P_{growth\ species}$ of 0.001, 0.0001, 0.01, 0.1, 1, 10, and 100 Torr, respectively.

Precursor Diffusion and Growth Rate Distribution in Preform (Integration of Silicon Carbide Fibers)

Based on the results obtained above, the relationship between the sticking probability, precursor diffusion, and growth rate between silicon carbide fibers in the center of the macrostructure is discussed. The important thing is to discuss in what way reduction of the sticking probability changes the balance between the effect of reducing the growth rate and the effect of increasing the growth rate due to the increase in precursor concentration in the center of the preform. The equation for the growth rate in the preform is expressed by the combination of Equations 19 and 20.

$$G_{[m/s]} = \frac{M_{SiC[kg]}}{\rho_{SiC[kg/m^3]}} \frac{P_{growth\ species}}{\sqrt{2\pi \cdot M_{growth\ species} RT}} \times \eta_{growth\ species} \quad \text{[Equation 19]}$$

$$\frac{C}{C_0} = \frac{\cosh\left(h\frac{x}{0.5L}\right)}{\cosh(h)} \quad \text{[Equation 20]}$$

From the ideal gas low of PV=nRT, the following relationship is established. This is an equation for conversion between partial pressure and concentration.

$$C = \frac{n}{V} = \frac{P}{RT} \quad \text{[Equation 21]}$$

Equation 20 is therefore converted as follows:

$$\frac{C}{C_0} = \frac{P}{P_0} = \frac{\cosh\left(h\frac{x}{0.5L}\right)}{\cosh(h)} \quad \text{[Equation 22]}$$

Equation 23 is therefore obtained.

$$P = P_0 \frac{\cosh\left(h\frac{x}{0.5L}\right)}{\cosh(h)} \quad \text{[Equation 23]}$$

Equation 23 is substituted in Equation 19 as follows.

$$G_{[m/s]}(x) = \frac{M_{SiC[kg]}}{\rho_{SiC[kg/m^3]}} \frac{\eta_{growth\ species}}{\sqrt{2\pi \cdot M_{growth\ species} RT}} \times P_0 \frac{\cosh\left(h\frac{x}{0.5L}\right)}{\cosh(h)} \quad \text{[Equation 24]}$$

The Thiele modulus h is:

$$h = \frac{L}{2}\sqrt{\frac{k_v}{D_m}} \quad \text{[Equation 25]}$$

The reaction rate constant $k_v$ is:

$$k_v = \frac{S}{V} k_s \quad \text{[Equation 26]}$$

The surface reaction rate constant $k_s$ is:

$$k_s = \frac{1}{4} v_T \eta \quad \text{[Equation 27]}$$

The molecular diffusion constant $D_m$ is:

$$D_{1,2} = 0.1883 \times 10^{-4} \times \frac{\sqrt{T^3(M_{r,1} + M_{r,2})/M_{r,1} M_{r,2}}}{p\sigma_{1,2}^2 \Omega_D} \quad \text{[Equation 28]}$$

By substituting all the above relational expressions in Equation 24, Equation 29 is obtained.

$$G_{[m/s]}(x) = \frac{M_{SiC[kg]}}{\rho_{SiC[kg/m^3]}} \frac{\eta_{growth\ species}}{\sqrt{2\pi \cdot M_{growth\ species} RT}} \times P_0$$

$$\frac{\cosh\left(\sqrt{\frac{S v_T \eta}{4V} \frac{p\sigma_{1,2}^2 \Omega_D}{0.1883 \times 10^{-4} \sqrt{T^3(M_{r,1} + M_{r,2})/M_{r,1} M_{r,2}}}} \times \right)}{\cosh\left(\frac{L}{2}\sqrt{\frac{S v_T \eta}{4V} \frac{p\sigma_{1,2}^2 \Omega_D}{0.1883 \times 10^{-4} \sqrt{T^3(M_{r,1} + M_{r,2})/M_{r,1} M_{r,2}}}}\right)} \quad \text{[Equation 29]}$$

Equation 29 is a unified formula determining the growth rate in the preform depending on the position x in the preform.

Figure 12B:
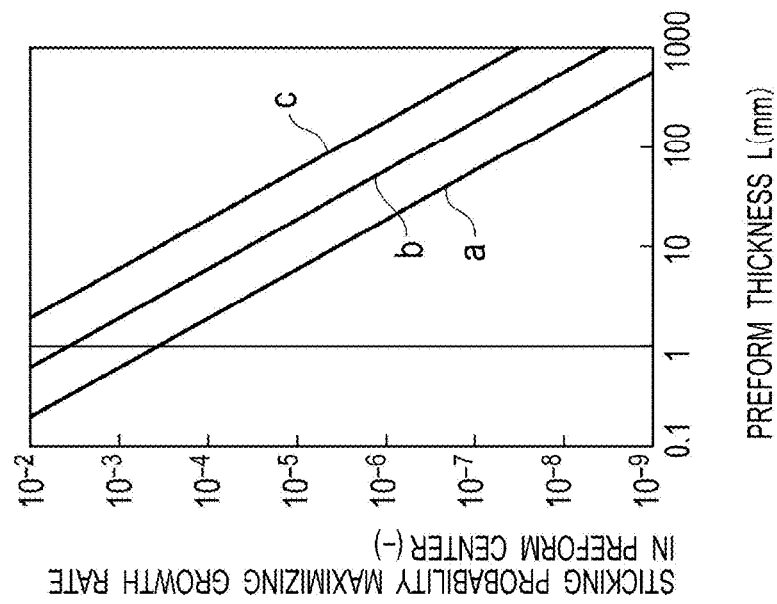
FIG. 12B is a graph illustrating the sticking probability that maximizes the growth rate in the center of the macrostructure.
Figure 12A:
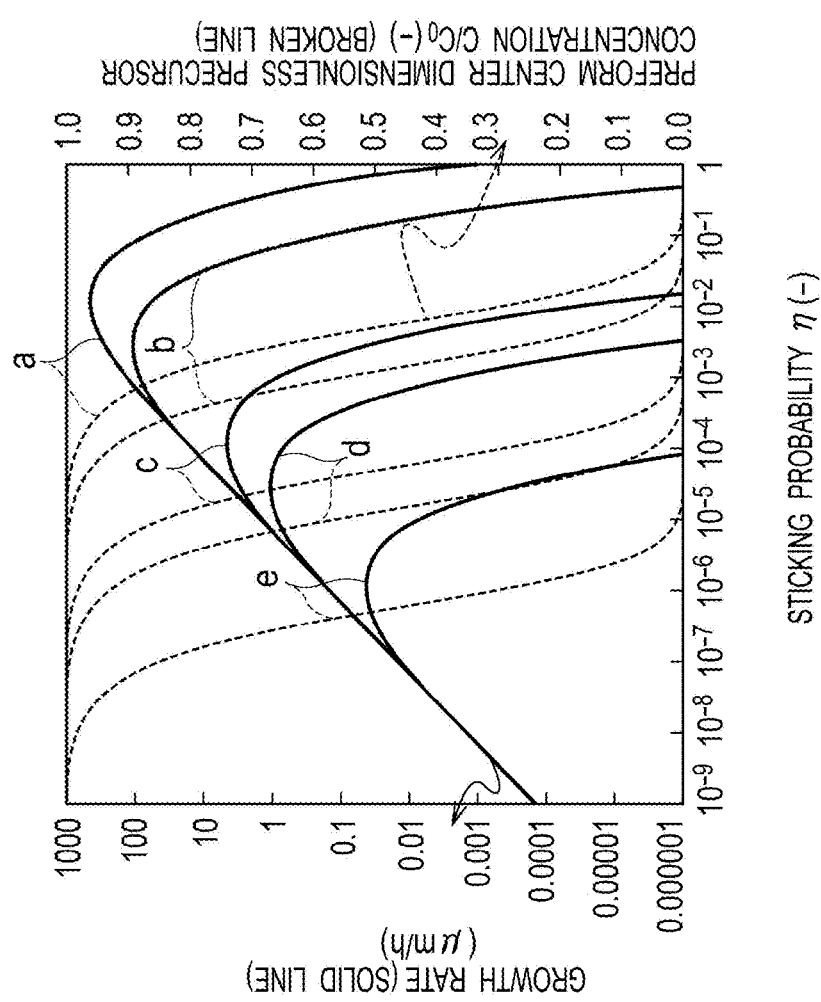
FIG. 12A is a graph illustrating dependencies of the growth rate and the precursor concentration $C/C_0$ on the sticking probability $\eta$ in the center of the macrostructure.

FIG. 12A illustrates a relationship between the growth rate and precursor concentration distribution ($C/C_0$) estimated where the growth temperature is 1000° C., the total pressure is 10 Torr, and the partial pressure of growth species is 1 Torr. The relationship is shown at various values of the sticking probability $\eta$ from $10^{-9}$ to 1 and various values of the thickness of the macrostructure (representative length) L from 0.5 to 50 mm. Curves a to e correspond to values of the thickness L of 0.5, 1, 5, 10, and 50 mm, respectively.

As apparent from the comparison between dashed lines (the concentration of the diffusing precursor in the center of the macrostructure; on the right axis) in FIG. 12A and solid lines (growth rate in the center of the macrostructure; on the left axis), there is an optimal value of the sticking probability that maximizes the growth rate in the center of the macrostructure. The sticking probability that maximizes the growth rate in the center of the macrostructure is obtained under such conditions that the precursor infiltration concentration $C/C_0$ is about 0.25 in the center of the macrostructure. As estimated above, in terms of integration of silicon carbide fibers in a fiber bundle in the center of the preform, the difference in precursor concentration is tolerated up to 650 times (650 µm:1 µm). Accordingly, the numeral 0.25 of $C/C_0$ is perfectly acceptable. $C/C_0$ may be therefore in a range including 0.25, in a range from 0.2 to 0.3, or in a range from 0.24 to 0.26.

FIG. 12B illustrates comparison of the sticking probability that maximizes the growth rate in the center of the macrostructure. Curves a to c in FIG. 12B correspond to values of the total pressure of 1, 10, and 100 Torr, respectively. As the total pressure increases, the molecular diffusion constant (proportional to 1/P) decreases, and the sticking probability that maximizes the growth rate therefore needs to be low.

(Integration of Fiber Bundles)

Diffusion Between Fiber Bundles after Filling Gaps Between Silicon Carbide Fibers The above consideration is given on the infiltration process to integrate silicon carbide fibers in each fiber bundle in the preform (macrostructure). Supposing that each fiber bundle is completely filled with silicon carbide, it is necessary to consider the infiltration process to integrate fiber bundles.

As apparent from the cross-sectional SEM image of the fiber bundles of SiC/SiC-CMC illustrated in FIG. 2B, film of silicon carbide is formed on the surfaces of fiber bundles to several tens micrometers (hereinafter, which is assumed to be 10 µm) to integrate the fiber bundles. The important thing is that the S/V ratio in terms of space between fiber bundles is smaller than that in terms of space between silicon carbide fibers. In the process of infiltration between fiber bundles, the precursor is more likely to diffuse because of the small reaction surface. The specific calculation results are shown below.

As shown in Equation 6, the S/V ratio [1/m] of a unit cell between silicon carbide fibers is expressed by Equation 30:

$$\frac{S}{V} = \frac{2\pi R}{d^2 - \pi R^2} \quad [\text{Equation 30}]$$

The S/V ratio (between fibers) is calculated to be $7.4 \times 10^5$ [1/m] when the fiber radius R is 5 μm and the distance d between silicon carbide fibers is 11 μm.

Figure 13A:
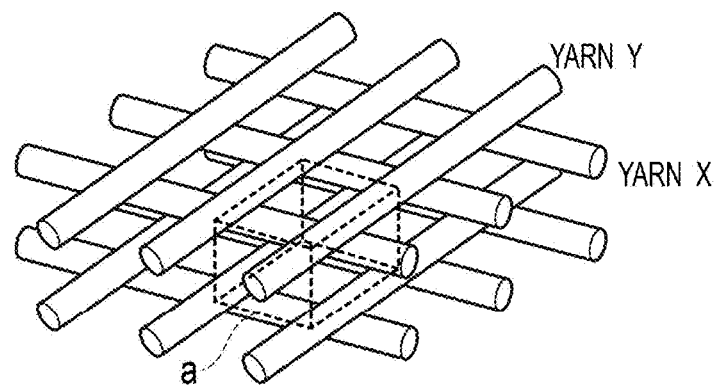
FIGS. 13A to 13C are schematic diagrams illustrating a unit cell of fiber bundles of the yarns X and Y.
Figure 13B:
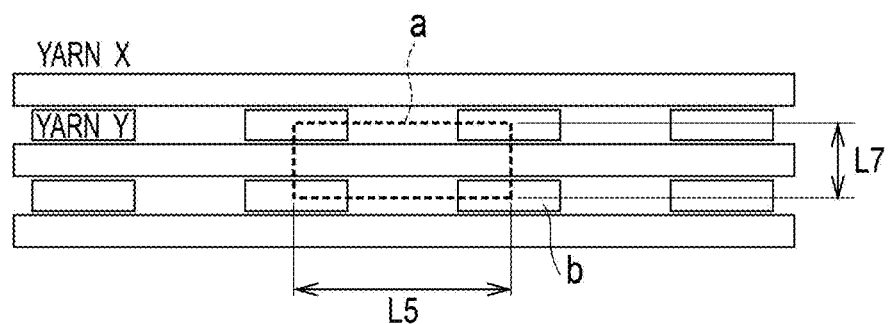
Figure 13C:
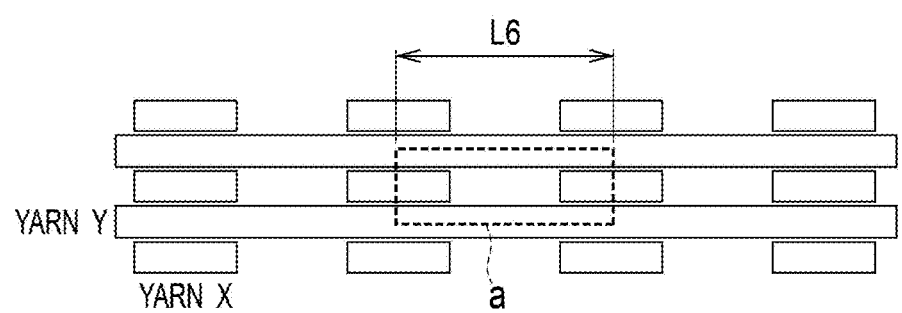

A diffusion model between fiber bundles is considered. FIGS. 13A to 13C illustrate a unit cell a of fiber bundles (yarns X and Y). The yarns X and Y are arranged at regular intervals, and there is a 10 μm gap between each yarn X and the adjacent yarns Y. In FIGS. 13A to 13C, lengths $L_5$, $L_6$, and $L_7$ are 3, 4, and 0.4 mm, respectively. The fiber bundles in the unit cell include two fiber bundles in total (one yarn X and one yarn Y). With reference to the cross-sectional SEM photograph of FIG. 2B, the cross-sectional dimensions of each fiber bundle (yarns X and Y) are assumed to be 0.2 mm×1.5 mm.

In this case, the S/V ratio is $5.7 \times 10^3$ [1/m] because S=(3 mm×1.5 mm×2+3 mm×0.2 mm×2)×2 fibers=20.4 mm$^2$ and V=3 mm×3 mm×0.4 mm=3.6 mm$^3$. In other words, the S/V ratio between silicon carbide fibers is about 130 times the S/V ratio between fiber bundles after each fiber bundle is filled. This means that even if the sticking probability in the Thiele modulus of Equation 4 increases by two orders of magnitude, equal infiltration can be implemented.

FIGS. 14A to 14C illustrate the precursor concentration distribution in the macrostructure at a temperature of 1000° C. and a total pressure of 10 Torr. In FIGS. 14A to 14C, the length L of the macrostructure (preform) is 1, 5, and 10 mm, respectively. Curves a to e in FIGS. 14a to 14C correspond to values of the sticking probability of 1, $10^{-1}$, $10^{-2}$, $10^{-3}$, and $10^{-4}$, respectively.

As discussed in FIG. 9, in the case of integrating the fiber bundles, the difference in film thickness between in the surface of the preform through which the diffusing precursor enters and in the center of the preform is tolerated up to 65 times. Accordingly, the fiber bundles can be integrated before the surface of the preform in which the diffusing precursor enters is filled with the precursor if the sticking probability satisfies: $\eta<1$ at L=1 mm, $\eta<10^1$ at L=5 mm, and $\eta<1$ at L=10 mm.

Precursor Diffusion and Growth Rate Distribution in Preform (Integration of Fiber Bundles)

In a similar manner to integration of silicon carbide fibers, there is an optimal sticking probability that maximizes the growth rate in the center of the preform in integration of fiber bundles. FIG. 15A illustrates the dependency of the growth rate and precursor concentration ($C/C_0$) on the sticking probability η at a temperature of 1000° C. and a total pressure of 10 Torr. Curves a to e in FIG. 15A correspond to values of the thickness L of 0.5, 1, 5, 10, and 50 mm, respectively. FIG. 15A illustrates that the sticking probability that maximizes the growth rate in the center of the preform allows the precursor to diffuse to a precursor concentration $C/C_0$ of 0.25 in the center of the preform. Accordingly, $C/C_0$ may be in a range including 0.25, in a range from 0.2 to 0.3, or in a range from 0.24 to 0.26. FIG. 15B shows comparison of the dependency of the optimal sticking probability on the thickness of the preform. Curves a to c in FIG. 15B correspond to values of the total pressure of 1, 10, and 100 Torr, respectively.

[Conclusion]

The diffusion of the precursor and growth phenomenon in the preform can be defined by the Thiele modulus by modeling the profile of the preform and solving the diffusion equation. In other words, uniformity of film silicon carbide formed in the preform can be determined by the balance between the diffusion constant D of the precursor, the representative length L (arrangement of silicon carbide fibers, and the reaction rate constant k. The representative length L (arrangement of silicon carbide fibers is determined by the dimensions of the preform and does not have flexibility. The diffusion constant D of the precursor can be controlled with temperature or pressure, but the diffusion constant D has a very low flexibility in design because there are optimal values in the growth conditions for chemical vapor infiltration using a gas mixture of MTS and hydrogen to form film of silicon carbide. On the other hand, the reaction rate constant k can be designed by varying the growth temperature and growth spices and has a comparatively high flexibility. The reaction rate constant k is the only factor that can control the precursor diffusion and growth phenomenon.

There are 1 to 2 μm gaps between silicon carbide fibers in each fiber bundle, and the diffusion between silicon carbide fibers needs to be considered as Knudsen diffusion under the growth conditions (900 to 1000° C., 1 to 760 Torr) normally used. On the other hand, in terms of the whole preform, gaps in the order of millimeter penetrate in the direction of yarns Z in the fiber bundle woven fabric, and molecular diffusion is dominant.

As described above, the relationship between the sticking probability η, the thickness L of the macrostructure (preform), and the growth rate is specifically calculated by re-expressing the reaction rate constant k with the sticking probability η and modeling the distribution of silicon carbide fibers and fiber bundles in the preform. Chemical vapor infiltration includes the process to integrate silicon carbide fibers and the process to integrate fiber bundles, which are considered separately.

In the process to integrate silicon carbide fibers in each fiber bundle, it is necessary to fill gaps between the fibers completely and uniformly. When the thickness of the preform is 0.2 mm, the sticking probability needs to be not more than $10^{-5}$. On the other hand, in terms of the whole preform, there are gaps in the order of millimeter that penetrate in the direction of yarns Z, and it is revealed that of the precursor concentration is allowed to be distributed unless the gaps are obstructed. The aforementioned estimation shows that there is an optimal sticking probability that enables the precursor to diffuse sufficiently to the center of the macrostructure (preform) and maximizes the growth rate and reveals in both of the process to integrate silicon carbide fibers and the process to integrate fiber bundles. It is therefore revealed that film formation needs to be performed with the optimal sticking probability.

The control device used in the embodiment can be easily implemented by causing a commercially-available microcontroller to execute predetermined instructions. Alternatively, the control device can be implemented by causing a general-purpose personal computer to execute a predetermined program.

In this embodiment, the precursor gas is methyltrichlorosilane (MTS, $CH_3SiCl_3$) by way of example. The precursor gas may further include tetramethylsilane (TMS, $(CH_3)_4Si$), dimethyldichlorosilane ($C_2H_6Cl_2Si$, DDS), trimethylchlorosilane ($C_3H_9SiCl$), silicon tetrachloride ($SiCl_4$), silane ($SiH_4$), propane ($C_3H_8$), and the like.

The precursor gas may include different types of precursor gas in the step of integrating fibers and the step of integrating fiber bundles. For example, the precursor gas in the step of integrating fibers may contain methyltrichlorosilane while the precursor gas in the step of integrating fiber bundles contains at least one of dimethyldichlorosilane, tetramethylsilane, and trimethylchlorosilane. By using a precursor gas suitable for each step as described above, quick film formation and uniform filling properties can be further improved.

The additive gas is hydrochloride by way of example in the aforementioned embodiment but can be gas including molecules containing chlorine as follows: monochloromonomethylsilane ($CH_3SiH_2Cl$), methyldichlorosilane ($CH_3SiHCl_2$), methyltrichlorosilane (MTS, $CH_3SiCl_3$), dimethylmonochlorosilane ($(CH_3)_2SiHCl$), dimethyldichlorosilane (DDS, $(CH_3)_2SiCl_2$)), trimethylmonochlorosilane ($(CH_3)_3SiCl$), monochlorosilane ($SiH_3Cl$), dichlorosilane ($SiH_2Cl_2$), trichlorosilane ($SiHCl_3$), tetrachlorosilane ($SiHCl_4$), chlorodisilane ($Si_2H_5Cl$), dichlorodisilane ($SiH_4Cl_2$), hexachlorodisilane ($Si_2Cl_6$), octachlorotrisilane ($Si_3Cl_8$), monochloromethane ($CH_3Cl$), dichloromethane ($CH_2Cl_2$), chloroform ($CHCl_3$), tetrachloromethane ($CCl_4$), monochloroacetylene ($C_2HCl$), dichloroacetylene ($C_2Cl_2$), monochloroethylene ($C_2H_3Cl$), dichloroethylene ($C_2H_2Cl_2$), trichloroethylene ($C_2HCl_3$), tetrachloroethylene ($C_2Cl_4$), monochloroethane ($C_2H_5Cl$), dichloroethane ($C_2H_4Cl_2$), trichloroethane ($C_2H_3Cl_3$), tetrachloroethane ($C_2H_2Cl_4$), pentachloroethane ($C_2HCl_5$), hexachloroethane ($C_2Cl_6$), monochloropropane ($C_3H_7Cl$), dichloropropane ($C_3H_6Cl_2$), trichloropropane ($C_3H_5Cl_3$), tetrachloropropane ($C_3H_4Cl_4$), pentachloropropane ($C_3H_3Cl_5$), hexachloropropane ($C_2H_2Cl_6$), heptachloropropane ($C_3H_1Cl_7$), octachloropropane ($C_3Cl_8$), and chlorine molecules ($Cl_2$).

The aforementioned molecules containing chlorine provide molecules containing chlorine that are adsorbed on the surfaces of microstructures of the preform 100. The molecules containing chlorine that are adsorbed on the surfaces of microstructures reduces the probability that the growth species stick to the microstructures, ensuring the filling uniformity at film formation.

The carrier gas is not limited to hydrogen ($H_2$) and helium (He) and may also include nitrogen ($N_2$) or noble gas such as argon (Ar).

The preform 100 having microstructures on which silicon carbide is deposited to form film can include a preform of ceramic fibers, a preform of carbon fibers, a substrate having a surface provided with trenches, or porous ceramics.

EXAMPLE 1

(Optimization of Chemical Vapor Infiltration)

As an example to which the aforementioned embodiment is applied, chemical vapor infiltration to form film of silicon carbide is further optimized.

Index of Optimization

The index to determine the range of conditions for optimization includes the following steps.

1) Determine the structure of the preform to be optimized and necessary target values 2) Determine the tolerance of the growth conditions based on the findings obtained in the embodiment concerning homogenization of the growth rate distribution in the furnace of the chemical vapor infiltration device, an increase in yield of the precursor, and reduction or elimination of by-products included in exhaust gas 3) Show the results of using the effects of the embodiment in optimization with an increase in degree of infiltration and reduction of time for forming film of silicon carbide set as indices.

Setting of Target Value

First, the structure of the preform to be optimized is determined, and necessary target values are determined.

<Preform Structure>

With reference to the real dimensions estimated from the SEM image of FIG. 2B, the structure example of the preform is determined. By using the model of integration of silicon carbide fibers illustrated in FIG. 5, the fiber radius R is set to 5 μm, and the distance d between fibers is set to 11 μm. With reference to using the model of integration of fiber bundles (yarns X and Y) in FIG. 13, the cross-sectional dimensions of fiber bundles are 0.2 mm×1.5 mm, and the thickness (representative length) L of the preform is 10 mm.

<Target Values of Degree of Infiltration and Growth Rate>

The target value of growth time by the process of chemical vapor infiltration is set to not more than 50 hours in total. This target value is half the current growth time or less. The process of chemical vapor infiltration has two roles of integrating silicon carbide fibers and integrating fiber bundles. It is necessary to perform these two processes within 50 hours in total.

Integration of Silicon Carbide Fibers

To integrate silicon carbide fibers, it is necessary to form at least 0.5 μm-thick film on fibers when the fiber radius R is 5 μm and the distance d between centers of fibers is 11 μm. When the target value of growth time is set to 25 hours, the growth rate needs to be at least 0.02 μm/h, which is the target value to optimize film formation between silicon carbide fibers.

Integration of Fiber Bundles

To integrate fiber bundles, it is necessary to form at least 5 μm-thick film on the fiber bundles when the gap between the fiber bundles is 10 μm. When the target value of growth time is set to 25 hours, the growth rate needs to be at least 0.2 μm/h. This is the target value to optimize film formation between fiber bundles.

Tolerant Range of Growth Conditions

The tolerant range of the growth conditions is determined based on the condition ranges obtained by experiments and the like and the findings obtained by the embodiment concerning homogenization of the growth rate distribution in the furnace of the device for chemical vapor infiltration.

Growth Temperature

The findings of Example 1 are based on the results of experiments at a growth temperature of 900 to 1000° C. The tolerant range of growth temperature is set to a range from 900 to 1000° C.

Total Pressure, Partial Pressure

At making the preform uniform, the diffusion constant is proportional to $T^{1.5}P^{-1}$ (molecular diffusion) and is higher at lower pressure and higher temperature. From the viewpoint of the growth rate, the higher the total pressure, the higher the concentration can be. Therefore, the total pressure may be higher. The balance therebetween needs to be optimized based on discussion for the preform.

Diffusion into Preform

In the embodiment, it is assumed that there are at least two types of growth species: growth species 1 is a low sticking probability species (candidate: $C_2H_2$) and growth species 2 is high sticking probability species (candidate: $CH_3$). The orders of the sticking probabilities of growth species 1 and 2 ($\eta_1$, $\eta_2$) are about $10^{-3}$ and 0.1 in film formation at 1000° C., respectively. When there are two types of growth species having very different sticking probabilities, the two types of growth species have different characteristics of diffusing into microstructures and macrostructure of the preform including woven fiber bundles like the model illustrated in FIG. 13, which is necessary to be cleared.

When the sticking probability is not less than $10^{-5}$ like the embodiment, the precursor concentration $C/C_0$ in each fiber bundle (0.2 mm thick) has a distribution. The precursor concentration distribution $C/C_0$ in a fiber bundle illustrated in FIG. 8 is illustrated again in FIG. 16A. The curves a to f in FIG. 16A correspond to values of the sticking probability $\eta$ of 1, $10^{-1}$, $10^{-2}$, $10^{-3}$, $10^{-4}$, and $10^{-5}$, respectively. The fact that the precursor does not reach the center of the fiber bundle (X=0 mm) when the sticking probability is not $10^{-5}$ means that the fiber surface area effectively working on spending of the precursor in the fiber bundles is reduced. It is therefore quantitatively understood that the precursor is spent on the fiber surfaces in the outer circumference of each fiber bundle and cannot uniformly distribute into the fiber bundles and the precursor is therefore not spent within the fiber bundles.

This ratio is called an effective surface area coefficient $\alpha$ ($0 \leq \alpha \leq 1$). The effective surface area coefficient $\alpha$ can be obtained by calculating the area of the curve in FIG. 16A. To be specific, Equation 31 is integrated as a function of x in a range from $-L/2$ to $+L/2$ (X is assumed to be 0 mm at the center of a fiber bundle), and the integral is divided by $1/L$ to be standardized.

$$\frac{C}{C_0} = \frac{\cosh\left(h\frac{x}{0.5 L}\right)}{\cosh(h)} \quad \text{[Equation 31]}$$

The integration of Equation 31 is as flows:

$$\alpha = \frac{1}{L}\int_{-L/2}^{L/2} \frac{C}{C_0} dx \quad \text{[Equation 32]}$$

$$= \frac{1}{L\cosh(h)}\int_{-L/2}^{L/2} \cosh\left(h\frac{x}{0.5 L}\right) dx$$

$$= \frac{1}{L\cosh(h)} \frac{0.5 L}{h} \left[\sinh\left(h\frac{x}{0.5 L}\right)\right]_{-L/2}^{L/2}$$

$$= \frac{1}{2h\cosh(h)}(\sinh(h)\sinh(-h))$$

$$= \frac{\sinh(h)}{h\cosh(h)}$$

$$= \frac{\tanh(h)}{h}$$

Herein, the Thiele modulus h has the following relationship with the velocity constant $k_v$ [1/s]

$$h = \frac{L}{2}\sqrt{\frac{k_v}{D_k}} \quad \text{[Equation 33]}$$

$$k_v = k_s \times \frac{S}{V} = \frac{1}{4}v\eta \times \frac{S}{V} \quad \text{[Equation 34]}$$

The effective surface area coefficient $\alpha$ is calculated easily as described above. The Knudsen diffusion constant $D_k$ is expressed by:

$$\frac{1}{3}vL' \quad \text{[Equation 35]}$$

L' is 1 μm gap between silicon carbide fibers.

Figure 16A:
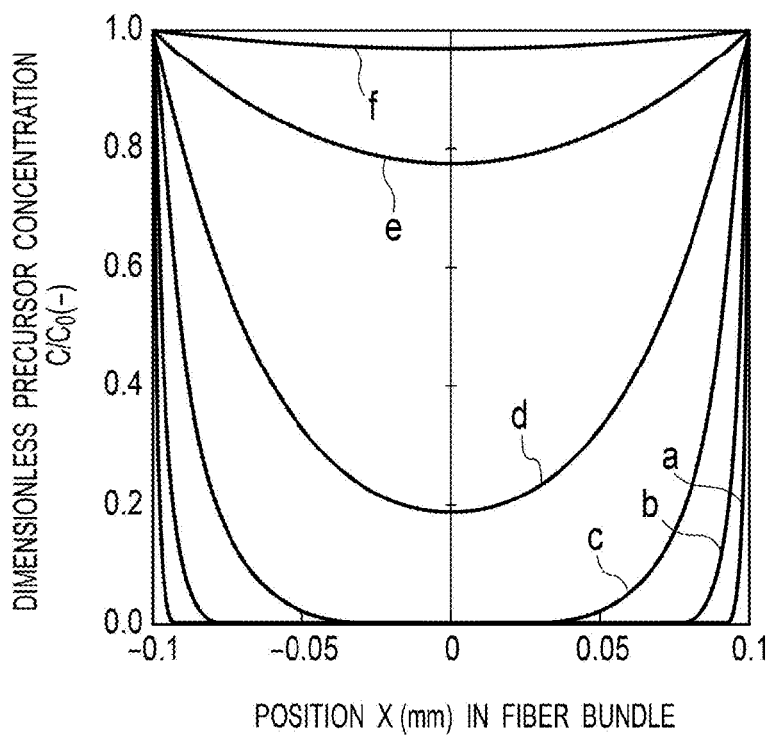
FIGS. 16A and 16B are graphs illustrating the relationship between an effective surface area coefficient $\alpha$ and the sticking probability in terms of the precursor concentration $C/C_0$ in a fiber bundle.
Figure 16B:
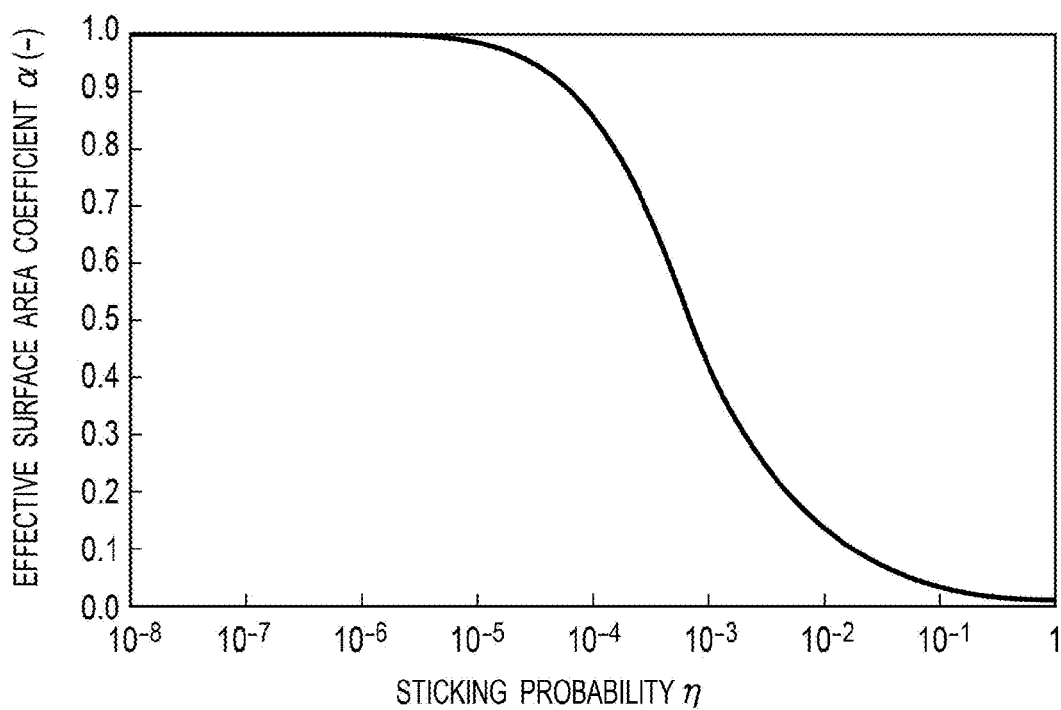
Figure 17A:
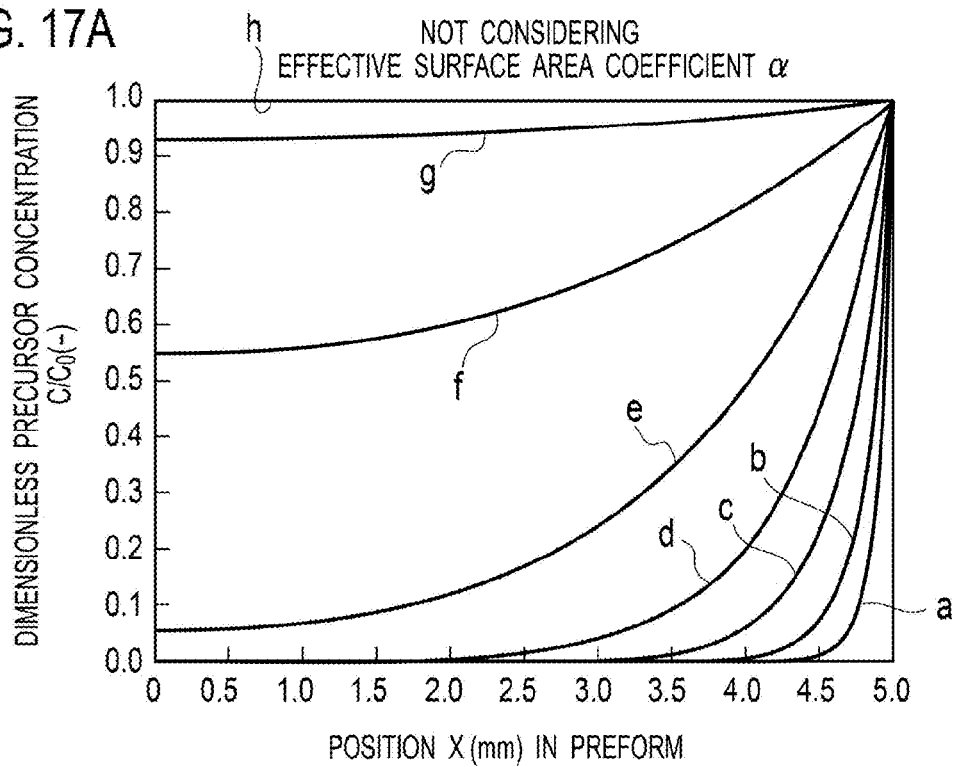
FIGS. 17A and 17B are graphs illustrating the difference in precursor concentration $C/C_0$ in the preform depending on whether the effective surface area coefficient $\alpha$ is taken into account in the Thiele modulus.
Figure 17B:
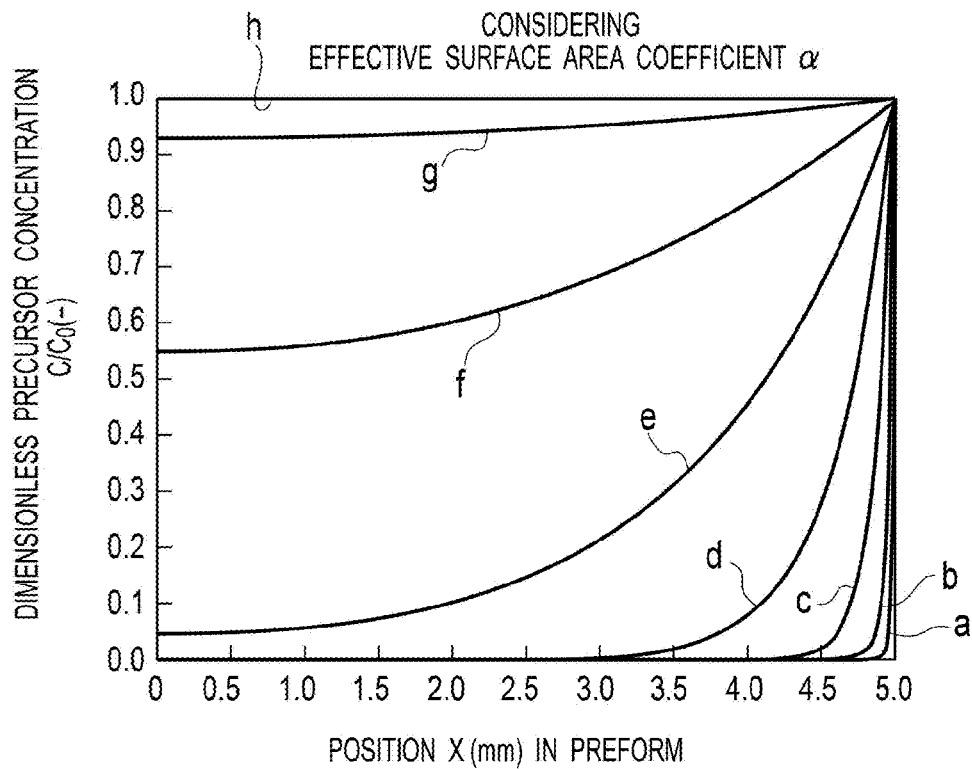
Figure 18A:
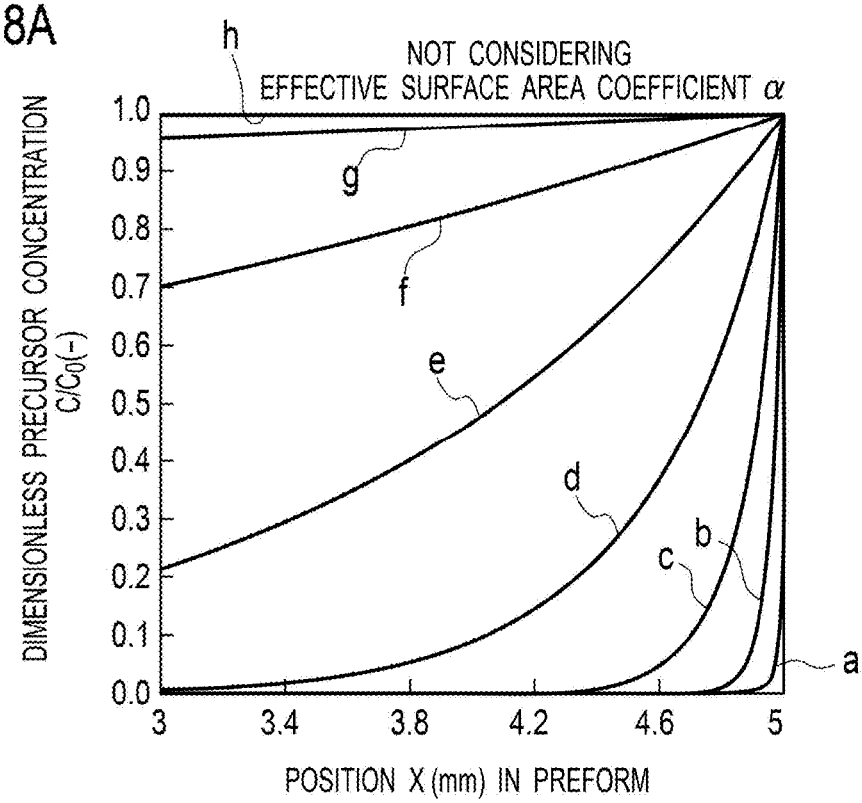
FIGS. 18A and 18B are graphs illustrating the difference in precursor density $C/C_0$ in the preform depending on whether the effective surface area coefficient $\alpha$ is taken into account in the Thiele modulus.
Figure 18B:
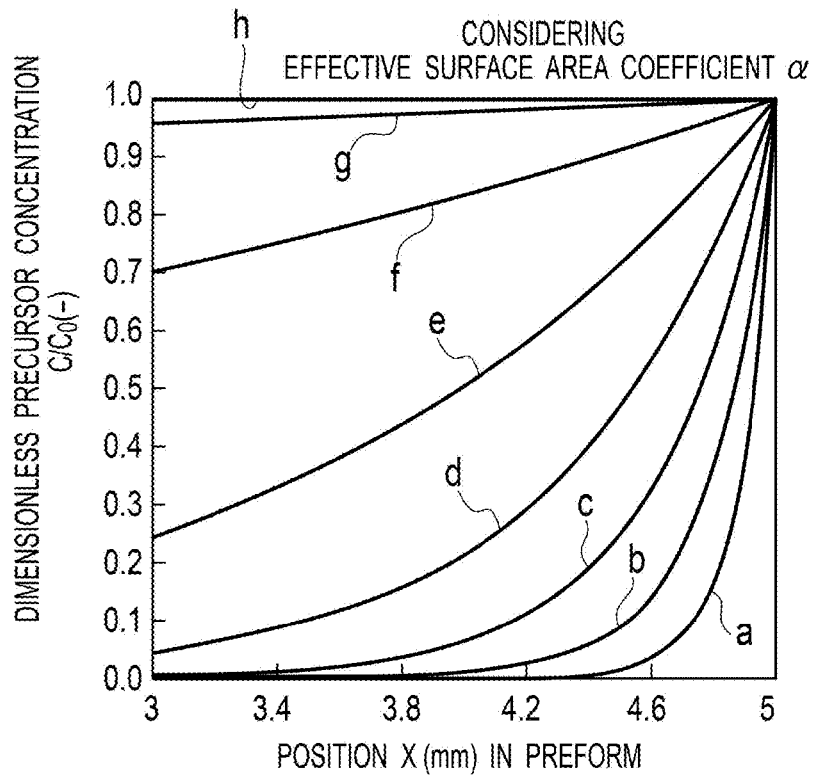

FIG. 16B illustrates the effective surface area coefficient $\alpha$ where the length L is 0.2 mm, the fiber radius R is 5 μm, the distance d between the centers of fibers is 11 μm, the temperature is 1000° C., and the molecular weight is 0.026 kg/mol ($C_2H$). When the sticking possibility is 1.0, for example, it is estimated that only 0.013 (1.3%) of the surface area of 1 (100%) of silicon carbide fibers in a fiber bundle works effectively.

The reaction rate constant $k_v$ [1/s] in Equation 4 of the Thiele modulus 4 in the preform is obtained by multiplying the surface reaction rate constant $K_s$ [m/s](=1/4 $v\eta$) by the S/V ratio [1/m] (s [$m^2$]: the surface area of silicon carbide fibers, V [$m^3$]: spatial volume other than silicon carbide fibers).

$$h = \frac{L}{2}\sqrt{\frac{k_v}{D_m}} \quad \text{[Equation 36]}$$

In terms of diffusion of the precursor in the preform including fiber bundles laid on each other, it is necessary to multiply S of the S/V ratio by the effective surface area coefficient $\alpha$ for calculation in an overlapped manner. In this case, the ratio of the precursor that penetrates into the preform is increased when the sticking probability is not less than $10^{-5}$.

The precursor concentration distribution $C/C_0$ in the preform is expressed by substituting Equations 32 and 33 in Equation 31. Herein, it should be noted that the molecular diffusion coefficient $D_m$ is used for diffusion in the preform and the Knudsen diffusion coefficient $D_k$ is used for the effective surface area coefficient $\alpha$, which is considered in fiber bundles.

$$\frac{C}{C_0} = \frac{\cosh\left(h\frac{x}{0.5 L}\right)}{\cosh(h)} = \frac{\cosh\left(h\sqrt{\frac{k_v}{D_m}} x\right)}{\cosh\left(\frac{L}{2}\sqrt{\frac{k_v}{D_m}}\right)} = \quad \text{[Equation 37]}$$

-continued $$\frac{\cosh\left(\sqrt{\frac{k_s S \alpha}{D_m V}} x\right)}{\cosh\left(\frac{L}{2}\sqrt{\frac{k_s S \alpha}{D_m V}}\right)} = \frac{\cosh\left(\sqrt{\frac{k_s S \tanh(h)}{D_m V h}} x\right)}{\cosh\left(\frac{L}{2}\sqrt{\frac{k_s S \tanh(h)}{D_m V h}}\right)} = \frac{\cosh\left(\sqrt{\frac{k_s S \tanh\left(\frac{L}{2}\sqrt{\frac{k_v}{D_k}}\right)}{D_m V \frac{L}{2}\sqrt{\frac{k_v}{D_k}}}} x\right)}{\cosh\left(\frac{L}{2}\sqrt{\frac{k_s S \tanh\left(\frac{L}{2}\sqrt{\frac{k_v}{D_k}}\right)}{D_m V \frac{L}{2}\sqrt{\frac{k_v}{D_k}}}}\right)} =$$

$$\frac{\cosh\left(\sqrt{\frac{2 k_s S \tanh\left(\frac{L}{2}\sqrt{\frac{S k_s}{V D_k}}\right)}{D_m V L \sqrt{\frac{S k_s}{V D_k}}}} x\right)}{\cosh\left(\frac{L}{2}\sqrt{\frac{2 k_s S \tanh\left(\frac{L}{2}\sqrt{\frac{S k_s}{V D_k}}\right)}{D_m V L \sqrt{\frac{S k_s}{V D_k}}}}\right)} = \frac{\cosh\left(\sqrt{\frac{2 k_s S \tanh\left(\frac{L}{2}\sqrt{\frac{3 S k_s}{V v L'}}\right)}{D_m V L \sqrt{\frac{3 S k_s}{V v L'}}}} x\right)}{\cosh\left(\frac{L}{2}\sqrt{\frac{2 k_s S \tanh\left(\frac{L}{2}\sqrt{\frac{3 S k_s}{V v L'}}\right)}{D_m V L \sqrt{\frac{3 S k_s}{V v L'}}}}\right)} =$$

$$\frac{\cosh\left(\sqrt{\frac{2 k_s S \tanh\left(\frac{L}{2}\sqrt{\frac{3 S k_s}{V v L'}}\right)}{V L \sqrt{\frac{3 S k_s}{V v L'}}}} \frac{p \sigma_{1,2}^2 \Omega_D}{0.1883 \times 10^{-4}\sqrt{T^3 (M_{r,1} + M_{r,2})/M_{r,1} M_{r,2}}} x\right)}{\cosh\left(\frac{L}{2}\sqrt{\frac{2 k_s S \tanh\left(\frac{L}{2}\sqrt{\frac{3 S k_s}{V v L'}}\right)}{V L \sqrt{\frac{3 S k_s}{V v L'}}}} \frac{p \sigma_{1,2}^2 \Omega_D}{0.1883 \times 10^{-4}\sqrt{T^3 (M_{r,1} + M_{r,2})/M_{r,1} M_{r,2}}}\right)}$$

FIGS. 17A and 17B and FIGS. 18A and 18B (a partial enlarged view of FIGS. 17A and 17B) illustrate the difference in the precursor concentration distribution $C/C_0$ in the preform (the thickness L=10.0 mm) depending on whether or not the effective surface area coefficient α is taken into account. Curves a to h in FIG. 17A to 18B correspond to values of the sticking probability of 1, $10^{-1}$, $10^{-2}$, $10^{-3}$, $10^{-4}$, $10^{-5}$, $10^{-6}$, and $10^{-7}$, respectively. Taking into account the effective surface area coefficient α, when the sticking probability is higher than $10^{-5}$, the difference in the precursor concentration distribution $C/C_0$ is clearly differentiated as shown in the results of FIG. 16A.

Figure 3:
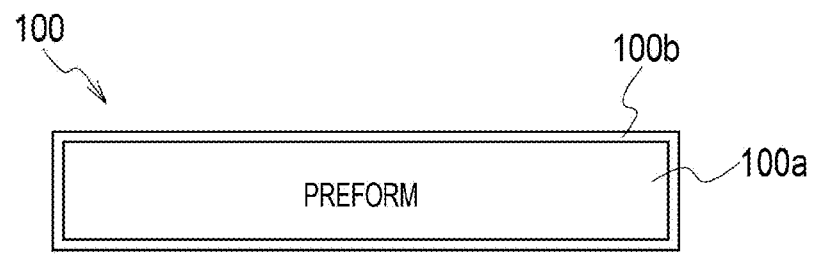
FIG. 3 is a conceptual diagram illustrating an influence of growth species with low sticking probability on the preform.

Consideration is given to the growth species 2 having a sticking probability of about 0.1. Without taking into account the effective surface area coefficient α, the precursor diffuses at a significant concentration ($C/C_0$) to only a distance of about 0.2 mm into the preform. On the other hand, in the case of taking into account the effective surface area coefficient α, the precursor exhibits a tendency of diffusing to a distance of about 1 mm. This simply means that the growth species 2 significantly exists within about 1 mm in the surface layer of the preform as illustrated in the conceptual diagram of FIG. 3 and the uniformity at film formation within the fiber bundles is degraded. This reveals the need for measures such as cutting and removing the 1 mm thick surface layer of the preform, which is a sparse region, after the process of chemical vapor infiltration is completed.

Optimal Conditions of Process to Integrate Silicon Carbide Fibers

Consideration is given to integration of silicon carbide fibers. In this embodiment, it is revealed that there is a sticking probability that maximizes the growth rate in the center of the preform. The growth rate equation taking into account the effective surface area coefficient α is obtained like Equation 38 by substituting Equations 32 and 34 in equation 29, $G_{[m/s]}(x) =$ [Equation 38]

$$\frac{M_{SiC[kg]}}{\rho_{SiC[kg/m^3]}} \frac{\eta_{growth\ species}}{\sqrt{2\pi \cdot M_{growth\ species}RT}} \times P_0 \frac{\cosh\left(\sqrt{\dfrac{\dfrac{\alpha \times S v_T \eta}{4V}}{\dfrac{p\sigma_{1,2}^2 \Omega_D}{0.1883 \times 10^{-4} \sqrt{T^3(M_{r,1}+M_{r,2})/M_{r,1}M_{r,2}}}}}\, x\right)}{\cosh\left(\dfrac{L}{2}\sqrt{\dfrac{\dfrac{\alpha \times S v_T \eta}{4V}}{\dfrac{p\sigma_{1,2}^2 \Omega_D}{0.1883 \times 10^{-4} \sqrt{T^3(M_{r,1}+M_{r,2})/M_{r,1}M_{r,2}}}}}\right)} =$$

$$\frac{M_{SiC[kg]}}{\rho_{SiC[kg/m^3]}} \frac{\eta_{growth\ species}}{\sqrt{2\pi \cdot M_{growth\ species}RT}} \times P_0$$

$$\frac{\cosh\left(\sqrt{\dfrac{\dfrac{S v_T \eta}{4V}\dfrac{\tanh(h)}{h}}{\dfrac{p\sigma_{1,2}^2 \Omega_D}{0.1883 \times 10^{-4}\sqrt{T^3(M_{r,1}+M_{r,2})/M_{r,1}M_{r,2}}}}}\, x\right)}{\cosh\left(\dfrac{L}{2}\sqrt{\dfrac{\dfrac{S v_T \eta}{4V}\dfrac{\tanh(h)}{h}}{\dfrac{p\sigma_{1,2}^2 \Omega_D}{0.1883 \times 10^{-4}\sqrt{T^3(M_{r,1}+M_{r,2})/M_{r,1}M_{r,2}}}}}\right)} =$$

$$\frac{M_{SiC[kg]}}{\rho_{SiC[kg/m^3]}} \frac{\eta_{growth\ species}}{\sqrt{2\pi \cdot M_{growth\ species}RT}} \times P_0$$

$$\frac{\cosh\left(\sqrt{\dfrac{\dfrac{S v_T \eta}{4V}\dfrac{2}{L}\sqrt{\dfrac{D_k}{k_v}}\tanh\left(\dfrac{2}{L}\sqrt{\dfrac{D_k}{k_v}}\right)}{\dfrac{p\sigma_{1,2}^2 \Omega_D}{0.1883 \times 10^{-4}\sqrt{T^3(M_{r,1}+M_{r,2})/M_{r,1}M_{r,2}}}}}\, x\right)}{\cosh\left(\dfrac{L}{2}\sqrt{\dfrac{\dfrac{S v_T \eta}{4V}\dfrac{2}{L}\sqrt{\dfrac{D_k}{k_v}}\tanh\left(\dfrac{2}{L}\sqrt{\dfrac{D_k}{k_v}}\right)}{\dfrac{p\sigma_{1,2}^2 \Omega_D}{0.1883 \times 10^{-4}\sqrt{T^3(M_{r,1}+M_{r,2})/M_{r,1}M_{r,2}}}}}\right)} = \frac{M_{SiC[kg]}}{\rho_{SiC[kg/m^3]}}$$

$$\frac{\eta_{growth\ species}}{\sqrt{2\pi \cdot M_{growth\ species}RT}} \times P_0 \frac{\cosh\left(\sqrt{\dfrac{\dfrac{S v_T \eta}{2VL}\sqrt{\dfrac{D_k}{k_sS/V}}\tanh\left(\dfrac{2}{L}\sqrt{\dfrac{k_sS/V}{D_k}}\right)}{\dfrac{p\sigma_{1,2}^2\Omega_D}{0.1883\times10^{-4}\sqrt{T^3(M_{r,1}+M_{r,2})/M_{r,1}M_{r,2}}}}}\, x\right)}{\cosh\left(\dfrac{L}{2}\sqrt{\dfrac{\dfrac{S v_T \eta L}{8V}\sqrt{\dfrac{D_k}{k_sS/V}}\tanh\left(\dfrac{2}{L}\sqrt{\dfrac{k_sS/V}{D_k}}\right)}{\dfrac{p\sigma_{1,2}^2\Omega_D}{0.1883\times10^{-4}\sqrt{T^3(M_{r,1}+M_{r,2})/M_{r,1}M_{r,2}}}}}\right)} =$$

$$\frac{M_{SiC[kg]}}{\rho_{SiC[kg/m^3]}} \frac{\eta_{growth\ species}}{\sqrt{2\pi \cdot M_{growth\ species}RT}} \times P_0$$

-continued $$\frac{\cosh\left(\sqrt{\dfrac{\dfrac{v_T\eta}{2L}\sqrt{\dfrac{SD_k}{k_sV}}\tanh\left(\dfrac{2}{L}\sqrt{\dfrac{k_sS}{D_kV}}\right)}{\dfrac{p\sigma_{1,2}^2\Omega_D}{0.1883\times 10^{-4}\sqrt{T^3(M_{r,1}+M_{r,2})/M_{r,1}M_{r,2}}}}\,x\right)}{\cosh\left(\dfrac{L}{2}\sqrt{\dfrac{\dfrac{v_T\eta L}{8}\sqrt{\dfrac{SD_k}{k_sV}}\tanh\left(\dfrac{2}{L}\sqrt{\dfrac{k_sS}{D_kV}}\right)}{\dfrac{p\sigma_{1,2}^2\Omega_D}{0.1883\times 10^{-4}\sqrt{T^3(M_{r,1}+M_{r,2})/M_{r,1}M_{r,2}}}}}\right)} = \frac{M_{SiC[kg]}}{\rho_{SiC[kg/m^3]}}$$

$$\frac{\eta_{growth\,species}}{\sqrt{2\pi\cdot M_{growth\,species}RT}} \times P_0 \frac{\cosh\left(\sqrt{\dfrac{\dfrac{v_T\eta}{2L}\sqrt{\dfrac{SvL'}{3k_sV}}\tanh\left(\dfrac{2}{L}\sqrt{\dfrac{3k_sS}{VL'v}}\right)}{\dfrac{p\sigma_{1,2}^2\Omega_D}{0.1883\times 10^{-4}\sqrt{T^3(M_{r,1}+M_{r,2})/M_{r,1}M_{r,2}}}}}\,x\right)}{\cosh\left(\sqrt{\dfrac{\dfrac{v_T\eta L}{8}\sqrt{\dfrac{SvL'}{3k_sV}}\tanh\left(\dfrac{2}{L}\sqrt{\dfrac{3k_sS}{VL'v}}\right)}{\dfrac{p\sigma_{1,2}^2\Omega_D}{0.1883\times 10^{-4}\sqrt{T^3(M_{r,1}+M_{r,2})/M_{r,1}M_{r,2}}}}}\right)}$$

Figure 19:
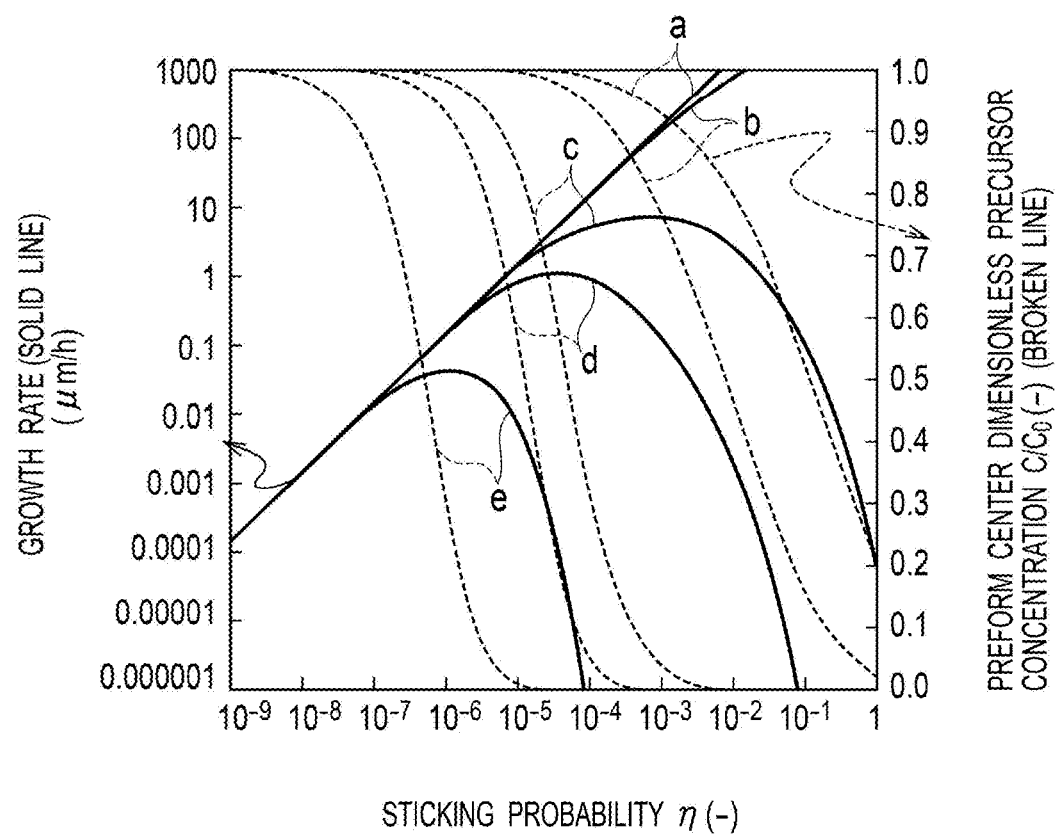
FIG. 19 is a graph illustrating the relationship between the sticking probability, the thickness of the preform, and the growth rate on silicon carbide fiber and precursor concentration distribution $C/C_0$ in the center of the preform, which are obtained by taking into account the effective surface area coefficient $\alpha$.

FIG. 19 illustrates the relationship taking the effective surface area coefficient α into account between the sticking probability, growth rate, and preform thickness (0.5 to 50 mm) in the center of the preform when the temperature is 1000° C., the total pressure is 10 Torr, and the partial pressure of the growth species is 1 Torr. Curves a to e in FIG. 19 correspond to values of the length L of 0.5, 1, 3, 10, and 50 mm, respectively. Compared with FIG. 12A not taking the effective surface area coefficient α, FIG. 19 shows a different tendency when the sticking probability is not less than $10^{-5}$.

Figure 20:
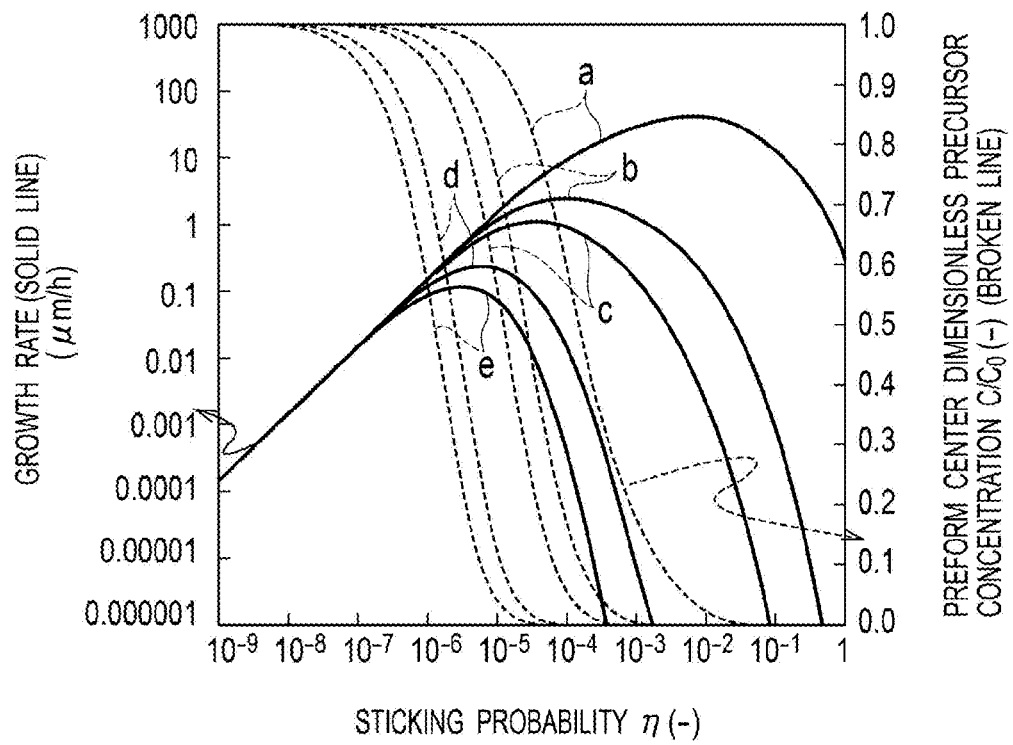
FIG. 20 is a graph illustrating the relationship between the sticking probability, the total pressure, and the growth rate on silicon carbide fiber and precursor concentration distribution $C/C_0$ in the center of the preform, which are obtained by taking into account the effective surface area coefficient $\alpha$.

FIG. 20 illustrates the relationship taking into account the effective surface area coefficient α between the sticking probability, growth rate, and total pressure in the center of the preform when the temperature is 1000° C., the preform thickness is 10 mm, and the partial pressure of the growth species is 1 Torr. Curves a to e in FIG. 20 correspond to values of the total pressure of 1, 5, 10, 50, and 100 Torr, respectively. As shown in Appendix 1 in the end of the specification, the lower limit of the sticking probability can be assumed to be about $10^{-4}$. Accordingly, the total pressure needs to be about 10 Torr based on FIG. 20.

As shown in Appendix 2, when the partial pressure of MTS is assumed to be 1, the ratio in partial pressure of the growth species 1 to MTS is 0.01 to 0.1. In this example, the ratio of the growth species 1/MTS is temporarily set to 0.1. The boundary of the ratio in partial pressure of $H_2$ to MTS is set in a range from 2 to 10 and is set to 2 in this example. The molar ratio of hydrogen to MTS may be in a range including 2, in a range from 1.5 to 2.5, or in a range from 1.9 to 2.1.

Figure 21:
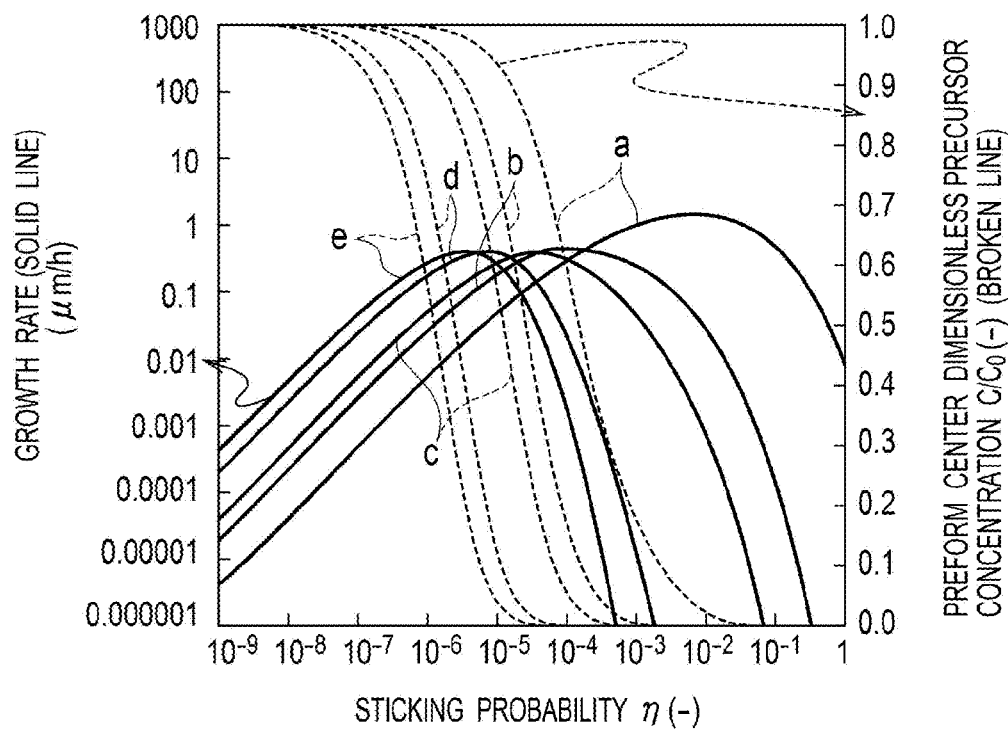
FIG. 21 is a graph illustrating the relationship between the sticking probability, the total pressure, and the growth rate on silicon carbide fiber and precursor concentration distribution $C/C_0$ in the center of the preform, when the effective surface area coefficient $\alpha$ is taken into account, the $H_2$/MTS ratio is 2, and the growth species 1/MTS ratio is 0.1.

FIG. 21 illustrates the results of re-calculating the results of FIG. 20 on the above-described assumption. FIG. 21 shows that the maximum value of the growth rate varies very little in a range of the total pressure from 5 to 100 Torr. However, the growth rate is increased when the total pressure is 1 Torr.

Since the lower limit of the sticking probability is about $10^{-4}$, to maximize the growth rate in the preform while improving the distribution within each fiber bundle, film formation needs to be performed at a growth temperature of 900° C. (the sticking probability is about $10^{-4}$), and the optimal condition for the total pressure is 5 Torr based on FIG. 21. Accordingly, the temperature may be in a range including 900° C., in a range from 800 to 1000° C., or in a range from 850 to 950° C. The total pressure may be in a range including 5 Torr, in a range from 4 to 6 Torr, or in a range from 4.5 to 5.5 Torr.

Figure 22A:
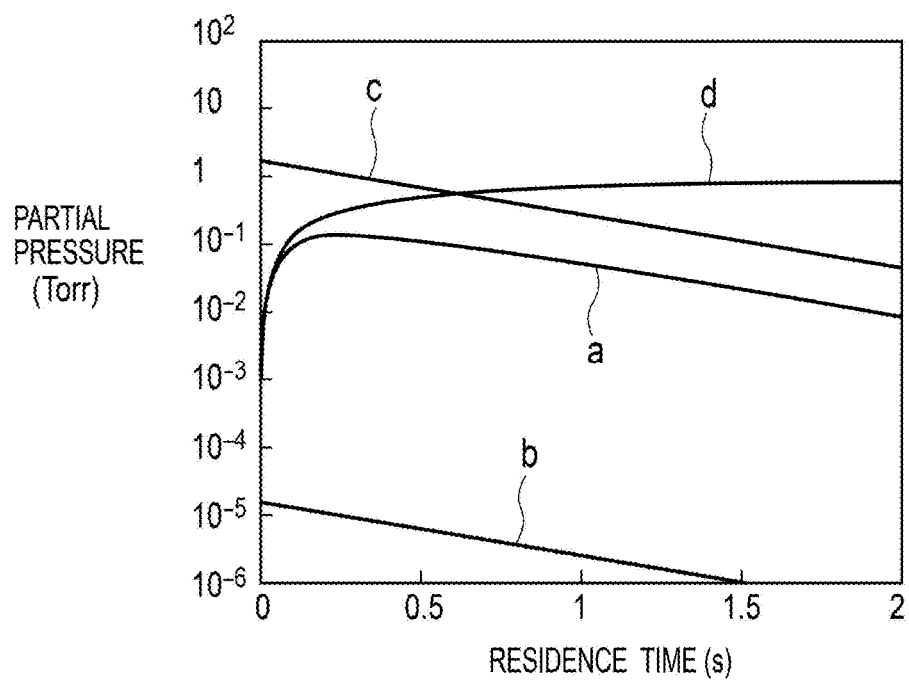
FIGS. 22A and 22B are graphs illustrating the vapor phase composition and growth rate distribution (growth rate in the center of the preform) calculated using an overall reaction model (etching effect) when the growth temperature is 900° C., the total pressure is 5 Torr, and the $H_2$/MTS ratio is 2.
Figure 22B:
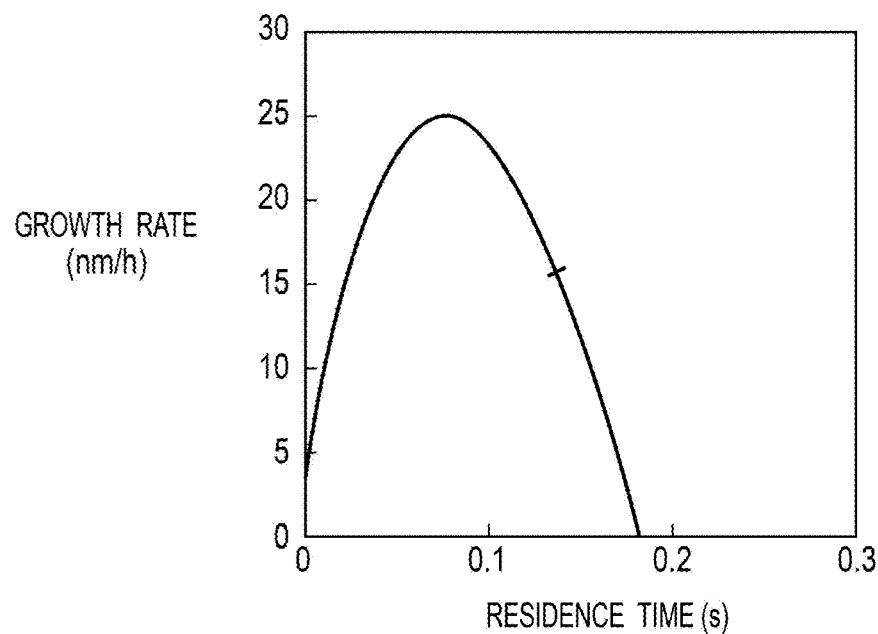

By applying the above conditions to an overall reaction model taking into account the etching effect shown in Appendix 3, the reaction rate constants at 900° C. are calculated to be $k_1$=0.81, $k_2$=0.0098, $k_3$=0.906, and $f_e$=6.4× $10^3$. Using the above reaction rate constants, the gas phase composition and growth rate distribution (growth rate in the center of the preform) are calculated and are illustrated in FIG. 22. The growth rate is calculated to be 0.025 μm at the maximum. In this case, it is estimated that the growth for 20 hours allows to form 0.5 μm-thick film necessary for integrating silicon carbide fibers.

Optimal Conditions for Process to Integrate Fiber Bundles

Figure 23:
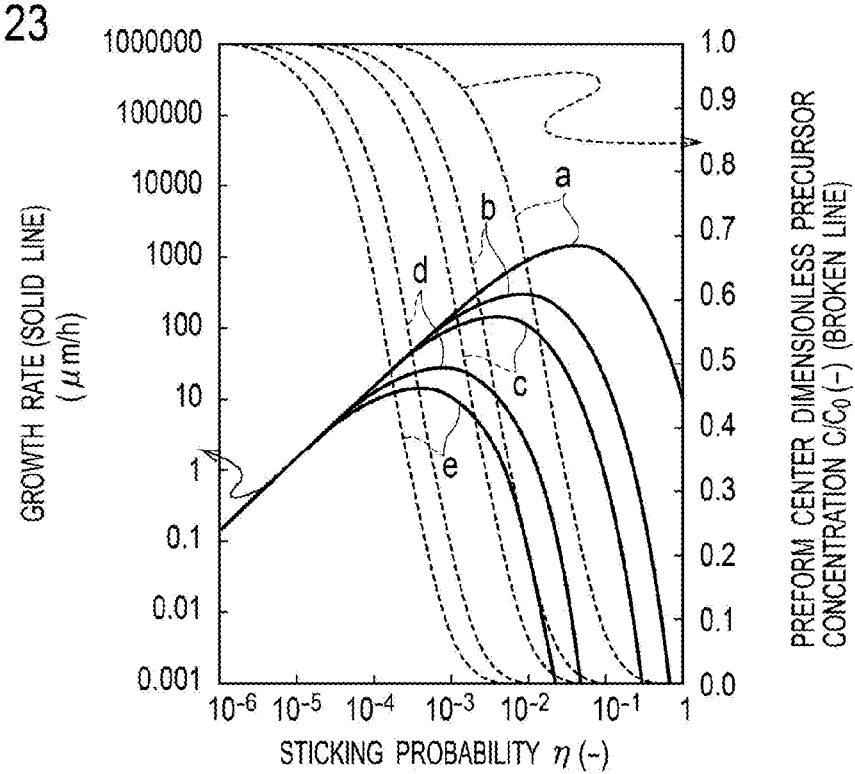
FIG. 23 is a graph illustrating the relationship between the sticking probability, the total pressure, and the growth rate on silicon carbide fibers and precursor concentration distribution $C/C_0$ in the center of the preform.

In a similar manner to integration of silicon carbide fibers, integration of fiber bundles is considered. Herein, the process to integrate fiber bundles is assumed to be performed after each fiber bundle is completely filled. For confirmation, the effective surface area coefficient is unnecessary in consideration of diffusion into the woven fabric structure including fiber bundles. FIG. 23 illustrates the relationship in the center of the preform between the growth rate on silicon carbide fibers, precursor concentration distribution $C/C_0$, sticking probability, and total pressure. Curves a to e in FIG. 23 correspond to values of the total pressure of 1, 5, 10, 50, and 100 Torr, respectively. The calculation conditions are as follows: the temperature is 1000° C., the preform thickness is 10 mm, and the partial pressure of the growth species is 1 Torr.

Figure 24:
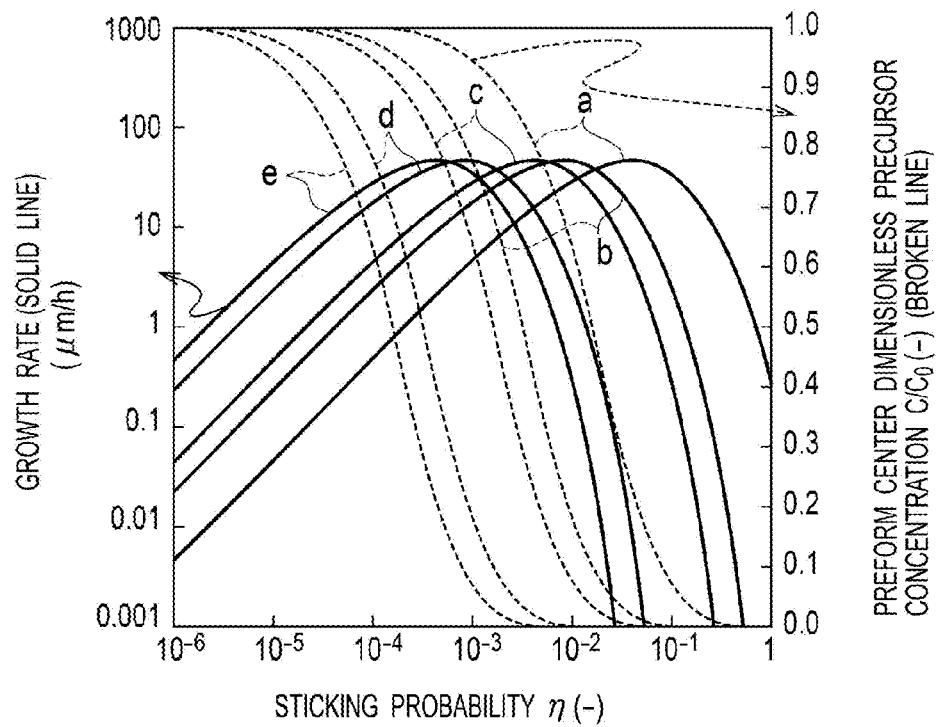
FIG. 24 is a graph illustrating the relationship between sticking probability, the total pressure, and growth rate on silicon carbide fiber and precursor concentration distribution $C/C_0$ in the center of the preform where the effective surface area coefficient α is taken into account, the $H_2$/MTS ratio is 2, and the growth species 1/MTS ratio is 0.1.

In a similar manner to the foregoing section, it is assumed that the ratio of the growth species 1 to MTS is set to 0.1 and the ratio of $H_2$ to MTS is set to 2. FIG. 24 shows the results of re-calculating the results of FIG. 23 based on the aforementioned assumption. Curves a to e in FIG. 23 correspond to values of the total pressure of 1, 5, 10, 50, and 100 Torr, respectively. FIG. 24 shows that the maximum value of the growth rate varies very little in a range of the total pressure from 1 to 100 Torr.

In order to maximize the growth rate in the preform while improving the distribution within each fiber bundle, since the lower limit of the sticking probability is about $10^{-4}$, the total pressure can take any value in a range from 1 to 100 Torr. If the sticking probability is set to the lower limit of $10^{-4}$ because of good uniformity within the preform, the optimal growth temperature is 900° C., and the optimal total pressure is about 100 Torr. Accordingly, the temperature may be in a range including 900° C., in a range from 800 to 1000° C., or in a range from 850 to 950° C. The total pressure may be in a range including 100 Torr, in a range from 5 to 110 Torr, or in a range from 5 to 105 Torr.

Figure 25A:
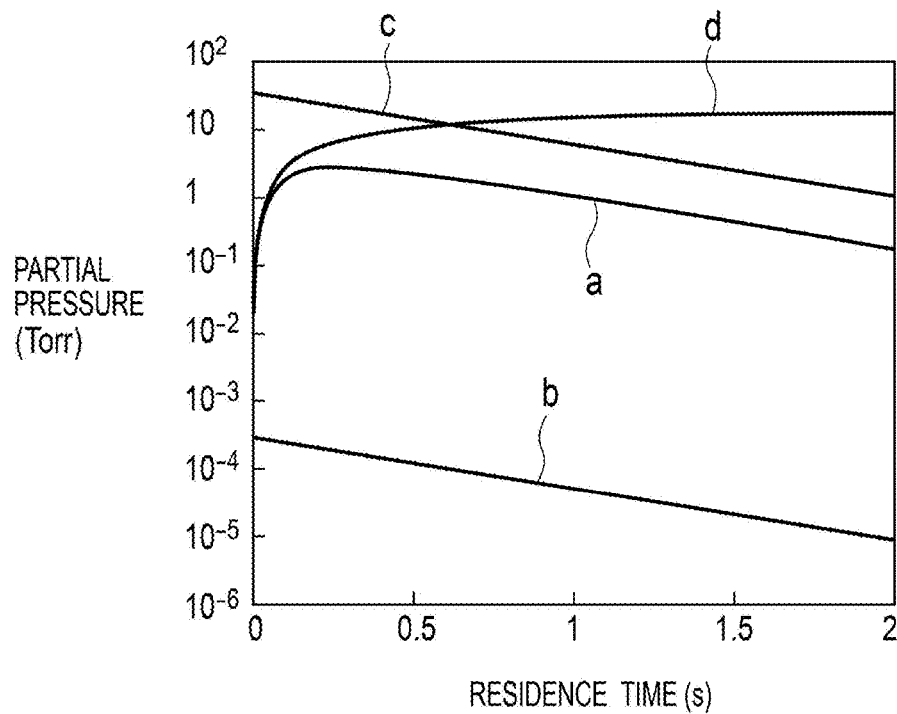
FIGS. 25A and 25B are graphs illustrating the vapor phase composition and growth rate distribution (growth rate in the center of the preform) calculated using the overall reaction model (etching effect) when the growth temperature is 900° C., the total pressure is 100 Torr, and the $H_2$/MTS ratio of 2.
Figure 25B:
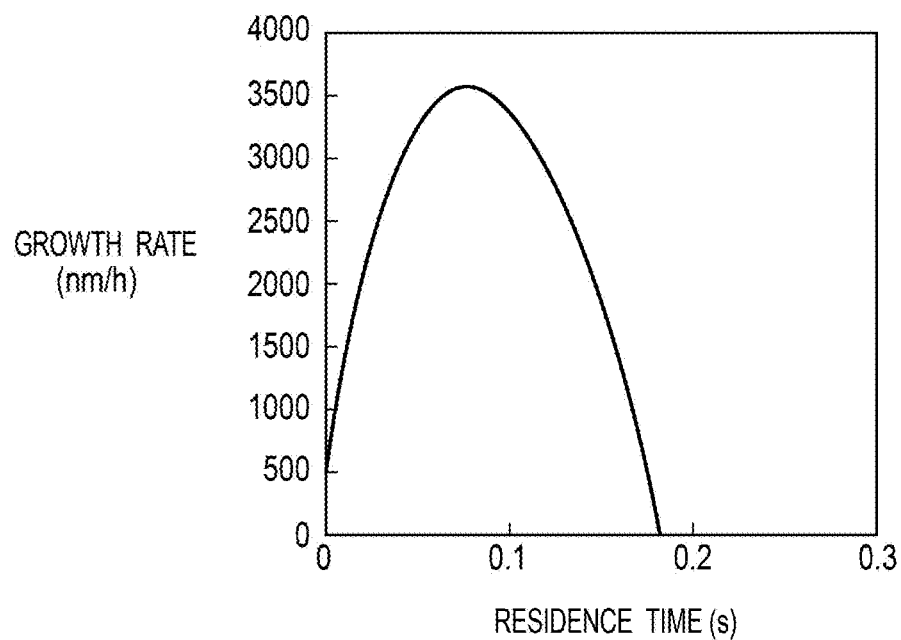

By applying the above conditions to an overall reaction model taking into account the etching effect, the reaction rate constants at 900° C. are calculated to be $k_1=0.81$, $k_2=0.0098$, $k_3=0.906$, and $f_e=6.4\times10^3$. Using the above reaction rate constants, the gas phase composition and growth rate distribution (growth rate in the center of the preform) are calculated and illustrated in FIG. 25. The growth rate is calculated to be 3.6 μm/h at the maximum. Curves a to d in FIG. 25 correspond to the growth species 1, the growth species 2, MTS, and others. In this case, it is estimated that the growth for about 1.4 hours allows to form 5 μm-thick film necessary for integrating silicon carbide fibers.

Summary of Optimization

The optimization procedure is summarized below. The optimization at filling the preform includes the following steps in this order:
1) It is estimated which one of molecular diffusion or Knudsen diffusion is dominant in diffusion of the precursor between silicon carbide fibers and between fiber bundles.
2) The sticking probability necessary for filling gaps between silicon carbide fibers in each fiber bundle is calculated. Diffusion in this process is typically dominated by Knudsen diffusion.
3) The sticking probabilities necessary for filling gaps between silicon carbide fibers and fiber bundles in the preform are calculated. Diffusion in this process is typically dominated by molecular diffusion.
4) Considering the growth rate in the center of the preform, an increase diffusion of the precursor and an increase in reaction rate constant conflict to each other, and there is an optimal sticking probability. The balance therebetween is estimated.
5) The boundary conditions of the growth conditions (temperature, partial pressure, total pressure, and precursor concentration ratio) are determined by considering uniformity of the growth rate distribution in the furnace of the chemical vapor infiltration device, an increase in yield of the precursor, and reduction or elimination of by-products contained in the exhaust gas.

The growth conditions are estimated in the light of maximization of the growth rate in the center of the preform. To integrate silicon carbide fibers, the growth rate is calculated to be 0.025 μm when the growth temperature is 900° C., the total pressure is 5 Torr, and the ratio of $H_2$/MTS is 2. Accordingly, the time for forming 0.5 μm-thick film is calculated to be about 20 hours. To integrate fiber bundles, the growth rate is calculated to be 3.6 μm when the growth temperature is 900° C., the total pressure is 100 Torr, and the ratio of $H_2$/MTS is 2. Accordingly, the time for forming 5 μm-thick film is calculated to be about 1.4 hours. Under the above-described conditions, it can be estimated that film formation is completed within 21.4 hours in total.

On the other hand, conventional film formation is performed under the same conditions in the process to integrate silicon carbide fibers and the process to integrate fiber bundles. If the process to integrate fiber bundles is performed under the optimal conditions for the process to integrate silicon carbide fibers, the growth rate is 0.025 μm, and it is estimated that the growth for 200 hours allows to form 5 μm-thick film. Accordingly, film formation is estimated to be completed within 220 hours in total. This is substantially the same in order as the time necessary for film formation under the conventional conditions. The problem of the conventional technique is that the process of chemical vapor infiltration spends time more than necessary because film formation to integrate fiber bundles is performed under excess infiltration conditions.

In the conventional process of chemical vapor infiltration to produce CMC, the precise growth conditions for integrating silicon carbide fibers are also used as the growth conditions for integrating fiber bundles. In other words, spending excessive time to carry out the process to integrate fiber bundles is considered to be the root of the prolonged production problem. The film thickness necessary for integrating fiber bundles (about 10 μm) is about ten times larger than the film thickness necessary for integrating silicon carbide fibers (about 1 μm), and the growth rate in the process to integrate fiber bundles significantly influences the time of the entire process of chemical vapor infiltration.

One of the reasons for the prolonged film formation is that the growth conditions for integrating silicon carbide fibers is the same as that for integrating fiber bundles. To achieve necessary uniformity at integration of silicon carbide fibers, extremely precise growth conditions (prolonged film formation at low growth rate) are needed. However, the process to integrate fiber bundles can implement necessary uniformity under the growth conditions (short-time film formation at high growth rate) which are rougher than those in the process to integrate silicon carbide fibers.

The process to integrate silicon carbide fibers (the film thickness is about 1 μm) is a process finally intended to uniformly and completely fill the fiber bundles while the process to integrate fiber bundles (the film thickness is about 10 μm) is just intended to integrate fiber bundles rather than completely filling the preform.

As described above, according to Example 1, compared with the conventional CMC structure, the preform can be filled so that film of silicon carbide is uniformly distributed irrespectively of the depth from the surface. Moreover, the production time can be expected to be shortened, leading to contribution to mass production.

EXAMPLE 2

In Example 2, uniform film formation is implemented by wrapping the outer circumference of the preform with similar woven fabric as a sacrifice layer to capture growth species with high sticking possibility and removing only the sacrifice layer after the process to integrate silicon carbide fibers.

Figure 26A:
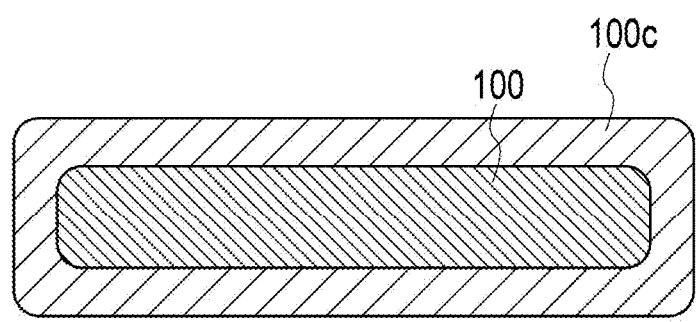
FIGS. 26A and 26B are schematic diagrams for explaining a sacrifice layer wrapping the outer circumference of the preform.

FIG. 26A is a cross-sectional view illustrating a preform 100 situated within the electric furnace 10 as a reaction furnace in Example 2. The preform 100 has the outer circumference surrounded by three-dimensional woven fabric with a predetermined thickness as a sacrifice layer 100c. The sacrifice layer 100c can include woven fabric wound around the preform 100. When the preform 100 is made of woven fabric, the sacrifice layer 100c can be made of the same woven fabric as that of the preform.

The growth species with high sticking probability which is generated by a gas mixture of MTS and hydrogen diffuses in the vicinity of the surface (the order of millimeter) of the preform 100. When the outer circumference of the preform 100 is wrapped with the sacrifice layer 100c made of the same woven fabric, the growth species with high sticking probability is captured by the sacrifice layer 100c and rarely reaches the preform 100. By removing the sacrifice layer 100c after the process to integrate silicon carbide fibers is completed, all the fiber bundles have a uniform distribution of film made of only growth species with low sticking probability.

If the sacrifice layer 100c remain wrapped until the process to integrate fiber bundles, there is a possibility that the sacrifice layer 100c could not be separated from the preform 100. The sacrifice layer 100c needs to be removed when the sacrifice layer 100c becomes unnecessary. For example, the sacrifice layer 100c can be attached to the preform 100 before the process to integrate fibers and can be detached after the process to integrate fibers before the process to integrate fiber bundles.

Figure 26B:
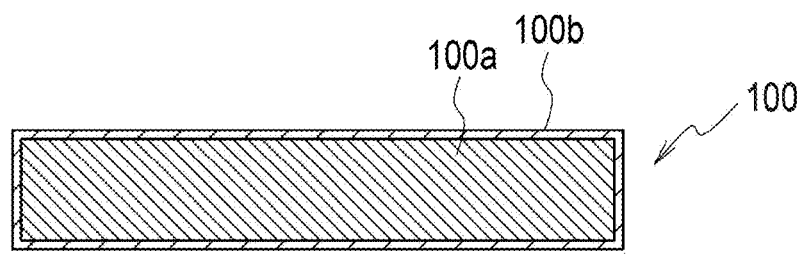

The operation of attaching the sacrifice layer 100c and removing the sacrifice layer 100c after the growth species with high sticking probability is captured is contrasted with the operation for the preform 100 not provided with the sacrifice layer 100c illustrated in FIG. 26B, to scrape off a surface layer 100b, which is provided from the surface with the growth species sticking to to a predetermined depth, and leave a deep section 100a deeper than the predetermined depth. In Example 2, the sacrifice layer 100c is provided by being wound around the outer circumference of the preform 100 and is therefore easily detached without processing the preform 100.

EXAMPLE 3

In Example 3, experiments concerning integration of fibers (a first growth step) in the center of the preform are performed to verify whether fibers in the fiber bundles located in the center of the preform can be integrated uniformly and quickly.

As described above, the sticking probability needs to be not more than $10^{-5}$ to integrate fibers in the fiber bundles completely and uniformly. When it is assumed that the preform has a thickness of 10 mm, the sticking probability that allows fibers in the fiber bundles located in the center of the preform to be integrated at the maximum rate is $10^{-5}$.

The target production time is set to 25 hours as the base at integrating fibers in fiber bundles at high rate. When the distance between centers of fibers is 11 μm, the thickness of film of silicon carbide formed on fibers is at least 0.5 μm, and the necessary lowest growth rate is 0.02 μm/h.

The experiment conditions are as follows. The growth temperature is set to three values for examination: 900, 950, and 1000° C. The total pressure is fixed to 20 Torr. The molar ratio of hydrogen to MTS is examined through the following combination.

The experiments are performed using a production device configured as illustrated in FIG. 4. The inner diameter of the reaction tube 11 is 8 or 16 mm, and the flow rate is set to 25 or 100 sccm, respectively. Substrates on which film of silicon carbide is formed is 5 mm×10 mm silicon substrates. The substrates are provided with vertical trenches with aspect ratios of 37, 57, or 64.

The growth rate is calculated from the thickness of film of silicon carbide formed on the surface of the substrate, and the sticking probability is calculated from the thickness distribution in the depth direction, of film of silicon carbide formed on the sidewalls of the vertical trenches within the substrate. The sticking probability is calculated with reference to Non-Patent Document 6.

Figure 27A:
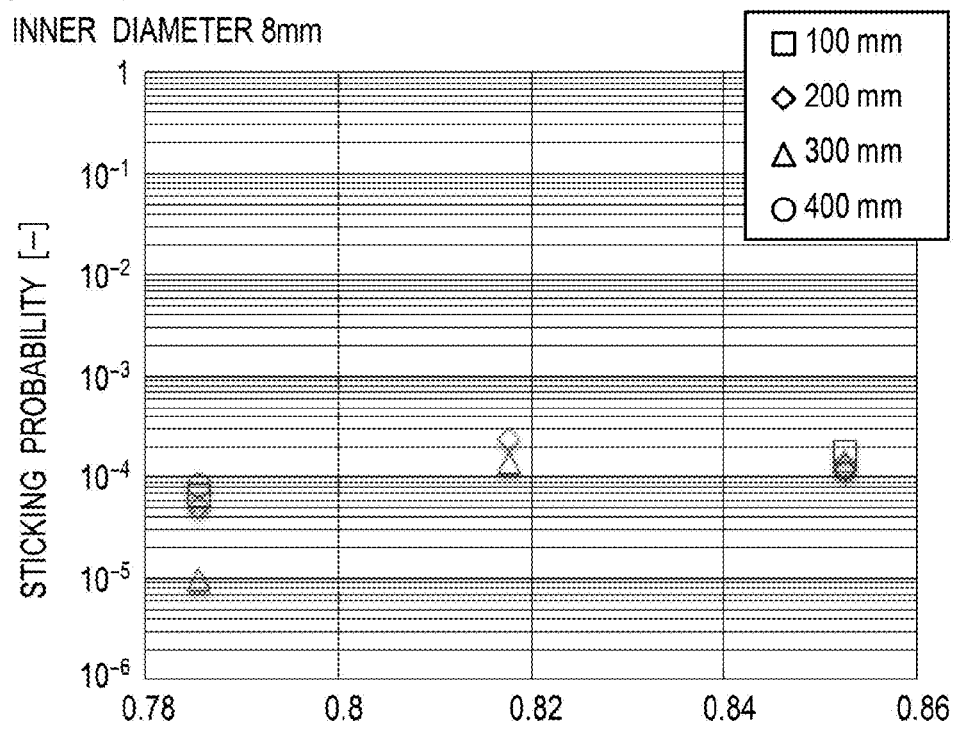
FIGS. 27A and 27B are graphs illustrating the results when partial pressures of hydrogen and MTS have are 0.80 and 4.00 Torr, respectively, the hydrogen/MTS ratio is 5.00, and the reaction tube has an inner diameter of 8 mm.
Figure 27B:
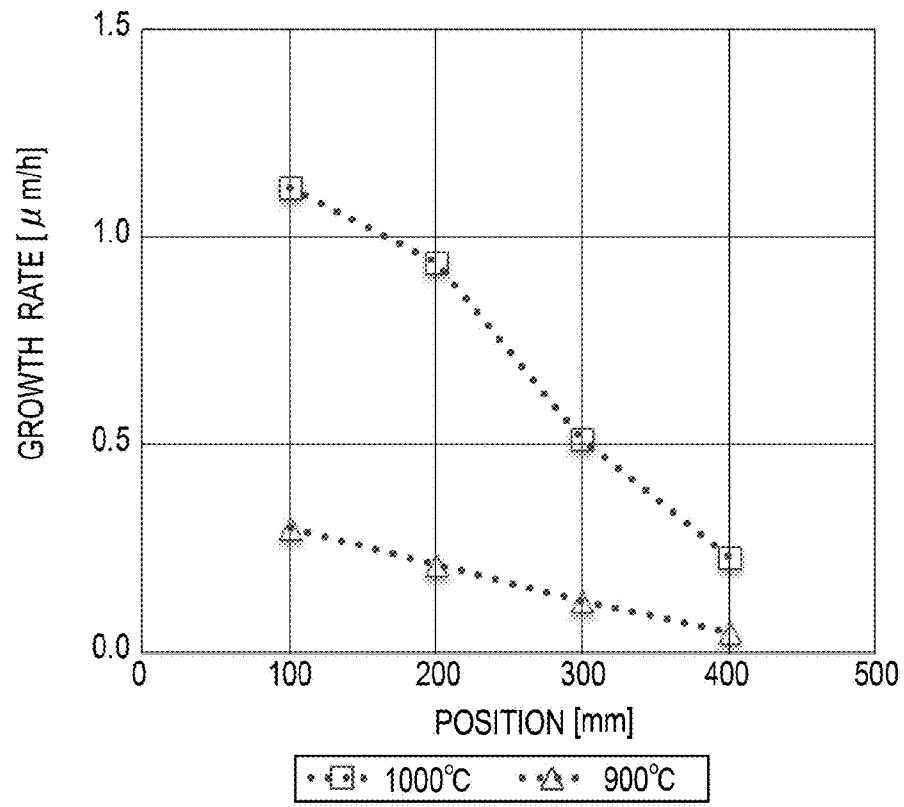

FIGS. 27A and 27B are graphs illustrating the results when partial pressures of hydrogen and MTS are 0.80 and 4.00 Torr, respectively, the hydrogen/MTS ratio is 5.00, and the inner diameter of the reaction tube 11 is 8 mm.

Figure 28A:
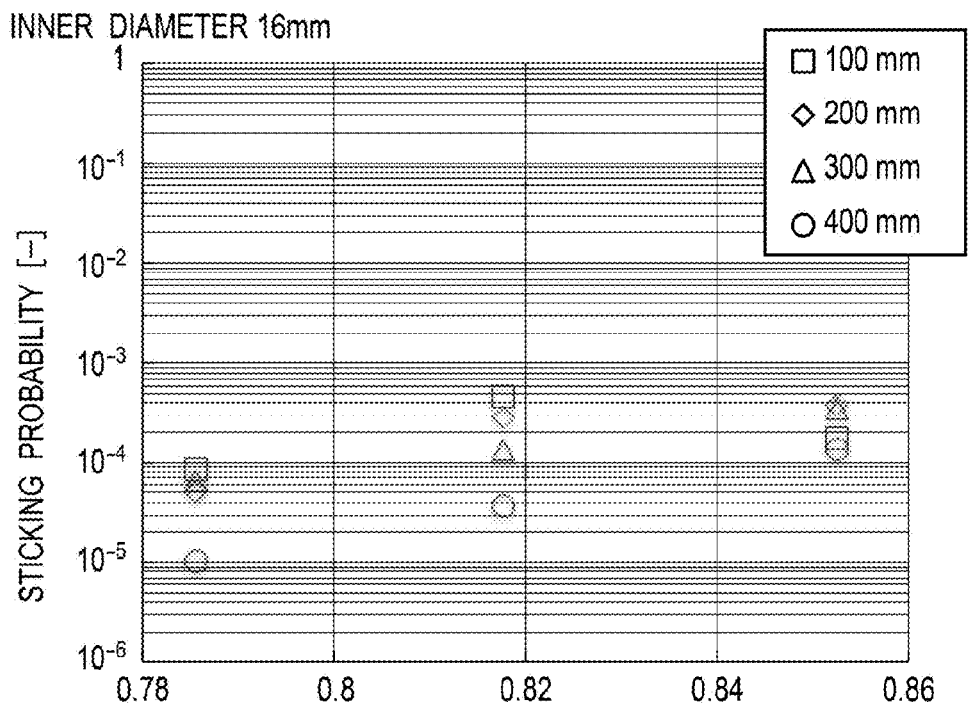
FIGS. 28A and 28B are graphs illustrating the results when partial pressures of hydrogen and MTS have are 0.80 and 4.00 Torr, respectively, the hydrogen/MTS ratio is 5.00, and the reaction tube has an inner diameter of 16 mm.
Figure 28B:
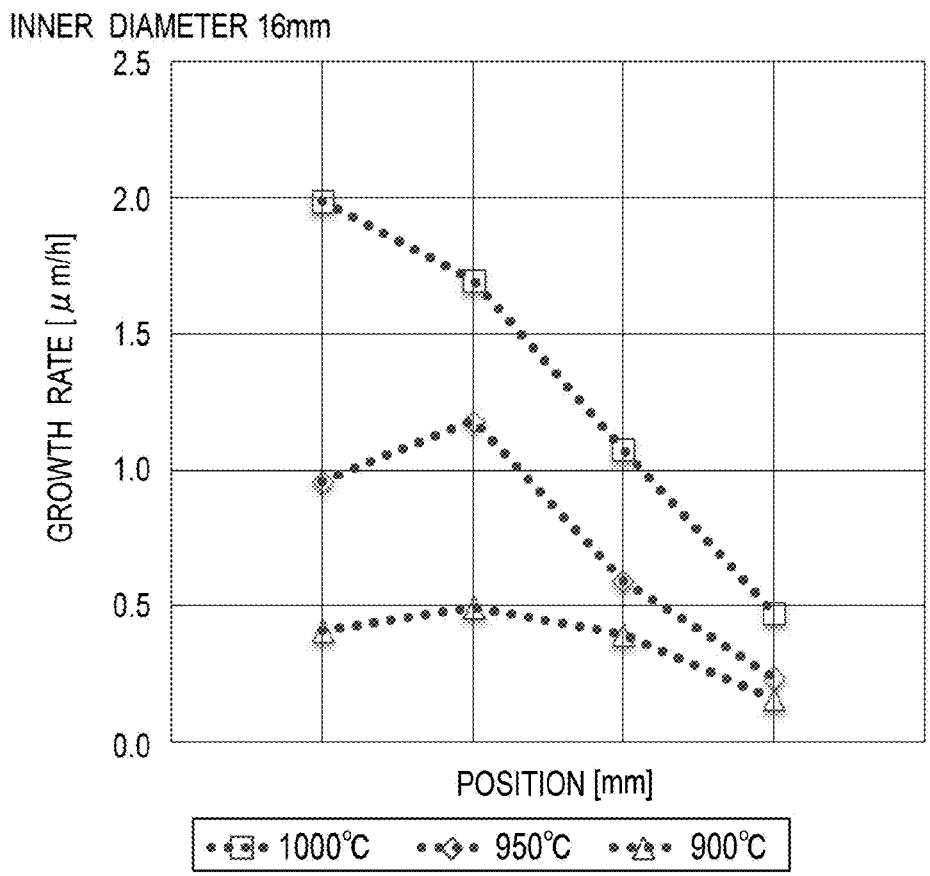

FIG. 27A is a graph illustrating the result of measuring the temperature dependency of the sticking probability at plural substrate positions. FIG. 27B illustrates the results of measuring the dependency of the growth rate on the substrate surface, on the substrate positions at plural temperatures. FIGS. 28A and 28B illustrate the same.

FIGS. 28A and 28B are graphs illustrating the results when partial pressures of hydrogen and MTS are 0.80 and 4.00 Torr, respectively, the hydrogen/MTS ratio is 5.00, and the inner diameter of the reaction tube 11 is 16 mm. The conditions are the same as those of FIG. 27 other than the inner diameter of the reaction tube 11.

Figure 29A:
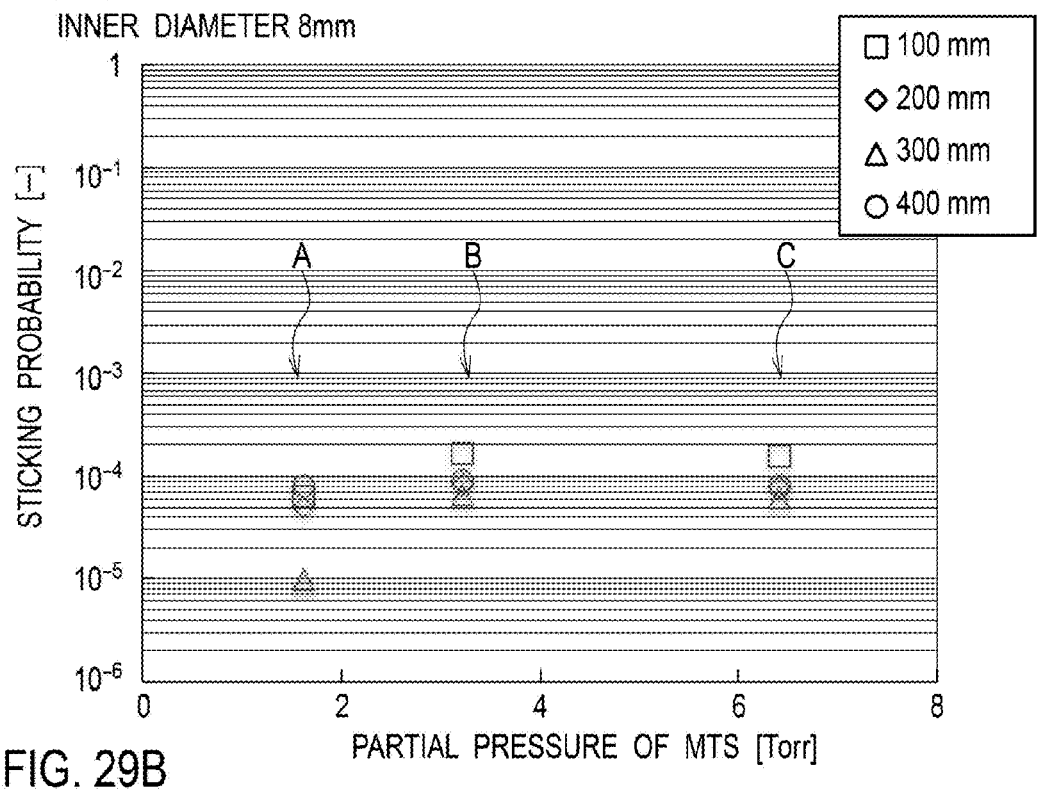
FIGS. 29A and 29B are graphs illustrating the results under conditions A, B, and C shown in Table 2 when the temperature is 1000° C. and the reaction tube has an inner diameter of 8 mm.
Figure 29B:
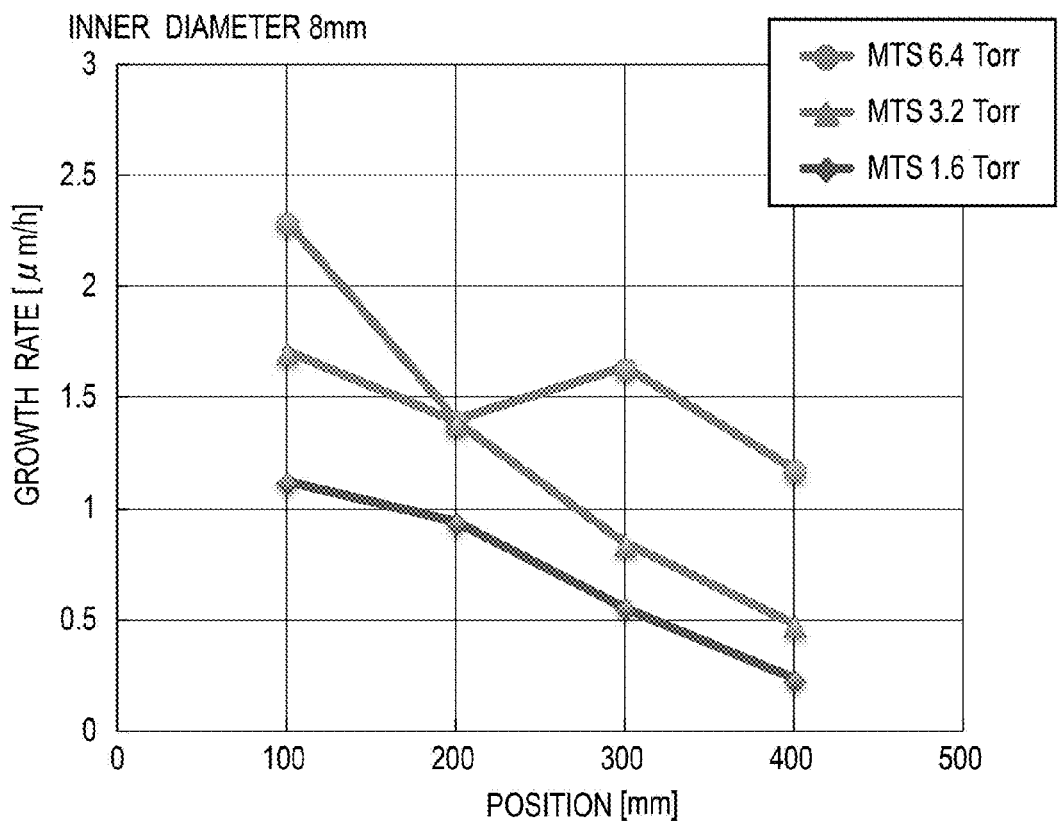

FIGS. 29A and 29B are graphs illustrating the results under conditions A, B, and C when the temperature is 1000° C. and the inner diameter of the reaction tube 11 is 8 mm.

Figure 30A:
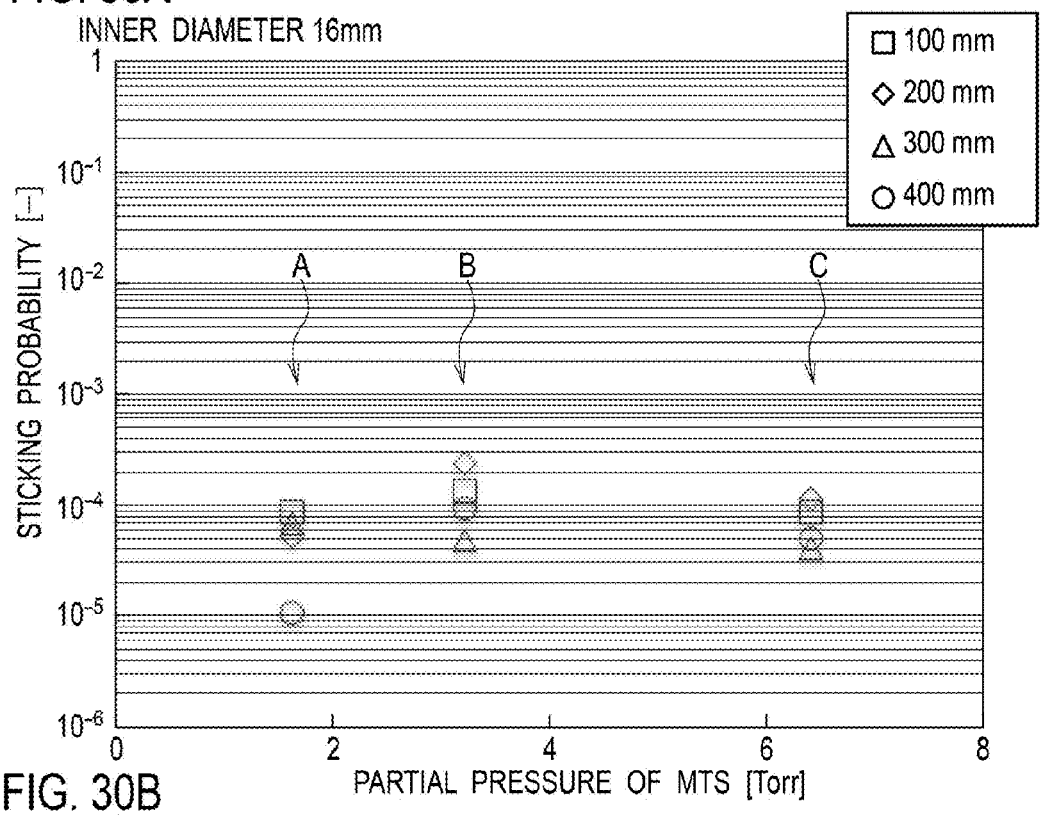
FIGS. 30A and 30B are graphs illustrating the results under conditions A, B, and C shown in Table 2 when the temperature is 1000° and the reaction tube has an inner diameter of 16 mm.
Figure 30B:
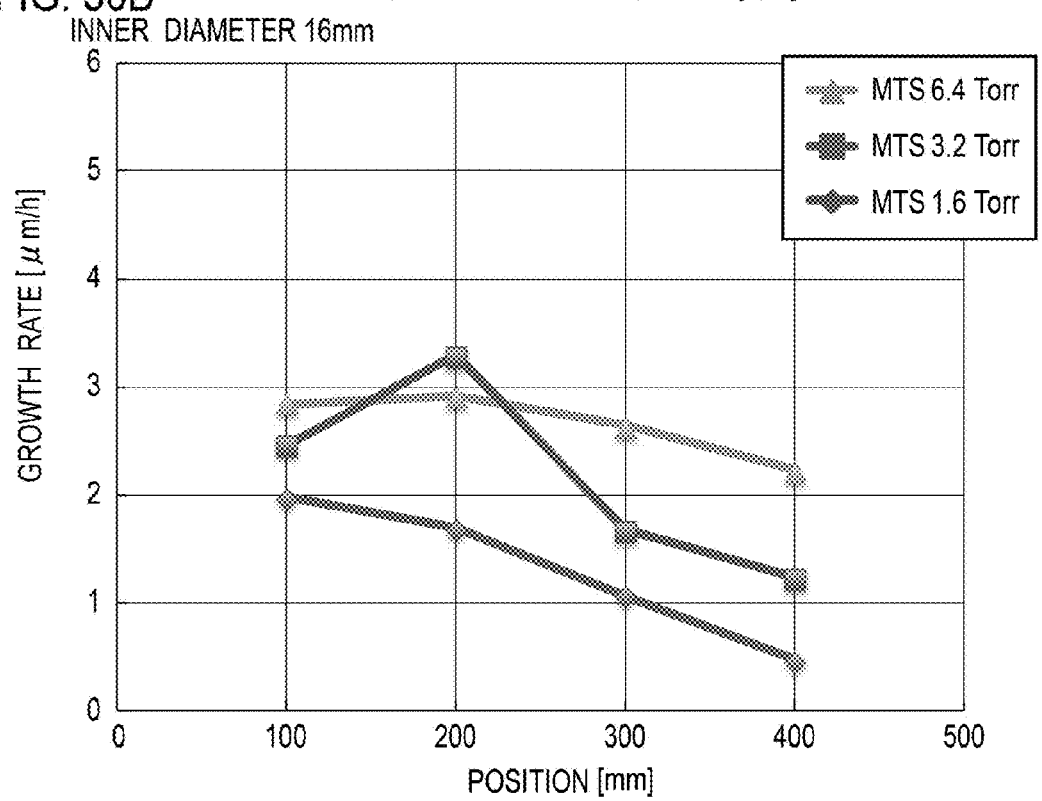

FIG. 29A is a graph illustrating the results of measuring the dependency of the sticking probability on the partial pressure of MTS at plural substrate positions. FIG. 29B illustrates the results of measuring the dependency of the growth rate on the substrate surface, on the substrate positions at plural values of the partial pressure of MTS. FIGS. 30A and 30B below illustrate the same.

TABLE 2

|  | A | B | C |
|---|---|---|---|
| Hydrogen [Torr] | 1.60 | 3.20 | 6.40 |
| MTS [Torr] | 4.00 | 4.00 | 4.00 |
| Hydrogen/MTS Ratio | 2.50 | 1.25 | 0.63 |

FIGS. 30A and 30B are graphs illustrating the results under conditions A, B, and C illustrated in Table 2 when the temperature is 1000° C. and the inner diameter of the reaction tube 11 is 16 mm. The conditions are the same as those of FIGS. 29A and 29B other than the inner diameter of the reaction tube 11.

Figure 31A:
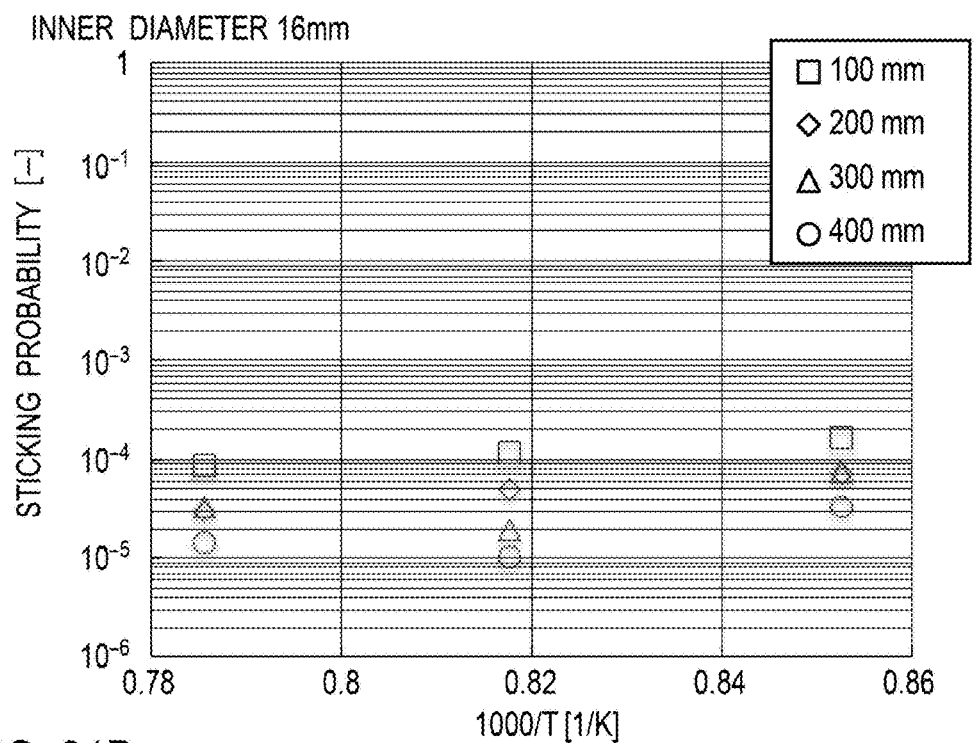
FIGS. 31A and 31B are graphs illustrating the results when partial pressures of hydrogen and MTS are 6.44 and 2.00 Torr, respectively, the hydrogen/MTS ratio is 0.31, and the reaction tube has an inner diameter of 16 mm.
Figure 31B:
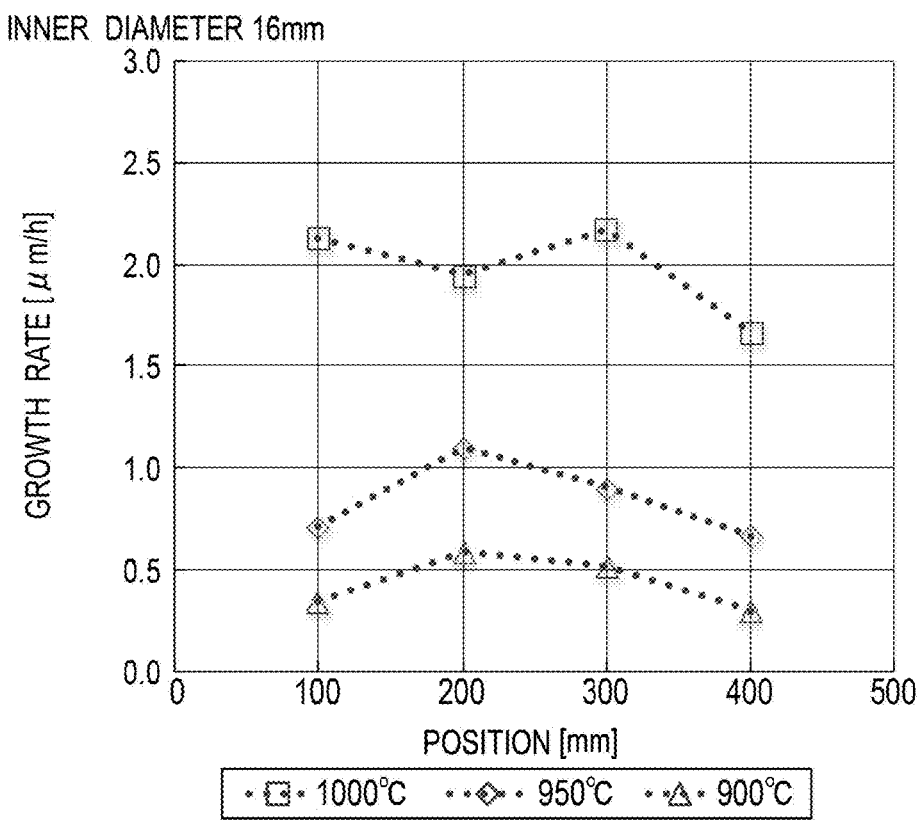

FIGS. 31A and 31B are graphs illustrating the results when partial pressures of hydrogen and MTS are 6.40 and 2.00 Torr, respectively, the hydrogen/MTS ratio is 0.31, and the inner diameter of the reaction tube 11 is 16 mm.

FIG. 31A is a graph illustrating the results of measuring the temperature dependency of the sticking probability at plural substrate positions. FIG. 31B illustrates the results of measuring the dependency of the growth rate on the substrate surface, on the substrate positions at plural temperatures. FIGS. 32A and 32B and FIGS. 33A and 33B below illustrate the same.

Figure 32A:
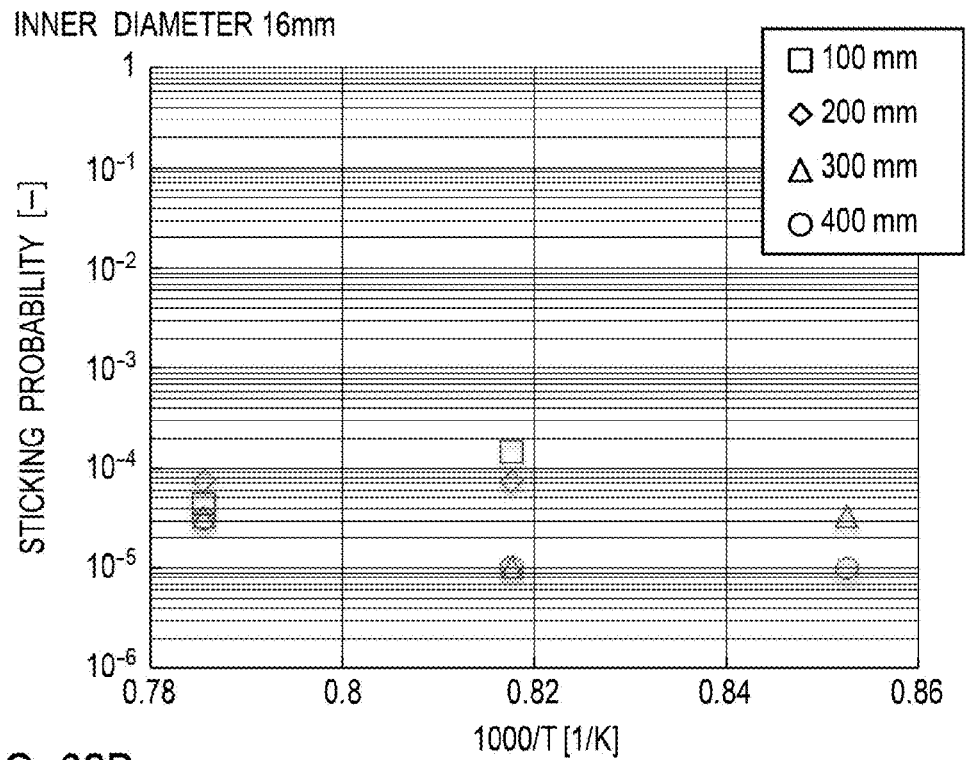
FIGS. 32A and 32B are graphs illustrating the results when partial pressures of hydrogen and MTS are 9.60 and 2.00 Torr, respectively, the hydrogen/MTS ratio is 0.21, and the reaction tube has an inner diameter of 16 mm.
Figure 32B:
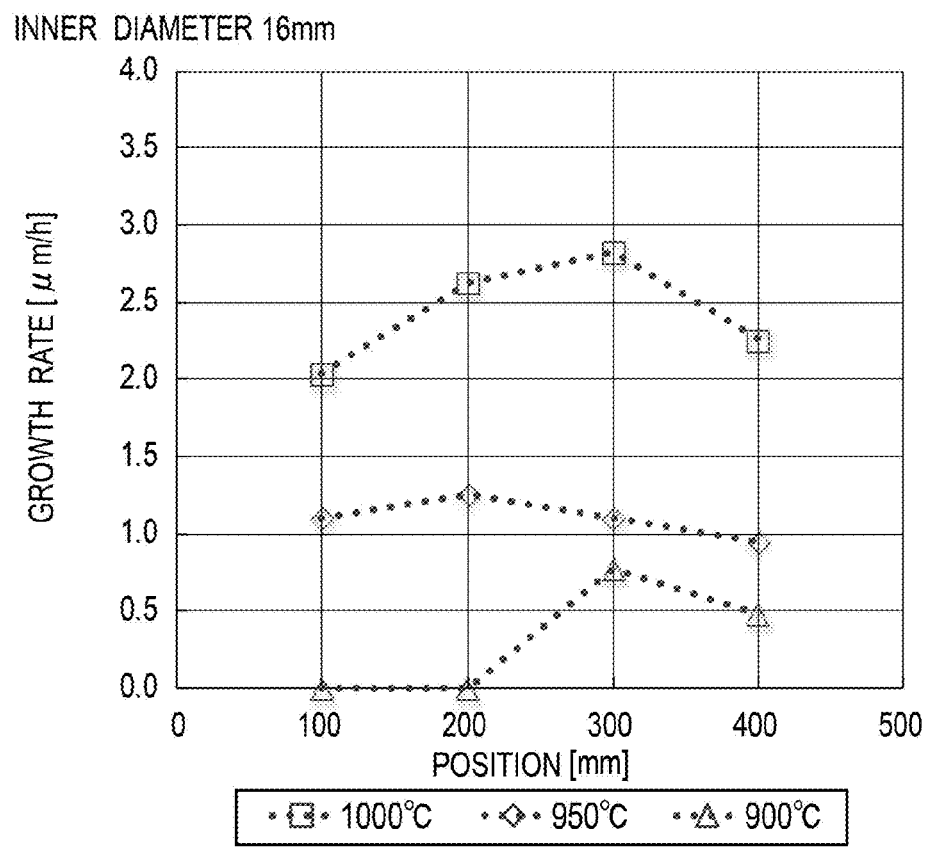

FIGS. 32A and 32B are graphs illustrating the results when partial pressures of hydrogen and MTS are 9.60 and 2.00 Torr, respectively, the hydrogen/MTS ratio is 0.21, and the inner diameter of the reaction tube 11 is 16 mm.

Figure 33A:
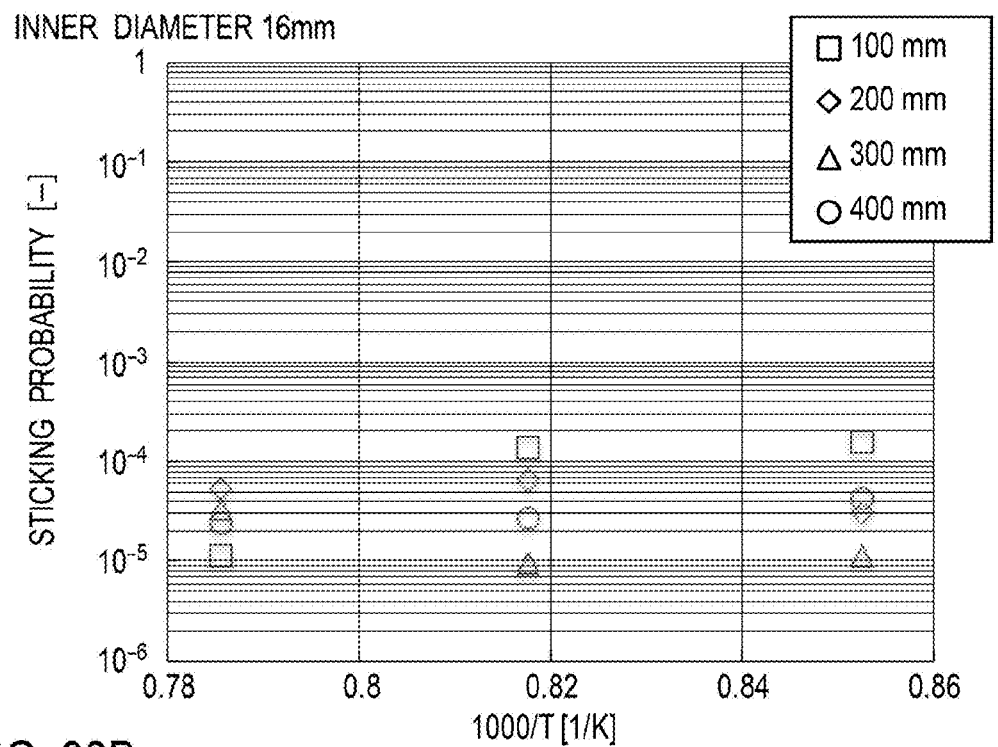
FIGS. 33A and 33B are graphs illustrating the results when partial pressures of hydrogen and MTS are 16.00 and 2.00 Torr, respectively, the hydrogen/MTS ratio is 0.13, and the reaction tube has an inner diameter of 16 mm.
Figure 33B:
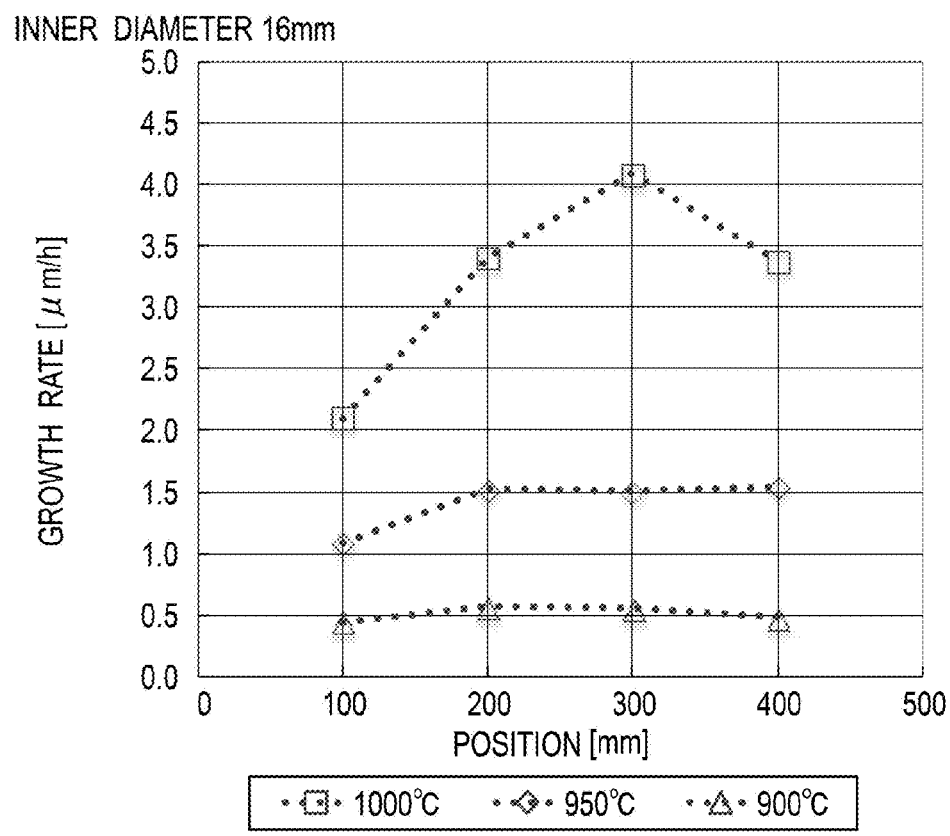

FIGS. 33A and 33B are graphs illustrating the results when partial pressures of hydrogen and MTS are 16.00 and 2.00 Torr, respectively, the hydrogen/MTS ratio is 0.13, and the inner diameter of the reaction tube 11 is 16 mm.

As the results of experiments described above, in terms of the temperature dependency of the sticking probability and the growth rate on the substrate surface illustrated in FIGS. 27A to 28B and 31A to 33B, the sticking probability is the lowest at 1000° C. when MTS has low partial pressure (FIGS. 27A to 28B), and the sticking probability is $10^{-5}$ at 400 mm (at the most downstream position) in the reaction tube 11. When MTS has high partial pressure (FIGS. 31A to 33B), the sticking probability is about $10^{-5}$ even at 950° C. and 900° C.

In terms of the dependency of the sticking probability on the partial pressure of MTS and the growth rate on the substrate surface illustrated in FIGS. 29A to 30B, the sticking probability is in a range from $10^{-5}$ to $10^{-4}$. By increasing the partial pressure of MTS, the growth rate on the substrate surface is increased.

The validity of the integration of fibers is examined based on the above experiment results. Under the conditions in FIGS. 28A and 28B where the partial pressure of MTS is 1.6 Torr, the partial pressure of hydrogen is 4.0 Torr, the temperature is 1000° C., the inner diameter of the reaction tube 11 is 16 mm, and the substrate position is 400 mm, the sticking probability is $1 \times 10^{-5}$, and the growth rate on the substrate surface is 0.5 µm/h.

In the case of film formation for a preform with a thickness of 10 mm illustrated, with reference to FIG. 12, the ratio (the growth rate ratio) of the precursor concentration in the center of the preform to that in the surface is about 0.6 when the sticking probability is $1 \times 10^{-5}$. Under the aforementioned growth conditions, therefore, the growth rate can be 0.3 µm/h in the center of the preform. Accordingly, the target sticking possibility ($=1 \times 10^{-5}$) and the target lowest growth rate in the center of the preform (0.02 µm/h) are achieved.

EXAMPLE 4

In Example 4, the growth rate and sticking probability of low η species are verified by performing experiments concerning filling between fiber bundles in the preform (a second growth step).

In simulation of the second step, the preform thickness is set to 10 mm, and the total pressure b is 5 Torr (illustrated by the curve b in FIG. 23). Moreover, it is assumed that the growth rate in the center of the preform needs to be 70% or more of that at the end.

Herein, condition 1 for uniformity in the preform is that the growth rate at the center of the preform achieves 70% or more of that at the end when η is not more than $10^{-3}$. Condition 2 for the maximum growth rate at the center is that as the η increases, the growth rate at the center increases in the aforementioned range.

Accordingly, the optimal value is η ($=10^{-3}$) that gives necessary uniformity in the preform. However, condition 2 is applicable when the partial pressure of the growth species is considered to be constant. Since the partial pressure depends on the conditions, the conditions that enable high actual growth rate may be employed.

In Example 4, the experiments are performed under the following conditions. The reaction tube 11 is a circular tube and has an inner diameter of 16 mm and a heater length of 500 mm. The total gas flow rate is set to 100 sccm; the total pressure is set to 20 Torr; and the temperature is set to 800 to 1000° C.

The sticking probability is analyzed and calculated using a trench substrate. In the analysis of the trench substrate, it is assumed that the growth species fall into two types: low η species having low sticking probability; and high η species having high sticking probability. The results are shown in terms of only the low η species having a high infiltration ability. The growth rate is calculated using a smooth substrate.

FIGS. 34A to 34D are graphs illustrating the temperature dependency of the growth rate of the low η species of some types of precursors. The experiments are performed by setting the partial pressure of the precursor to 1.6 Torr and setting the partial pressure of hydrogen to 4.0 Torr. The precursors are MTS, DDS, TCS, and TMS.

TMS w/-HCl in FIGS. 34A to 34D indicates TMS added with hydrogen chloride at 0.8 Torr. FIGS. 34A to 34D illustrate the results obtained with the substrate positions set to 100, 200, 300, and 400 mm, respectively. FIGS. 35A to 35D below illustrate results in the same manner.

FIGS. 35A to 35D are graphs illustrating the temperature dependency of the sticking probability of the low η species of some types of precursors. The experiments are also performed by setting the partial pressure of each precursor to 1.6 Torr and setting the partial pressure of hydrogen to 4.0 Torr.

Figure 36A:
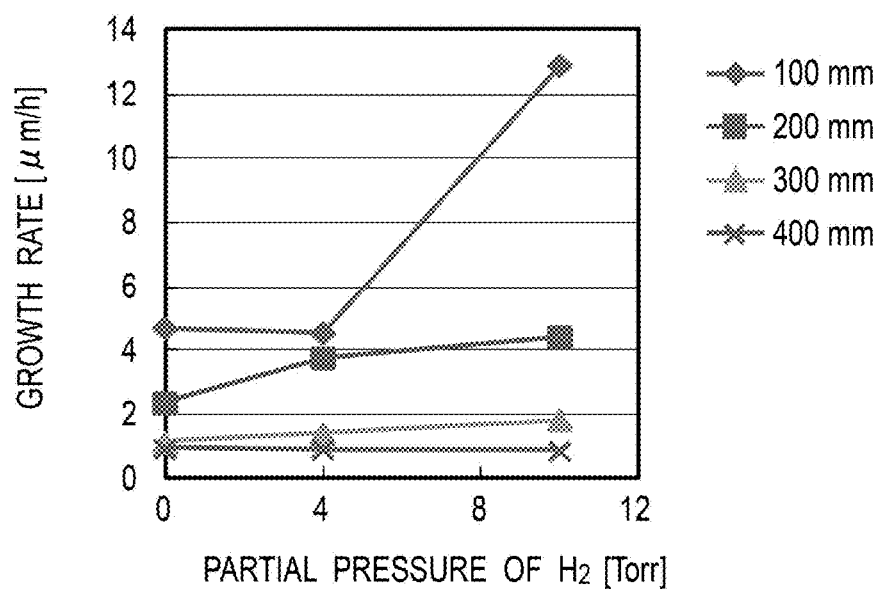
FIGS. 36A and 36B are graphs illustrating dependency of the low η species of DDS on the partial pressure of hydrogen.
Figure 36B:
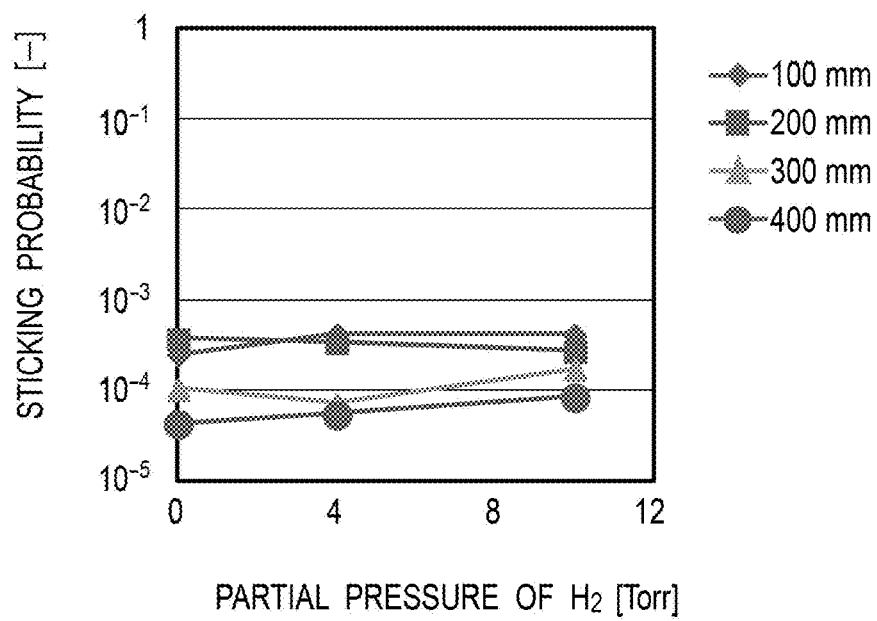

FIGS. 36A and 36B are graphs illustrating the dependency of the low η species in DDS on the partial pressure of hydrogen. The experiments are performed by setting the temperature to 1000° C. and setting the partial pressure of the precursor to 1.6 Torr.

Figure 37A:
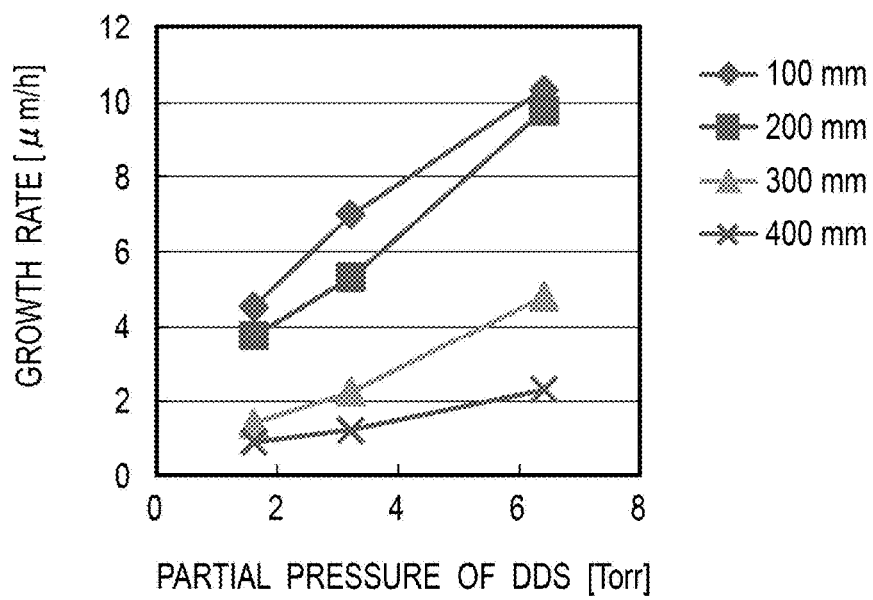
FIGS. 37A and 37B are graphs illustrating dependency of the low η species of DDS on the partial pressure of the precursor.
Figure 37B:
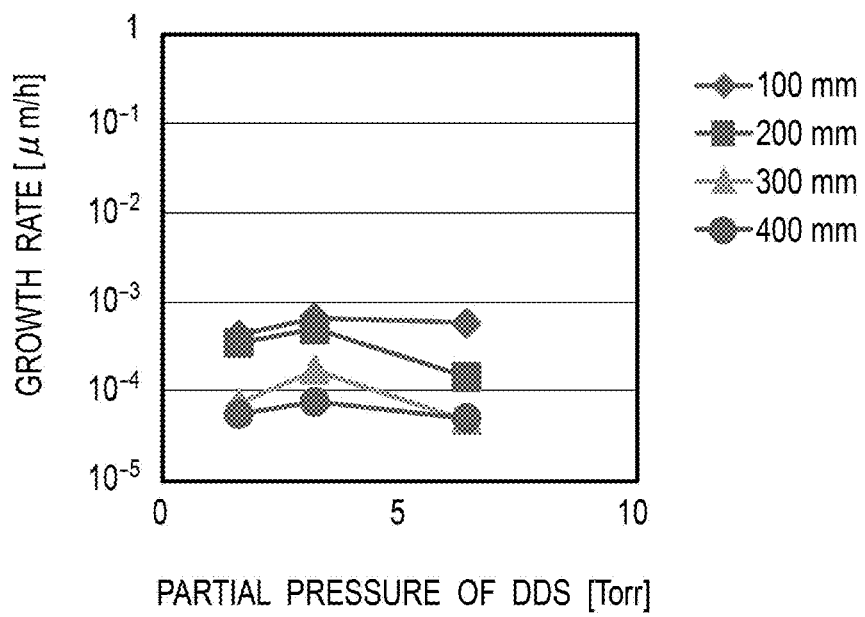

FIG. 36A illustrates the dependency of the growth rate on the partial pressure of hydrogen, and FIG. 36B illustrates the dependency of the sticking probability on the partial pressure of hydrogen. FIGS. 37A and 37B below illustrate the same.

FIGS. 37A and 37B are graphs illustrating the dependency of the low η species in DDS on the partial pressure of the precursor. The experiments are performed by setting the temperature to 1000° C. and setting the partial pressure of the precursor to 1.6 Torr.

The results obtained above are examined: the conditions actually useful for SiC-CVI are assumed to be conditions in which the growth rate in the center is high when η is not more than $10^{-3}$. With reference to FIGS. 35A and 35B, η of $10^{-4}$ to $10^{-3}$ can be also implemented with DDS and TMS in addition to MTS. Moreover, with reference to FIGS. 36A and 36B, the growth rate in the process using DDS or TMS can be higher than that in the process using MTS if the same amount of precursor is used. Accordingly, use of DDS or TMS enables high-speed film formation and ensures necessary uniformity.

FIGS. 34A to 34D illustrate comparison of growth rate using planar substrates. In a region where η is not more than $10^{-3}$, with reference to FIGS. 23A and 23B, the growth rate at the center is 70% or more of the growth rate at the end (corresponding to the planar substrate), and the results of comparison in terms of the growth rate in the center are considered to be the same as those of FIGS. 34A to 34D.

As illustrated in FIGS. 36A to 37B, the dependencies of the low-η species in DDS on the partial pressures of the precursor and hydrogen and the sticking probability thereof vary little with respect to the partial pressures of the low material and hydrogen. Accordingly, the precursor can be used in a wide range of conditions. Moreover, the growth rate increases substantially in proportion to the partial pressure of the precursor. Accordingly, the growth rate can be directly increased by increasing the supply of the precursor.

APPENDIX 1

The micro-cavity method is applied to the microstructures of the preform 100 by considering a one-dimensional model of an ideal shape of a trench in the depth direction and assuming that growth rate follows the first order reaction and that molecules (growth species) contributing to film formation in the trench are in the molecular flow region (Knudsen diffusion).

Figure 38A:
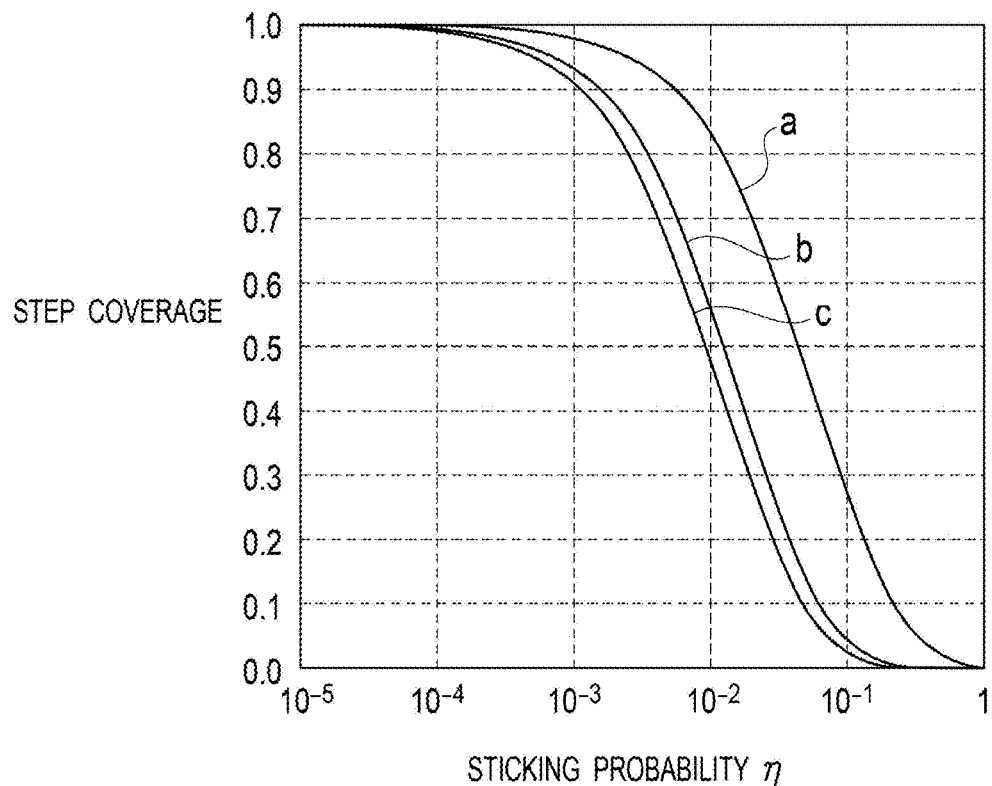
FIGS. 38A and 38B are diagrams illustrating the relationship between sticking probability and step coverage.
Figure 38B:
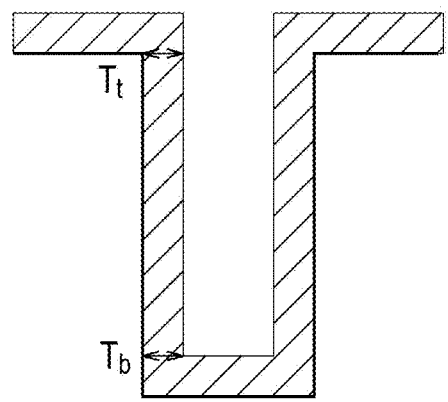

FIG. 38A is a graph illustrating the relationship between the sticking probability η and step coverage which is calculated by the micro-cavity method. FIG. 38B is a diagram for explaining step coverage. As illustrated in FIG. 38B, the step coverage is given by a ratio ($T_b/T_t$) of film thickness $T_b$ at the bottom of a trench to film thickness $T_t$ at the inlet of the trench. The aspect ratio (H/W) of the trench is given by a ratio of depth H of the trench to width W.

Curves a to c in FIG. 38A correspond to values of the aspect ratio of 4.7, 9.1, and 10.7, respectively. At these values of the aspect ratio, the analyzable range of the sticking probability is 1 to $10^{-4}$. The lower limit of the sticking probability is therefore $10^{-4}$. The sticking probability smaller than $10^{-4}$ is not discriminated at the above aspect ratios.

APPENDIX 2

Figure 39:
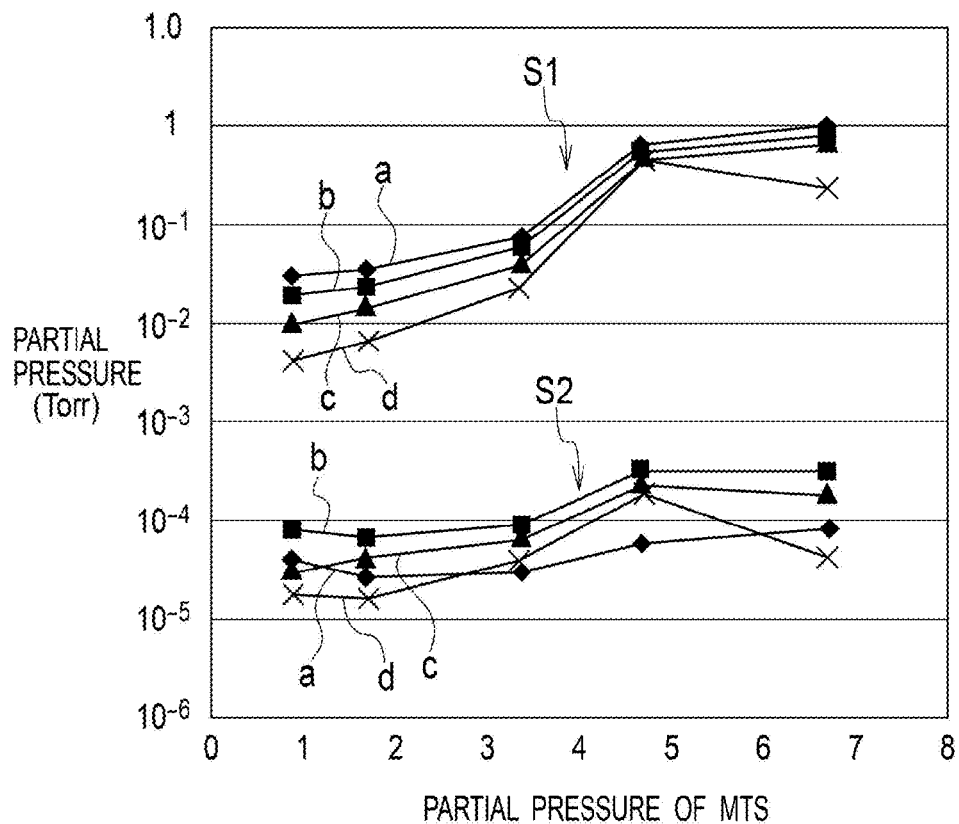
FIG. 39 is a graph illustrating the relationship between partial pressures of MTS and growth species.

The partial pressure of growth species to the partial pressure of MTS can be calculated by applying Herts-Knudsen equation to the growth rate. FIG. 39 is a graph illustrating the relationship between the partial pressure of MTS and the partial pressure of growth species. s1 and s2 in FIG. 39 indicate the growth species 1 with a low sticking probability and the growth species 2 with a high sticking probability, respectively. Polygonal curves a to d in FIG. 39 represent the results of first to fourth preforms 101 to 104 which are located at 100, 200, 300, and 400 mm from a referential position P0, respectively. The partial pressure of the growth species 1 is in a range from $10^{-2}$ to 1.

APPENDIX 3

Figure 40:
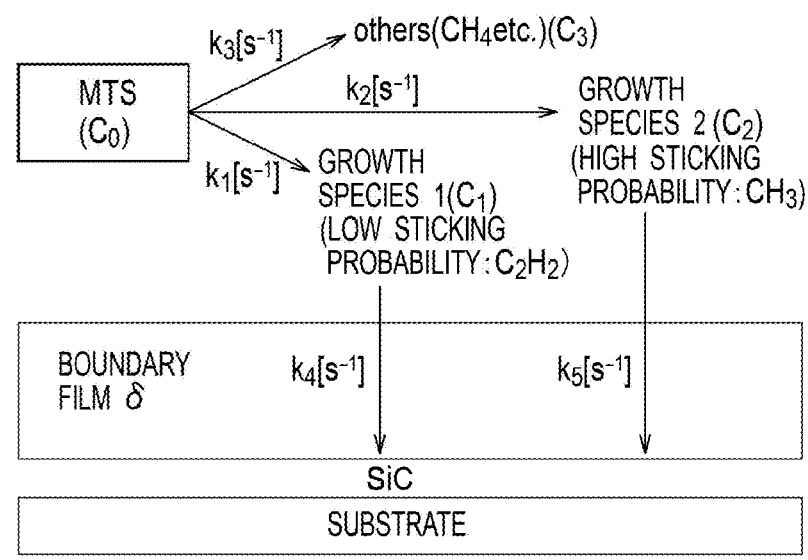
FIG. 40 is a diagram for defining the concentration and velocity of MTS, growth species 1 with a low sticking probability, and growth species 2 with a high sticking probability.

When the concentrations and velocities of MTS, the growth species 1 with a low sticking probability, and the growth species 1 with a low sticking probability are defined as illustrated in FIG. 40, the following simultaneous ordinary differential equations are obtained.

$$\frac{dC_0}{dt} = -k_1 C_0 - k_2 C_0 - k_3 C_0$$ [Equation 39]

$$\frac{dC_1}{dt} = k_1 C_0 - k_4 C_1$$

$$\frac{dC_2}{dt} = k_2 C_0 - k_5 C_2$$

$$\frac{dC_3}{dt} = k_3 C_0$$

By applying the relationship (Equation 40) that growth rate $R_{SiC}$ is proportional to concentration ($C_3$) of another chemical species (Others) including a factor having a film formation inhibition effect such as hydrogen chloride, $$R'_{SiC} R_{SiC} - C_3 \times f_e$$ [Equation 40]

at 900° C., the reaction rate constants are calculated to be $k_1$=0.81, $k_2$=0.0098, $k_3$=0.906, and $f_e$=6.4×10$^3$. Herein, $f_e$ is a constant for film formation inhibition.

The aforementioned embodiment and examples of the embodiment show examples to which the present embodiment is applied, and the present embodiment is not limited thereto.

INDUSTRIAL APPLICABILITY

The present embodiment is applicable to production of heat-resistant composite materials and mechanical parts using the heat-resistant composite materials and production of high-temperature resistant semiconductors, high voltage-resistant power devises, and the like.

While embodiments have been exemplified with the help of the drawings, many modifications and changes are apparent to those skilled in the art.

What is claimed is:

1. A method of manufacturing a heat-resistant composite material, the method comprising:
   treating a preform comprising a plurality of fiber bundles, each fiber bundle having a plurality of fibers, by:
   wrapping a woven fabric having a predetermined thickness around an outer circumference of the preform to provide a wrapped preform;
   depositing silicon carbide between the fibers of the wrapped preform to integrate the fibers constituting each fiber bundle to provide a fiber-integrated wrapped preform;
   removing the woven fabric from the fiber-integrated wrapped preform to provide a fiber-integrated preform; and
   depositing silicon carbide between the fiber bundles of the fiber-integrated preform to integrate the fiber bundles,
   wherein said depositing silicon carbide between the fibers of the wrapped preform is accomplished by allowing precursor gas, additive gas, and carrier gas to flow in a reaction furnace accommodating the wrapped preform,
   wherein said depositing silicon carbide between the fiber bundles of the fiber-integrated preform is accomplished by allowing precursor gas, additive gas, and carrier gas to flow in a reaction furnace accommodating the fiber-integrated preform.

2. The method of manufacturing a heat-resistant composite material according to claim 1, wherein
   in said depositing silicon carbide between the fibers of the wrapped preform to integrate the fibers constituting each fiber bundle, the ratio $C/C_0$ of concentration C of the precursor gas at the center of the fiber bundles to initial concentration $C_0$ of the precursor gas supplied to the reaction furnace is in a range from 0.2 to 0.3.

3. The method of manufacturing a heat-resistant composite material according to claim 2, wherein
   the ratio $C/C_0$ is in a range from 0.24 to 0.26.

4. The method of manufacturing a heat-resistant composite material according to claim 1, wherein
   in said depositing silicon carbide between the fibers of the wrapped preform to integrate the fibers constituting each fiber bundle, a growth temperature of the reaction furnace is in a range from 800 to 1000° C., and a total pressure of the precursor gas, additive gas, and carrier gas in the reaction furnace is in a range of 4 to 6 Torr.

5. The method of manufacturing a heat-resistant composite material according to claim 4, wherein the growth temperature is in a range from 850 to 950° C., and the total pressure is in a range of 4.5 to 5.5 Torr.

6. The method of manufacturing a heat-resistant composite material according to claim 1, wherein
in said depositing silicon carbide between the fiber bundles of the fiber-integrated preform to integrate the fiber bundles, the ratio $C/C_0$ of concentration C of the precursor gas at the center of the fiber-integrated preform to the initial concentration $C_0$ of the precursor gas supplied to the reaction furnace is in a range from 0.2 to 0.3.

7. The method of manufacturing a heat-resistant composite material according to claim 6, wherein
the ratio $C/C_0$ is in a range from 0.24 to 0.26.

8. The method of manufacturing a heat-resistant composite material according to claim 1, wherein
in said depositing silicon carbide between the fiber bundles of the fiber-integrated preform to integrate the fiber bundles, a growth temperature of the reaction furnace is in a range from 800 to 1000° C., and a total pressure of the precursor gas, additive gas, and carrier gas in the reaction furnace is in a range of 5 to 110 Torr.

9. The method of manufacturing a heat-resistant composite material according to claim 8, wherein
the growth temperature is in a range from 850 to 950° C., and the total pressure is in a range of 5 to 105 Torr.

10. The method of manufacturing a heat-resistant composite material according to claim 1, wherein the woven fabric is wound around the outer circumference of the preform to provide the wrapped preform.

11. The method of manufacturing a heat-resistant composite material according to claim 1, wherein the preform is made of woven fabric, and the woven fabric is made of the same material as that of the preform.

12. The method of manufacturing a heat-resistant composite material according to claim 1, wherein the precursor gas used to deposit silicon carbide between the fibers of the wrapped preform and the precursor gas used to deposit silicon carbide between the fiber bundles of the fiber-integrated preform each comprise at least one of methyltrichlorosilane, dimethyldichlorosilane, tetramethylsilane, and trimethylchlorosilane.

13. The method of manufacturing a heat-resistant composite material according to claim 12, wherein
the precursor gas used to deposit silicon carbide between the fibers of the wrapped preform comprises methyltrichlorosilane, and
the precursor gas used to deposit silicon carbide between the fiber bundles of the fiber-integrated preform comprises at least one of dimethyldichlorosilane, tetramethylsilane, and trimethylchlorosilane.

14. The method of manufacturing a heat-resistant composite material according to claim 1, wherein
the carrier gas used to deposit silicon carbide between the fibers of the wrapped preform, and the carrier gas used to deposit silicon carbide between the fiber bundles of the fiber-integrated preform, each comprise at least one of hydrogen, nitrogen, helium, and argon.

15. The method of manufacturing a heat-resistant composite material according to claim 1, wherein
the additive gas used to deposit silicon carbide between the fibers of the wrapped preform, and the additive gas used to deposit silicon carbide between the fiber bundles of the fiber-integrated preform, each comprise at least one of hydrogen chloride, monochloromonomethylsilane, methyldichlorosilane, methyltrichlorosilane, dimethylmonochlorosilane, dimethyldichlorosilane, trimethylmonochlorosilane, monochlorosilane, dichlorosilane, trichlorosilane, tetrachlorosilane, chlorodisilane, dichlorodisilane, hexachlorodisilane, octachlorotrisilane, monochloromethane, dichloromethane, chloroform, tetrachloromethane, monochloroacetylene, dichloroacetylene, monochloroethylene, dichloroethylene, trichloroethylene, tetrachloroethylene, monochloroethane, dichloroethane, trichloroethane, tetrachloroethane, pentachloroethane, hexachloroethane, monochloropropane, dichloropropane, trichloropropane, tetrachloropropane, pentachloropropane, hexachloropropane, heptachloropropane, octachloropropane, and chlorine molecules.

16. The method of manufacturing a heat-resistant composite material according to claim 15, wherein the additive gas used to deposit silicon carbide between the fibers of the wrapped preform, and the additive gas used to deposit silicon carbide between the fiber bundles of the fiber-integrated preform, comprises hydrogen chloride.

17. The method of manufacturing a heat-resistant composite material according to claim 1, wherein the precursor gas used to deposit silicon carbide between the fibers of the wrapped preform, and the precursor gas used to deposit silicon carbide between the fiber bundles of the fiber-integrated preform, comprises methyltrichlorosilane, and the carrier gas used to deposit silicon carbide between the fibers of the wrapped preform, and the carrier gas used to deposit silicon carbide between the fiber bundles of the fiber-integrated preform, comprises hydrogen.

18. The method of manufacturing a heat-resistant composite material according to claim 17, wherein a molar ratio of hydrogen to methyltrichlorosilane is in a range from 1.5 to 2.5.

19. The method of manufacturing a heat-resistant composite material according to claim 18, wherein the molar ratio of hydrogen to methyltrichlorosilane is in a range from 1.9 to 2.1.

* * * * *